United States Patent
Oikawa et al.

(10) Patent No.: US 8,637,347 B2
(45) Date of Patent: Jan. 28, 2014

(54) METHOD FOR MANUFACTURING SEMICONDUCTOR DEVICE

(75) Inventors: Yoshiaki Oikawa, Tochigi (JP); Kenichi Okazaki, Tochigi (JP); Hotaka Maruyama, Tochigi (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 461 days.

(21) Appl. No.: 12/828,465

(22) Filed: Jul. 1, 2010

(65) Prior Publication Data
US 2011/0003429 A1 Jan. 6, 2011

(30) Foreign Application Priority Data
Jul. 3, 2009 (JP) .................. 2009-159065

(51) Int. Cl.
*H01L 21/00* (2006.01)
*H01L 21/16* (2006.01)

(52) U.S. Cl.
USPC ............... 438/104; 438/34; 257/43; 257/59; 257/72

(58) Field of Classification Search
USPC ........... 257/E29.121, E29.094, 59, 72, 622, 257/411, 43, 78, 614, 40, 79, 80, 81, 83, 84, 257/99, 103, 257, 258, 290, 291, 390, 202; 438/719, 151, 723, 756, 689, 685, 683, 438/149, 158, 104, 761, 762, 22, 24, 34, 46, 438/48, 128, 130, 278, 275, 290, 85, 754, 438/161, 587
See application file for complete search history.

(56) References Cited

U.S. PATENT DOCUMENTS

| 5,731,856 A | 3/1998 | Kim et al. |
| 5,744,864 A | 4/1998 | Cillessen et al. |

(Continued)

FOREIGN PATENT DOCUMENTS

| EP | 1737044 A | 12/2006 |
| EP | 2226847 A | 9/2010 |

(Continued)

OTHER PUBLICATIONS

Nomura et al., "Room-Temperature Fabrication of Transparent Flexible Thin-Film Transistors Using Amorphous Oxide Semiconductors," Nature, Nov. 25, 2004, vol. 432, pp. 488-492.

(Continued)

*Primary Examiner* — Thanh Y Tran
(74) *Attorney, Agent, or Firm* — Eric J. Robinson; Robinson Intellectual Property Law Office, P.C.

(57) ABSTRACT

Disclosed is a method to manufacture a thin film transistor having an oxide semiconductor as a channel formation region. The method includes; forming an oxide semiconductor layer over a gate insulating layer; forming a source and drain electrode layers over and in contact with the oxide semiconductor layer so that at least portion of the oxide semiconductor layer is exposed; and forming an oxide insulating film over and in contact with the oxide semiconductor layer. The exposed portion of the oxide semiconductor may be exposed to a gas containing oxygen in the presence of plasma before the formation of the oxide insulating film. The method allows oxygen to be diffused into the oxide semiconductor layer, which contributes to the excellent characteristics of the thin film transistor.

35 Claims, 30 Drawing Sheets

(56) References Cited

U.S. PATENT DOCUMENTS

| | | |
|---|---|---|
| 6,294,274 B1 | 9/2001 | Kawazoe et al. |
| 6,514,804 B1 * | 2/2003 | Yamaguchi .................. 438/164 |
| 6,563,174 B2 | 5/2003 | Kawasaki et al. |
| 6,727,522 B1 | 4/2004 | Kawasaki et al. |
| 7,049,190 B2 | 5/2006 | Takeda et al. |
| 7,061,014 B2 | 6/2006 | Hosono et al. |
| 7,064,346 B2 | 6/2006 | Kawasaki et al. |
| 7,105,868 B2 | 9/2006 | Nause et al. |
| 7,211,825 B2 | 5/2007 | Shih et al |
| 7,282,782 B2 | 10/2007 | Hoffman et al. |
| 7,297,977 B2 | 11/2007 | Hoffman et al. |
| 7,323,356 B2 | 1/2008 | Hosono et al. |
| 7,385,224 B2 | 6/2008 | Ishii et al. |
| 7,402,506 B2 | 7/2008 | Levy et al. |
| 7,411,209 B2 | 8/2008 | Endo et al. |
| 7,453,065 B2 | 11/2008 | Saito et al. |
| 7,453,087 B2 | 11/2008 | Iwasaki |
| 7,462,862 B2 | 12/2008 | Hoffman et al. |
| 7,468,304 B2 | 12/2008 | Kaji et al. |
| 7,501,293 B2 | 3/2009 | Ito et al. |
| 7,674,650 B2 | 3/2010 | Akimoto et al. |
| 7,732,819 B2 | 6/2010 | Akimoto et al. |
| 7,767,505 B2 | 8/2010 | Son et al. |
| 8,129,717 B2 | 3/2012 | Yamazaki et al. |
| 8,129,719 B2 | 3/2012 | Yamazaki et al. |
| 2001/0046027 A1 | 11/2001 | Tai et al. |
| 2002/0056838 A1 | 5/2002 | Ogawa |
| 2002/0132454 A1 | 9/2002 | Ohtsu et al. |
| 2003/0189401 A1 | 10/2003 | Kido et al. |
| 2003/0218222 A1 | 11/2003 | Wager et al. |
| 2004/0038446 A1 | 2/2004 | Takeda et al. |
| 2004/0127038 A1 | 7/2004 | Carcia et al. |
| 2005/0017302 A1 | 1/2005 | Hoffman |
| 2005/0199959 A1 | 9/2005 | Chiang et al. |
| 2006/0035452 A1 | 2/2006 | Carcia et al. |
| 2006/0043377 A1 | 3/2006 | Hoffman et al. |
| 2006/0091793 A1 | 5/2006 | Baude et al. |
| 2006/0108529 A1 | 5/2006 | Saito et al. |
| 2006/0108636 A1 | 5/2006 | Sano et al. |
| 2006/0110867 A1 | 5/2006 | Yabuta et al. |
| 2006/0113536 A1 | 6/2006 | Kumomi et al. |
| 2006/0113539 A1 | 6/2006 | Sano et al. |
| 2006/0113549 A1 | 6/2006 | Den et al. |
| 2006/0113565 A1 | 6/2006 | Abe et al. |
| 2006/0169973 A1 | 8/2006 | Isa et al. |
| 2006/0170111 A1 | 8/2006 | Isa et al. |
| 2006/0197092 A1 | 9/2006 | Hoffman et al. |
| 2006/0208977 A1 | 9/2006 | Kimura |
| 2006/0228974 A1 | 10/2006 | Thelss et al. |
| 2006/0231882 A1 | 10/2006 | Kim et al. |
| 2006/0238135 A1 | 10/2006 | Kimura |
| 2006/0244107 A1 | 11/2006 | Sugihara et al. |
| 2006/0284171 A1 | 12/2006 | Levy et al. |
| 2006/0284172 A1 | 12/2006 | Ishii |
| 2006/0292777 A1 | 12/2006 | Dunbar |
| 2007/0024187 A1 | 2/2007 | Shin et al. |
| 2007/0046191 A1 | 3/2007 | Saito |
| 2007/0052025 A1 | 3/2007 | Yabuta |
| 2007/0054507 A1 | 3/2007 | Kaji et al. |
| 2007/0090365 A1 | 4/2007 | Hayashi et al. |
| 2007/0108446 A1 | 5/2007 | Akimoto |
| 2007/0152217 A1 | 7/2007 | Lai et al. |
| 2007/0172591 A1 | 7/2007 | Seo et al. |
| 2007/0187678 A1 | 8/2007 | Hirao et al. |
| 2007/0187760 A1 | 8/2007 | Furuta et al. |
| 2007/0194379 A1 | 8/2007 | Hosono et al. |
| 2007/0252928 A1 | 11/2007 | Ito et al. |
| 2007/0272922 A1 | 11/2007 | Kim et al. |
| 2007/0287296 A1 | 12/2007 | Chang |
| 2008/0006877 A1 | 1/2008 | Mardilovich et al. |
| 2008/0038882 A1 | 2/2008 | Takechi et al. |
| 2008/0038929 A1 | 2/2008 | Chang |
| 2008/0050595 A1 | 2/2008 | Nakagawara et al. |
| 2008/0073653 A1 | 3/2008 | Iwasaki |
| 2008/0083950 A1 | 4/2008 | Pan et al. |
| 2008/0106191 A1 | 5/2008 | Kawase |
| 2008/0128689 A1 | 6/2008 | Lee et al. |
| 2008/0129195 A1 | 6/2008 | Ishizaki et al. |
| 2008/0166834 A1 | 7/2008 | Kim et al. |
| 2008/0182358 A1 | 7/2008 | Cowdery-Corvan et al. |
| 2008/0197350 A1 | 8/2008 | Park et al. |
| 2008/0224133 A1 | 9/2008 | Park et al. |
| 2008/0254569 A1 | 10/2008 | Hoffman et al. |
| 2008/0258139 A1 | 10/2008 | Ito et al. |
| 2008/0258140 A1 | 10/2008 | Lee et al. |
| 2008/0258141 A1 | 10/2008 | Park et al. |
| 2008/0258143 A1 | 10/2008 | Kim et al. |
| 2008/0291350 A1 | 11/2008 | Hayashi et al. |
| 2008/0296568 A1 | 12/2008 | Ryu et al. |
| 2008/0315193 A1 | 12/2008 | Kim et al. |
| 2009/0065777 A1 * | 3/2009 | Oue et al. .................. 257/59 |
| 2009/0068773 A1 | 3/2009 | Lai et al. |
| 2009/0073325 A1 | 3/2009 | Kuwabara et al. |
| 2009/0114910 A1 | 5/2009 | Chang |
| 2009/0134399 A1 | 5/2009 | Sakakura et al. |
| 2009/0142887 A1 | 6/2009 | Son et al. |
| 2009/0152541 A1 | 6/2009 | Maekawa et al. |
| 2009/0261325 A1 | 10/2009 | Kawamura et al. |
| 2009/0278122 A1 | 11/2009 | Hosono et al. |
| 2009/0280600 A1 | 11/2009 | Hosono et al. |
| 2010/0044701 A1 | 2/2010 | Sano et al. |
| 2010/0051940 A1 | 3/2010 | Yamazaki et al. |
| 2010/0117075 A1 * | 5/2010 | Akimoto et al. .................. 257/43 |
| 2010/0123130 A1 | 5/2010 | Akimoto et al. |
| 2011/0115763 A1 | 5/2011 | Yamazaki et al. |
| 2011/0260171 A1 | 10/2011 | Yamazaki |
| 2011/0263082 A1 | 10/2011 | Yamazaki |
| 2011/0263083 A1 | 10/2011 | Yamazaki |
| 2011/0263084 A1 | 10/2011 | Yamazaki |
| 2011/0263085 A1 | 10/2011 | Yamazaki |
| 2011/0263091 A1 | 10/2011 | Yamazaki |
| 2011/0281394 A1 | 11/2011 | Yamazaki |
| 2012/0108006 A1 | 5/2012 | Yamazaki et al. |
| 2012/0108007 A1 | 5/2012 | Yamazaki et al. |
| 2012/0122277 A1 | 5/2012 | Yamazaki et al. |

FOREIGN PATENT DOCUMENTS

| | | |
|---|---|---|
| JP | 60-198861 | 10/1985 |
| JP | 60-198861 A | 10/1985 |
| JP | 63-210022 A | 8/1988 |
| JP | 63-210023 A | 8/1988 |
| JP | 63-210024 A | 9/1988 |
| JP | 63-215519 A | 9/1988 |
| JP | 63-239117 A | 10/1988 |
| JP | 63-265818 A | 11/1988 |
| JP | 05-251705 A | 9/1993 |
| JP | 08-264794 | 10/1996 |
| JP | 08-264794 A | 10/1996 |
| JP | 11-505377 | 5/1999 |
| JP | 2000-044236 A | 2/2000 |
| JP | 2000-150900 | 5/2000 |
| JP | 2002-076356 A | 3/2002 |
| JP | 2002-289859 A | 10/2002 |
| JP | 2003-086000 A | 3/2003 |
| JP | 2003-086808 A | 3/2003 |
| JP | 2004-103957 | 4/2004 |
| JP | 2004-273614 A | 9/2004 |
| JP | 2004-273732 A | 9/2004 |
| JP | 2007-096055 | 4/2007 |
| JP | 2008-042088 | 2/2008 |
| JP | 2008-205469 | 9/2008 |
| JP | 2009-004787 | 1/2009 |
| JP | 2009-260002 | 11/2009 |
| JP | 2010-016163 | 1/2010 |
| JP | 2010-062229 | 3/2010 |
| WO | WO-2004/114391 | 12/2004 |
| WO | WO-2008/105347 | 9/2008 |

OTHER PUBLICATIONS

Prins et al., "A Ferroelectric Transparent Thin-Film Transistor," Appl. Phys. Lett. (Applied Physics Letters), Jun. 17, 1996, vol. 68, No. 25, pp. 3650-3652.

(56) References Cited

OTHER PUBLICATIONS

Nakamura et al., "The Phase Relations in the $In_2O_3$-$Ga_2ZnO_4$-ZnO System at 1350° C.," Journal of Solid State Chemistry, Aug. 1, 1991, vol. 93, No. 2, pp. 298-315.

Kimizuka et al., "Syntheses and Single-Crystal Data of Homologous Compounds, $In_2O_3(ZnO)m$ (m = 3, 4, and 5), $InGaO_3(ZnO)_3$, and $Ga_2O_3(ZnO)m$ (m = 7, 8, 9, and 16) in the $In_2O_3$-$ZnGa_2O_4$-ZnO System," Journal of Solid State Chemistry, Apr. 1, 1995, vol. 116, No. 1, pp. 170-178.

Nomura et al., "Thin-Film Transistor Fabricated in Single-Crystalline Transparent Oxide Semiconductor," Science, May 23, 2003, vol. 300, No. 5623, pp. 1269-1272.

Nakamura et al., "Syntheses and crystal structures of new homologous compounds, indium iron zinc oxides ($InFeO_3(ZnO)m$) (m: natural number) and related compounds," Kotai Butsuri (Solid State Physics), 1993, vol. 28, No. 5, pp. 317-327.

Fortunato.E et al., "Wide-Bandgap High-Mobility ZNO Thin-Film Transistors Produced at Room Temperature,", Appl. Phys. Lett. (Applied Physics Letters), Sep. 27, 2004, vol. 85, No. 13, pp. 2541-2543.

Dembo.H et al., "RFCPUS on Glass and Plastic Substrates Fabricated by TFT Transfer Technology,", IEDM 05: Technical Digest of International Electron Devices Meeting, Dec. 5, 2005, pp. 1067-1069.

Ikeda.T et al., "Full-Functional System Liquid Crystal Display Using CG-Silicon Technology,", SID Digest '04 : SID International Symposium Digest of Technical Papers, 2004, vol. 35, pp. 860-863.

Park.J et al., "Improvements in the Device Characteristics of Amorphous Indium Gallium Zinc Oxide Thin-Film Transistors by Ar Plasma Treatment,", Appl. Phys. Lett. (Applied Physics Letters), Jun. 26, 2007, vol. 90, No. 26, pp. 262106-1-262106-3.

Takahashi.M et al., "Theoretical Analysis of 1GZO Transparent Amorphous Oxide Semiconductor,", IDW '08 : Proceedings of the 15th International Display Workshops, Dec. 3, 2008, pp. 1637-1640.

Hayashi.R et al., "42.1: Invited Paper: Improved Amorphous In-Ga-Zn-O TFTS,", SID Digest '08 : SID International Symposium Digest of Technical Papers, May 20, 2008, vol. 39, pp. 621-624.

Masuda.S et al., "Transparent thin film transistors using ZnO as an active channel layer and their electrical properties,", J. Appl. Phys. (Journal of Applied Physics), Feb. 1, 2003, vol. 93, No. 3, pp. 1624-1630.

Asakuma.N. et al., "Crystallization and Reduction of Sol-Gel-Derived Zinc Oxide Films by Irradiation With Ultraviolet Lamp,", Journal of Sol-Gel Science and Technology, 2003, vol. 26, pp. 181-184.

Osada.T et al., "15.2: Development of Driver-Integrated Panel using Amorphous In-Ga-Zn-Oxide TFT,", SID Digest '09 : SID International Symposium Digest of Technical Papers, May 31, 2009, pp. 184-187.

Nomura.K et al., "Carrier transport in transparent oxide semiconductor with intrinsic structural randomness probed using single-crystalline $InGaO_3(ZnO)_5$ films,", Appl. Phys. Lett. (Applied Physics Letters), Sep. 13, 2004, vol. 85, No. 11, pp. 1993-1995.

Li.C et al., "Modulated Structures of Homologous Compounds $InMO_3(ZnO)_m$ (M=In,Ga; m=Integer) Described by Four-dimensional Superspace Group,", Journal of Solid State Chemistry, 1998, vol. 139, pp. 347-355.

Son.K et al., "42.4L: Late-News Paper: 4 Inch QVGA AMOLED Driven by the Threshold Voltage Controlled Amorphous GIZO ($Ga_2O_3$-$In_2O_3$-ZnO) TFT,", SID Digest '08 : SID International symposium Digest of Technical Papers, May 20, 2008, vol. 39, pp. 633-636.

Lee.J et al., "World's Largest (15-Inch) XGA AMLCD Panel Using IGZO Oxide TFT,", SID Digest '08 : SID International Symposium Digest of Technical Papers, May 20, 2008, vol. 39, pp. 625-628.

Nowatari.H et al., "60.2: Intermediate Connector With Suppressed Voltage Loss for White Tandem OLEDS,", SID Digest '09 : SID International Symposium Digest of Technical Papers, May 31, 2009, vol. 40, pp. 899-902.

Kanno.H et al., "White Stacked Electrophosphorecent Organic Light-Emitting Devices Employing $MOO_3$ as a Charge-Generation Layer,", Adv. Mater. (Advanced Materials), 2006, vol. 18, No. 3, pp. 339-342.

Tsuda.K et al., "Ultra Low Power Consumption Technologies for Mobile TFT-LCDs,", IDW '02 : Proceedings of the 9th International Display Workshops, Dec. 4, 2002, pp. 295-298.

Van De Walle.C, "Hydrogen as a Cause of Doping in Zinc Oxide,", Phys. Rev. Lett. (Physical Review Letters), Jul. 31, 2000, vol. 85, No. 5, pp. 1012-1015.

Fung.T et al., "2-D Numerical Simulation of High Performance Amorphous In-Ga-Zn-O TFTs for Flat Panel Displays,", AM-FPD '08 Digest of Technical Papers, Jul. 2, 2008, pp. 251-252, The Japan Society of Applied Physics.

Jeong.J et al., "3.1: Distinguished Paper: 12.1-Inch WXGA AMOLED Display Driven by Indium-Gallium-Zinc Oxide TFTs Array,", SID Digest '08 : SID International Symposium Digest of Technical Papers, May 20, 2008, vol. 39, No. 1, pp. 1-4.

Park.J et al., "High performance amorphous oxide thin film transistors with self-aligned top-gate structure,", IEDM 09: Technical Digest of International Electron Devices Meeting, Dec. 7, 2009, pp. 191-194.

Kurokawa.Y et al., "UHF RFCPUS on Flexible and Glass Substrates for Secure RFID Systems,", Journal of Solid-State Circuits, 2008, vol. 43, No. 1, pp. 292-299.

Ohara.H et al., "Amorphous In-Ga-Zn-Oxide TFTs with Suppressed Variation for 4.0 inch QVGA AMOLED Display,", AM-FPD '09 Digest of Technical Papers, Jul. 1, 2009, pp. 227-230, The Japan Society of Applied Physics.

Coates.D et al., "Optical Studies of the Amorphous Liquid-Cholesteric Liquid Crystal Transition:The "Blue Phase",", Physics Letters, Sep. 10, 1973, vol. 45A, No. 2, pp. 115-116.

Cho.D et al., "21.2:AL and Sn-Doped Zinc Indium Oxide Thin Film Transistors for AMOLED Back-Plane,", SID Digest '09 : SID International Symposium Digest of Technical Papers, May 31, 2009, pp. 280-283.

Lee.M et al., "15.4:Excellent Performance of Indium-Oxide-Based Thin-Film Transistors by DC Sputtering,", SID Digest '09 : SID International Symposium Digest of Technical Papers, May 31, 2009, pp. 191-193.

Jin.D et al., "65.2:Distinguished Paper:World-Largest (6.5") Flexible Full Color Top Emission AMOLED Display on Plastic Film and Its Bending Properties,", SID Digest '09 : SID International Symposium Digest of Technical Papers, May 31, 2009, pp. 983-985.

Sakata.J et al., "Development of 4.0-In. AMOLED Display With Driver Circuit Using Amorphous In-Ga-Zn-Oxide TFTS,", IDW '09 : Proceedings of the 16TH International Display Workshops, 2009, pp. 689-692.

Park.J et al., "Amorphous Indium-Gallium-Zinc Oxide TFTS and Their Application for Large Size AMOLED,", AM-FPD '08 Digest of Technical Papers, Jul. 2, 2008, pp. 275-278.

Park.S et al., "Challenge to Future Displays: Transparent AM-OLED Driven by Peald Grown ZNO TFT,", IMID '07 Digest, 2007, pp. 1249-1252.

Godo.H et al., "Temperature Dependence of Characteristics and Electronic Structure for Amorphous In-Ga-Zn-Oxide TFT,", AM-FPD '09 Digest of Technical Papers, Jul. 1, 2009, pp. 41-44.

Osada.T et al., "Development of Driver-Integrated Panel Using Amorphous In-Ga-Zn-Oxide TFT,", AM-FPD '09 Digest of Technical Papers, Jul. 1, 2009, pp. 33-36.

Hirao.T et al., "Novel Top-Gate Zinc Oxide Thin-Film Transistors (ZNO TFTS) for AMLCDS,", Journal of the SID, 2007, vol. 15, No. 1, pp. 17-22.

Hosono.H, "68.3:Invited Paper:Transparent Amorphous Oxide Semiconductors for High Performance TFT,", SID Digest '07 : SID International Symposium Digest of Technical Papers, 2007, vol. 38, pp. 1830-1833.

Godo.H et al. "P-9:Numerical Analysis on Temperature Dependence of Characteristics of Amorphous In-Ga-Zn-Oxide TFT,", SID Digest '09 : SID International Symposium Digest of Technical Papers, May 31, 2009, pp. 1110-1112.

(56) References Cited

OTHER PUBLICATIONS

Ohara.H et al., "21.3:4.0 In. QVGA AMOLED Display Using In-Ga-Zn-Oxide TFTS With a Novel Passivation Layer,", SID Digest '09 : SID International Symposium Digest of Technical Papers, May 31, 2009, pp. 284-287.

Miyasaka.M, "SUFTLA Flexible Microelectronics on Their Way to Business,", SID Digest '07 : SID International Symposium Digest of Technical Papers, 2007, vol. 38, pp. 1673-1676.

Chern.H et al., "An Analytical Model for the Above-Threshold Characteristics of Polysilicon Thin-Film Transistors,", IEEE Transactions on Electron Devices, Jul. 1, 1995, vol. 42, No. 7, pp. 1240-1246.

Kikuchi.H et al., "39.1:Invited Paper:Optically Isotropic Nano-Structured Liquid Crystal Composites for Display Applications,", SID Digest '09 : SID International Symposium Digest of Technical Papers, May 31, 2009, pp. 578-581.

Asaoka.Y et al., "29.1:Polarizer-Free Reflective LCD Combined With Ultra Low-Power Driving Technology;", SID Digest '09 : SID International Symposium Digest of Technical Papers, May 31, 2009, pp. 395-398.

Lee.H et al., "Current Status of, Challenges to, and Perspective View of AM-OLED,", IDW '06 : Proceedings of the 13th International Display Workshops, Dec. 7, 2006, pp. 663-666.

Kikuchi.H et al., "62.2:Invited Paper:Fast Electro-Optical Switching in Polymer-Stabilized Liquid Crystalline Blue Phases for Display Application,", SID Digest '07 : SID International Symposium Digest of Technical Papers, 2007, vol. 38, pp. 1737-1740.

Nakamura, M., "Synthesis of Homologous Compound with New Long-Period Structure,", NIRIM Newsletter, Mar. 1, 1995, vol. 150, pp. 1-4.

Kikuchi.H et al., "Polymer-Stabilized Liquid Crystal Blue Phases,", Nature Materials, Sep. 1, 2002, vol. 1, pp. 64-68.

Kimizuka.N et al., "Spinel, $YBFE_2O_4$, and $YB_2FE_3O_7$ Types of Structures for Compounds in the $IN_2O_3$ and $SC_2O_3$-$A_2O_3$-BO Systems [A; Fe, Ga, or Al; B: Mg, Mn, Fe, Ni, Cu,or Zn] at Temperatures Over 1000° C.,", Journal of Solid State Chemistry, 1985, vol. 60, pp. 382-384.

Kitzerow.H et al., "Observation of Blue Phases in Chiral Networks,", Liquid Crystals, 1993, vol. 14, No. 3, pp. 911-916.

Costello.M et al., "Electron Microscopy of a Cholesteric Liquid Crystal and Its Blue Phase,", Phys. Rev. A (Physical Review. A), May 1, 1984, vol. 29, No. 5, pp. 2957-2959.

Meiboom.S et al., "Theory of the Blue Phase of Cholesteric Liquid Crystals,", Phys. Rev. Lett. (Physical Review Letters), May 4, 1981, vol. 46, No. 18, pp. 1216-1219.

Park.Sang-Hee et al., "42.3: Transparent ZnO Thin Film Transistor for the Application of High Aperture Ratio Bottom Emission AM-OLED Display,", SID Digest '08 : SID International Symposium Digest of Technical Papers, May 20, 2008, vol. 39, pp. 629-632.

Orita.M et al., "Mechanism of Electrical Conductivity of Transparent $InGaZnO_4$,", Phys. Rev. B (Physical Review. B) Jan. 15, 2000, vol. 61, No. 3, pp. 1811-1816.

Nomura.K et al., "Amorphous Oxide Semiconductors for High-Performance Flexible Thin-Film Transistors,", Jpn. J. Appl. Phys. (Japanese Journal of Applied Physics), 2006, vol. 45, No. 5B, pp. 4303-4308.

Janotti.A et al., "Native Point Defects in ZnO,", Phys. Rev. B (Physical Review. B), 2007, vol. 76, pp. 165202-1-165202-22.

Park.J et al., "Electronic Transport Properties of Amorphous Indium-Gallium-Zinc Oxide Semiconductor Upon Exposure to Water,", Appl. Phys. Lett. (Applied Physics Letters), 2008, vol. 92, pp. 072104-1-072104-3.

Hsieh.H et al., "P-29:Modeling of Amorphous Oxide Semiconductor Thin Film Transistors and Subgap Density of States,", SID Digest '08 : SID International Symposium Digest of Technical Papers, 2008, vol. 39, pp. 1277-1280.

Janotti.A et al., "Oxygen Vacancies in ZnO,", Appl. Phys. Lett. (Applied Physics Letters), 2005, vol. 87, pp. 122102-1-122102-3.

Oba.F et al., "Defect energetics in ZnO: A hybrid Hartree-Fock density functional study,", Phys. Rev. B (Physical Review. B), 2008, vol. 77, pp. 245202-1-245202-6.

Orita.M et al., "Amorphous transparent conductive oxide $InGaO_3(ZnO)_m$ ($m \le 4$):a Zn4s conductor,", Philosophical Magazine, 2001, vol. 81, No. 5, pp. 501-515.

Hosono.H et al., "Working hypothesis to explore novel wide band gap electrically conducting amorphous oxides and examples,", J. Non-Cryst. Solids (Journal of Non-Crystalline Solids), 1996, vol. 198-200, pp. 165-169.

Mo.Y et al., "Amorphous Oxide TFT Backplanes for Large Size AMOLED Displays,", IDW '08 : Proceedings of the 6th International Display Workshops, Dec. 3, 2008, pp. 581-584.

Kim.S et al., "High-Performance oxide thin film transistors passivated by various gas plasmas,", 214th ECS Meeting, 2008, No. 2317.

Clark.S et al., "First Principles Methods Using CASTEP,", Zeitschrift fur Kristallographie, 2005, vol. 220, pp. 567-570.

Lany.S et al., "Dopability, Intrinsic Conductivity, and Nonstoichiometry of Transparent Conducting Oxides,", Phys. Rev. Lett. (Physical Review Letters), Jan. 26, 2007, vol. 98, pp. 045501-1-045501-4.

Park.J et al., "Dry etching of ZnO films and plasma-induced damage to optical properties,", J. Vac. Sci. Technol. B (Journal of Vacuum Science & Technology B), Mar. 1, 2003, vol. 21, No. 2, pp. 800-803.

Oh.M et al., "Improving the Gate Stability of ZNO Thin-Film Transistors With Aluminum Oxide Dielectric Layers,", J. Electrochem. Soc. (Journal of the Electrochemical Society), 2008, vol. 155, No. 12, pp. H1009-H1014.

Ueno.K et al., "Field-Effect Transistor on $SrTiO_3$ With Sputtered $Al_2O_3$ Gate Insulator,", Appl. Phys. Lett. (Applied Physics Letters), Sep. 1, 2003, vol. 83, No. 9, pp. 1755-1757.

International Search Report (Application No.PCT/JP2010/060150) Dated Aug. 17, 2010.

Written Opinion (Application No. PCT/JP2010/060150) Dated Aug. 17, 2010.

Park, J. et al., *"High-performance amorphous gallium indium zinc oxide thin-film transistors through $N_{20}$ plasma passivation"*, Appl. Phys. Lett., 93, 053505-1-053505-3, Aug. 7, 2008.

* cited by examiner

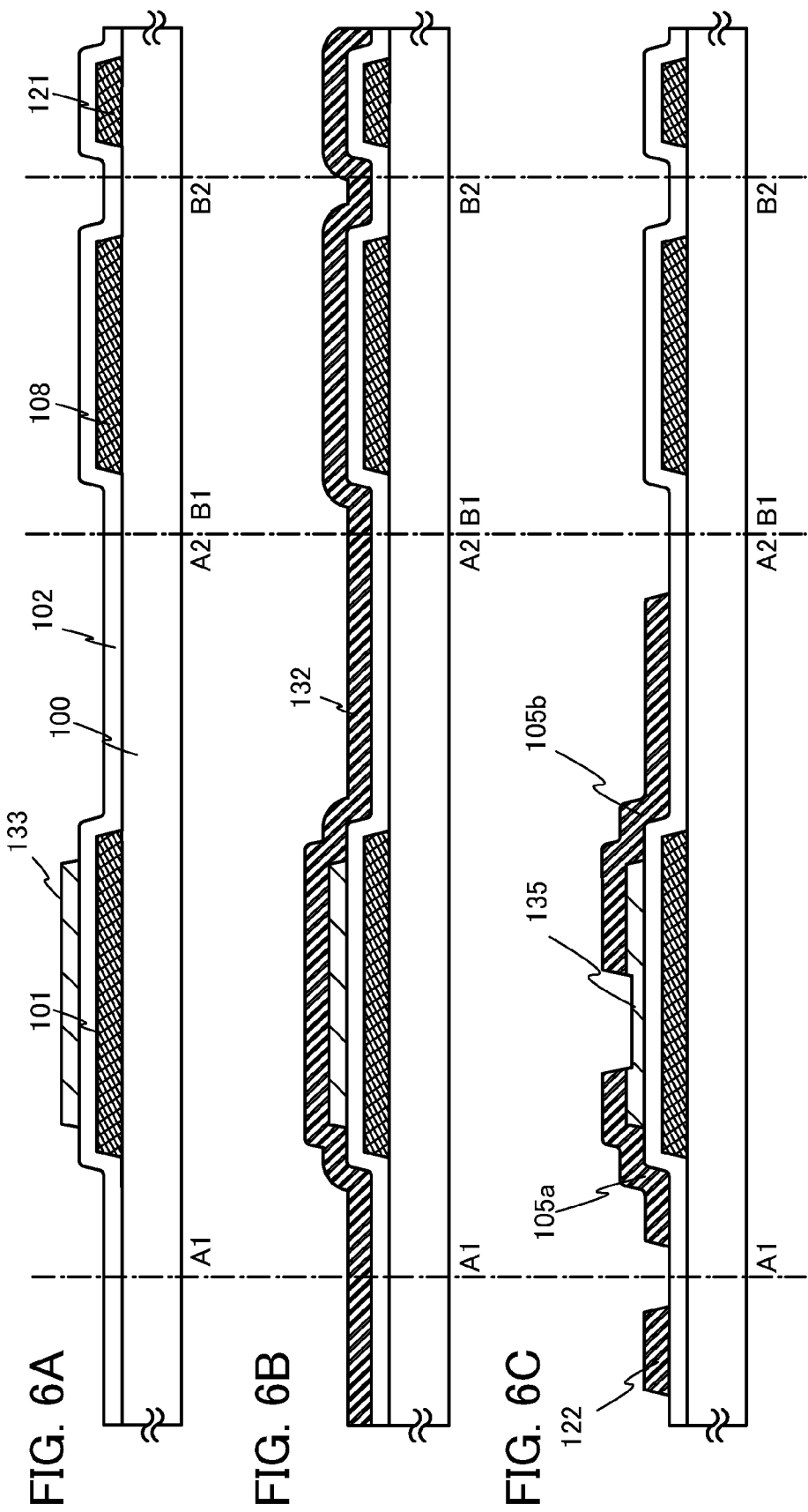

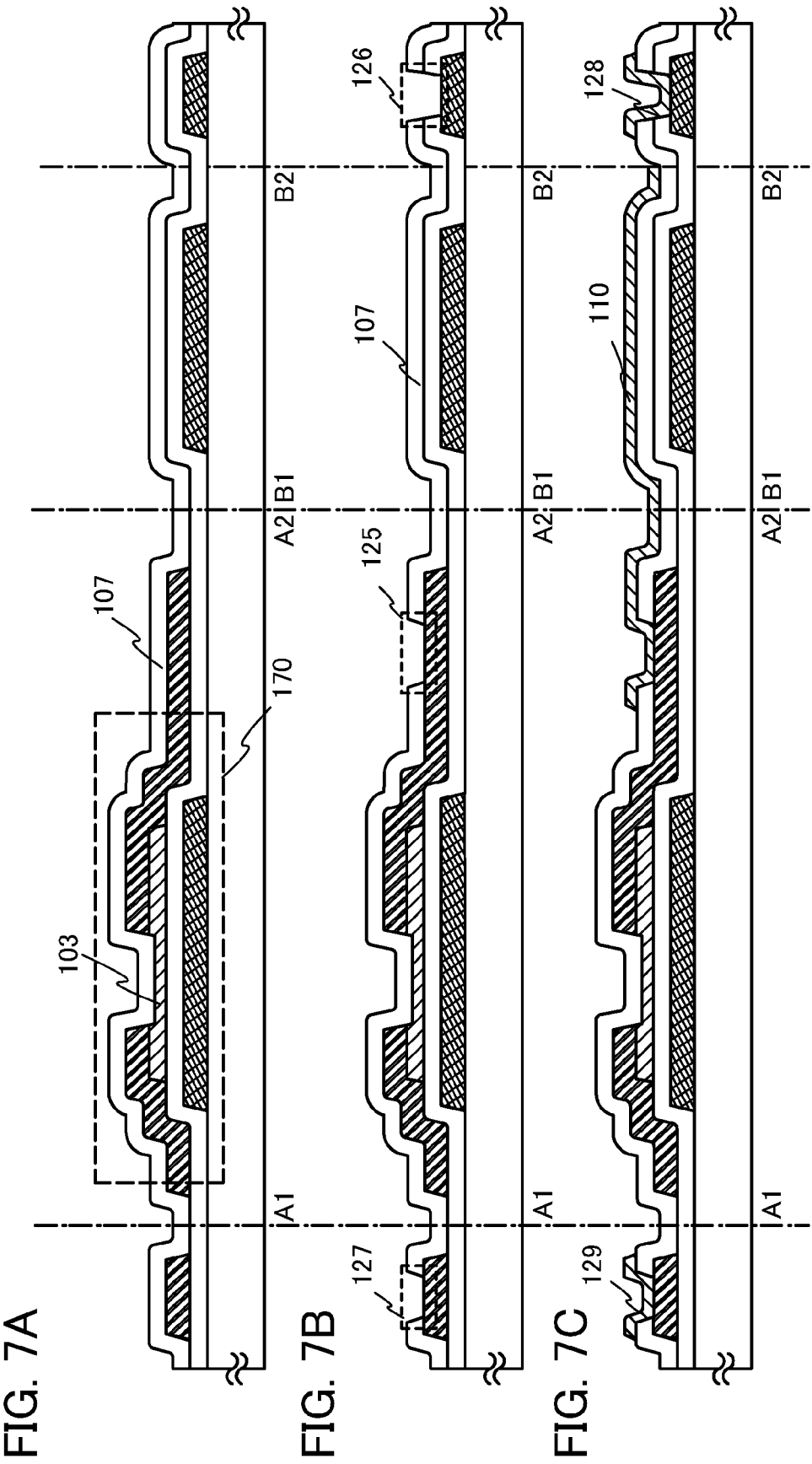

FIG. 9A1
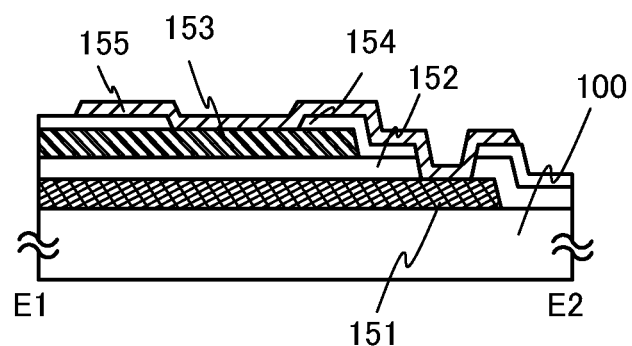
FIG. 9A2
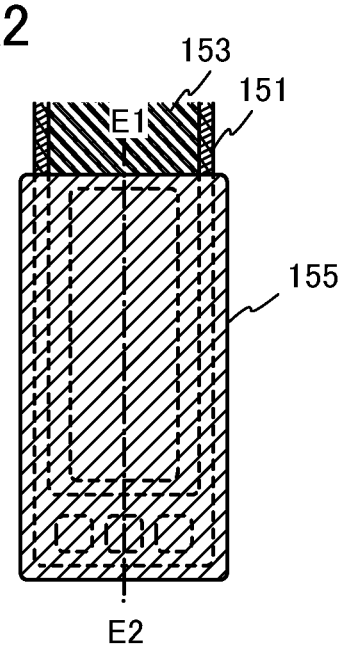
FIG. 9B1
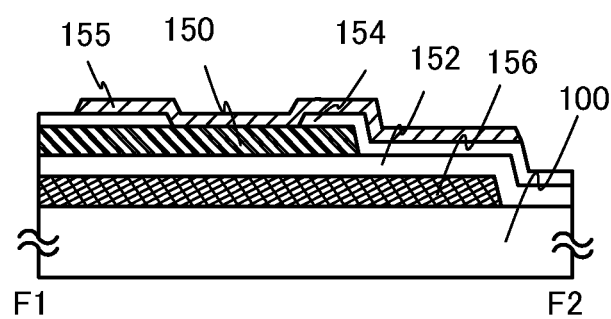
FIG. 9B2
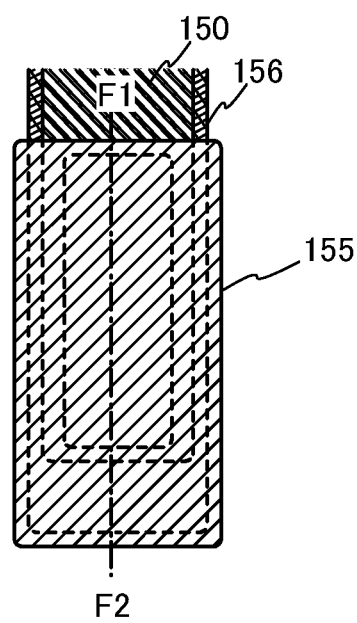

approach of oxygen to IGZO surface adsorption of oxygen on IGZO surface diffusion of oxygen into inside of IGZO

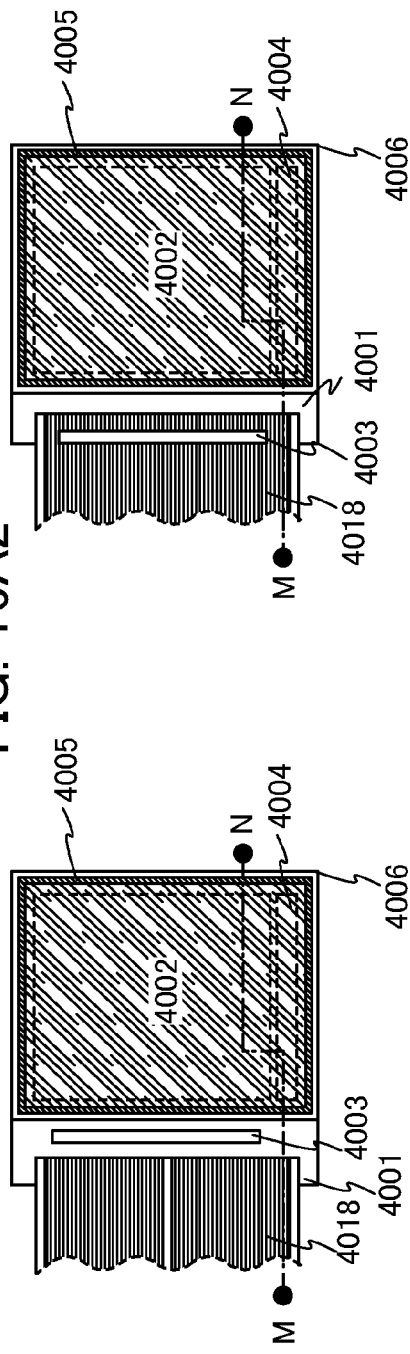
FIG. 16A1
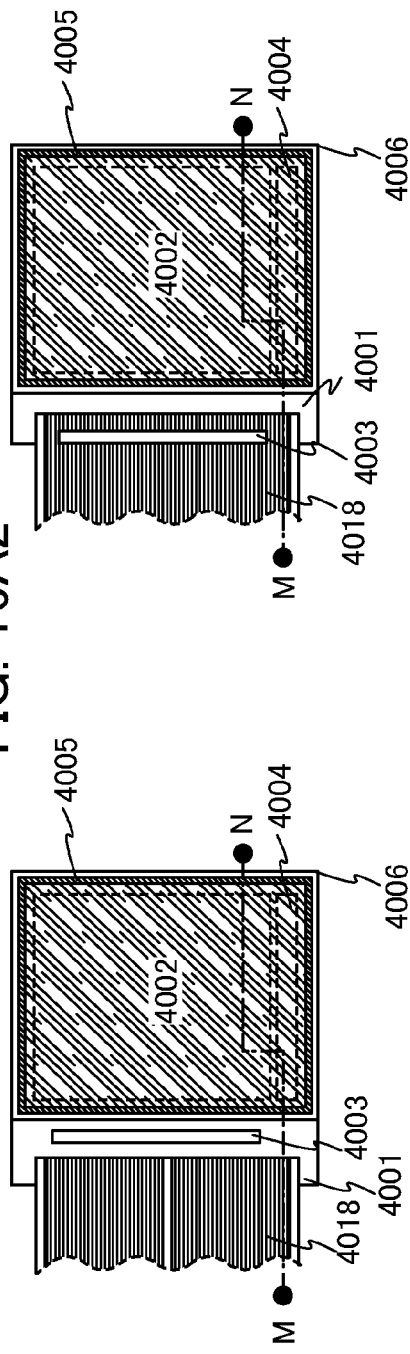
FIG. 16A2
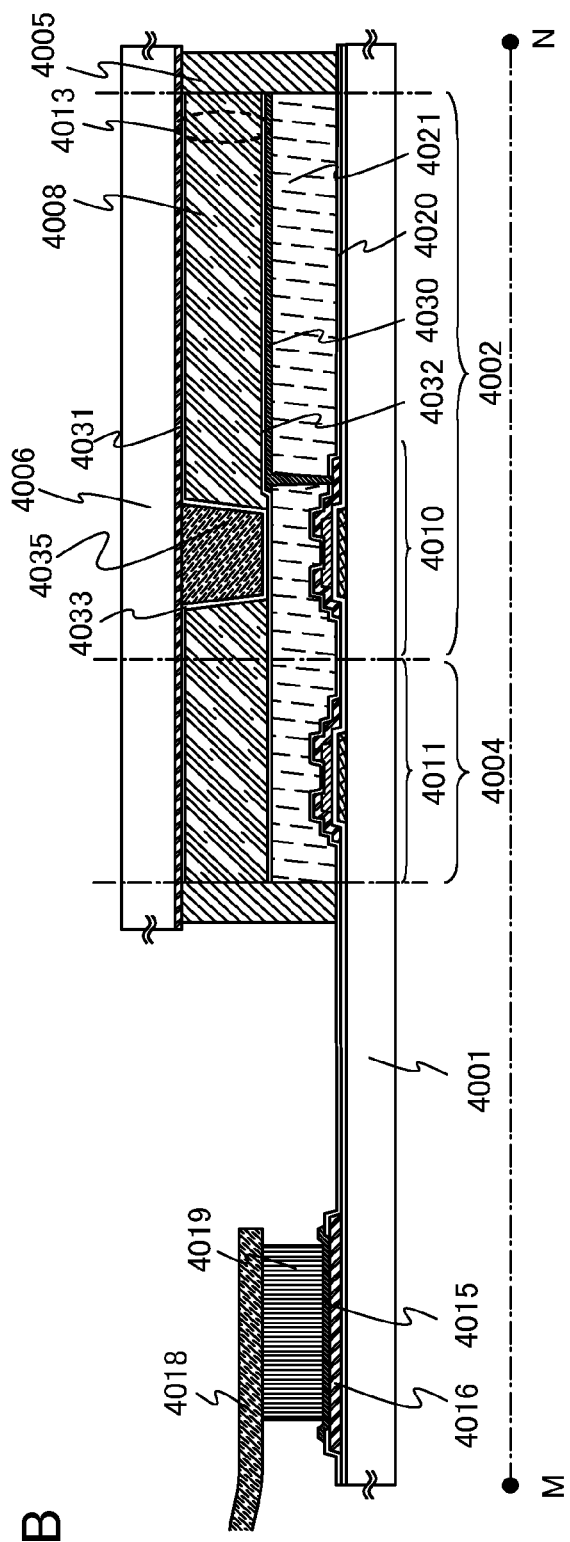
FIG. 16B

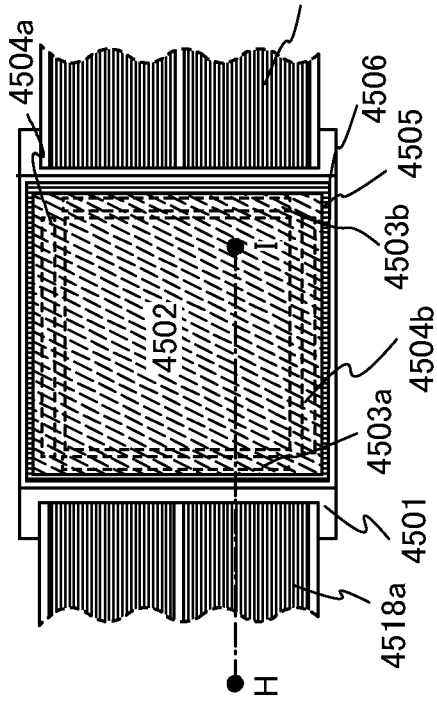
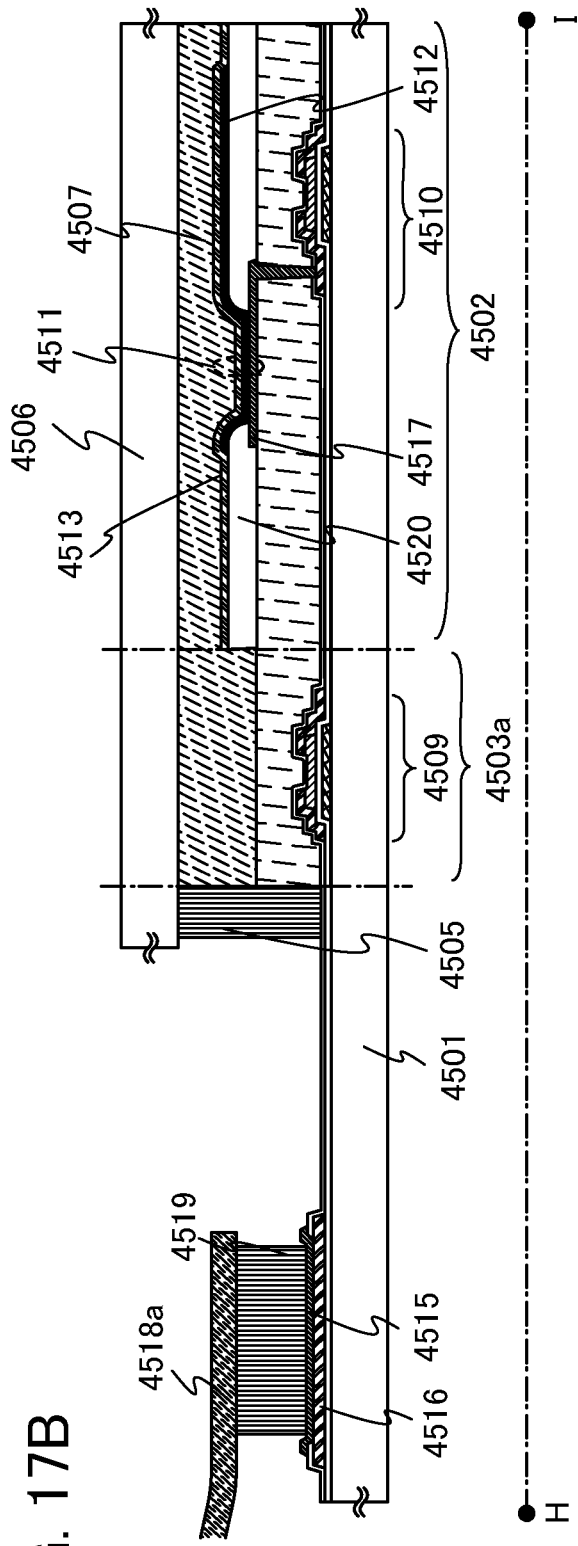
FIG. 17A
FIG. 17B

METHOD FOR MANUFACTURING SEMICONDUCTOR DEVICE

TECHNICAL FIELD

The present invention relates to a method for manufacturing a semiconductor device including an oxide semiconductor.

BACKGROUND ART

In recent years, a technique for forming a thin film transistor (TFT) by using a semiconductor thin film (having a thickness of approximately several nanometers to several hundred nanometers) formed over a substrate having an insulating surface has attracted attention. Thin film transistors are applied to a wide range of electronic devices like integrated circuits (ICs) and electro-optical devices, and development of thin film transistors that are to be used as switching elements in image display devices, in particular, is being hastened.

Various metal oxides are used for a variety of applications. Indium oxide is a well-known material and is used as a transparent electrode material which is necessary for liquid crystal displays and the like.

Some metal oxides have semiconductor characteristics. The examples of such metal oxides having semiconductor characteristics are tungsten oxide, tin oxide, indium oxide, zinc oxide, and the like. A thin film transistor in which a channel formation region is formed using such metal oxides having semiconductor characteristics is known (for example, see Patent Documents 1 to 4, Non-Patent Document 1).

Further, not only single-component oxides but also multi-component oxides are known as metal oxides. For example, homologous compound, $InGaO_3(ZnO)_m$ (m is natural number) has been known as a multi-component oxide containing In, Ga and Zn (for example, see Non-Patent Documents 2 to 4 and the like).

Furthermore, it has been confirmed that an oxide semiconductor including such an In—Ga—Zn—O-based oxide is applicable to a channel layer of a thin film transistor (for example, see Patent Document 5, Non-Patent Documents 5 and 6).

REFERENCE

Patent Document

[Patent Document 1] Japanese Published Patent Application No. S60-198861
[Patent Document 2] Japanese Published Patent Application No. H8-264794
[Patent Document 3] Japanese Translation of PCT International Application No. H11-505377
[Patent Document 4] Japanese Published Patent Application No. 2000-150900
[Patent Document 5] Japanese Published Patent Application No. 2004-103957

Non-Patent Document

[Non-Patent Document 1] M. W. Prins, K. O. Grosse-Holz, G. Muller, J. F. M. Cillessen, J. B. Giesbers, R. P. Weening, and R. M. Wolf, "A ferroelectric transparent thin-film transistor", *Appl. Phys. Lett.*, 17 Jun. 1996, Vol. 68 pp. 3650-3652

[Non-Patent Document 2] M. Nakamura, N. Kimizuka, and T. Mohri, "The Phase Relations in the $In_2O_3$—$Ga_2ZnO_4$—ZnO System at 1350° C.", *J. Solid State Chem.*, 1991, Vol. 93, pp. 298-315

[Non-Patent Document 3] N. Kimizuka, M. Isobe, and M. Nakamura, "Syntheses and Single-Crystal Data of Homologous Compounds, $In_2O_3(ZnO)_m$ (m=3, 4, and 5), $InGaO_3(ZnO)_3$, and $Ga_2O_3(ZnO)_m$ (m=7, 8, 9, and 16) in the $In_2O_3$—$ZnGa_2O_4$—ZnO System", *J. Solid State Chem.*, 1995, Vol. 116, pp. 170-178

[Non-Patent Document 4] M. Nakamura, N. Kimizuka, T. Mohri, and M. Isobe, "Homologous Series, Synthesis and Crystal Structure of $InFeO_3(ZnO)_m$ (m: natural number) and its Isostructural Compound", *KOTAI BUTSURI (SOLID STATE PHYSICS)*, 1993, Vol. 28, No. 5, pp. 317-327

[Non-Patent Document 5] K. Nomura, H. Ohta, K. Ueda, T. Kamiya, M. Hirano, and H. Hosono, "Thin-film transistor fabricated in single-crystalline transparent oxide semiconductor", *SCIENCE*, 2003, Vol. 300, pp. 1269-1272

[Non-Patent Document 6] K. Nomura, H. Ohta, A. Takagi, T. Kamiya, M. Hirano, and H. Hosono, "Room-temperature fabrication of transparent flexible thin-film transistors using amorphous oxide semiconductors", *NATURE*, 2004, Vol. 432 pp. 488-492

DISCLOSURE OF INVENTION

An object of an embodiment of the invention is to manufacture and provide a highly reliable semiconductor device including a thin film transistor with stable electric characteristics.

In the method for manufacturing a semiconductor device having a thin film transistor in which a semiconductor layer including a channel formation region is an oxide semiconductor layer, an oxide insulating film in contact with the oxide semiconductor layer is formed. Note that the oxide semiconductor layer is introduced into a chamber in a state where at least part of the oxide semiconductor layer is exposed. After the oxide semiconductor layer is introduced into the chamber where the pressure is reduced, a heat treatment step and an introduction step of plasma (at least containing oxygen plasma) are performed under a nitrogen atmosphere. Then, the deposition gas is introduced to form the oxide insulating film. Alternatively, plasma may be generated by introduction of the gas containing an oxygen element into the chamber, and plasma may be introduced into the chamber using a remote plasma apparatus (a radical generator) which is connected with the chamber.

As the gas containing the oxygen element, oxygen or nitrogen oxide (nitrous oxide (also referred to as dinitrogen monoxide) ($N_2O$) or nitrogen dioxide ($NO_2$)) can be used, and a rare gas such as helium or argon may be contained.

A gas containing silane can be used for the deposition gas. An oxide insulating film containing silicon can be formed using the gas containing silane. As the oxide insulating film formed in contact with the oxide semiconductor layer, an inorganic insulating film which blocks impurities such as moisture, a hydrogen ion, and $OH^-$ is formed, and specifically, a silicon oxide film or a silicon nitride oxide film is formed.

Heat treatment of the oxide semiconductor layer under a nitrogen atmosphere in the chamber where the pressure is reduced is preferably carried out at higher than or equal to 100° C. and lower than or equal to 500° C. (more preferably higher than or equal to 150° C. and lower than or equal to 400° C.). The heat treatment of the oxide semiconductor layer is performed until the oxide insulating film is formed. The temperature is also preferably at higher than or equal to 100° C. and lower than or equal to 500° C. (more preferably higher than or equal to 150° C. and lower than or equal to 400° C.).

The pressure in the chamber when the oxide insulating film is formed is preferably greater than or equal to 1 Pa and less than or equal to 300 Pa (greater than or equal to $7.5 \times 10^{-3}$ Torr and less than or equal to 2.25 Torr).

An embodiment of the invention disclosed in this specification is a method for manufacturing a semiconductor device which includes the following steps: forming, over a substrate having an insulating surface, a gate electrode layer, a gate insulating layer, and an oxide semiconductor layer at least part of which is exposed; introducing the substrate over which the oxide semiconductor layer at least part of which is exposed is formed into a chamber where the pressure is reduced; heating the substrate over which the oxide semiconductor layer at least part of which is exposed is formed in the chamber while the pressure of the chamber is reduced and nitrogen is introduced into the chamber; introducing a gas containing an oxygen element into the chamber while the substrate is heated; generating at least oxygen plasma in the chamber into which the gas containing an oxygen element is introduced; and forming an oxide insulating film in contact with the oxide semiconductor layer, by introducing a deposition gas into the chamber.

An embodiment of the invention disclosed in this specification is a method for manufacturing a semiconductor device which includes the following steps: forming, over a substrate having an insulating surface, a gate electrode layer, a gate insulating layer, and an oxide semiconductor layer at least part of which is exposed; introducing the substrate over which the oxide semiconductor layer at least part of which is exposed is formed into a chamber where the pressure is reduced; heating the substrate over which the oxide semiconductor layer at least part of which is exposed is formed in the chamber while the pressure in the chamber is reduced and nitrogen is introduced into the chamber; introducing a gas containing nitrogen oxide into the chamber while the substrate is heated; generating at least oxygen plasma in the chamber into which the gas containing nitrogen oxide is introduced; and forming an oxide insulating film containing silicon in contact with the oxide semiconductor layer, by introducing a deposition gas containing silane into the chamber.

An embodiment of the invention disclosed in this specification is a method for manufacturing a semiconductor device which includes the following steps: forming, over a substrate having an insulating surface, a gate electrode layer, a gate insulating layer, and an oxide semiconductor layer at least part of which is exposed; introducing the substrate over which the oxide semiconductor layer at least part of which is exposed is formed into a chamber where the pressure is reduced; heating the substrate over which the oxide semiconductor layer at least part of which is exposed is formed while the pressure in the chamber is reduced and nitrogen is introduced into the chamber; introducing oxygen plasma into the chamber using a remote plasma apparatus, which is connected to the chamber, while the substrate is heated; and forming an oxide insulating film in contact with the oxide semiconductor layer, by introducing a deposition gas into the chamber.

In the above structures, after the substrate over which the oxide semiconductor layer at least part of which is exposed is formed is heated in the chamber where the pressure of the chamber is reduced and nitrogen is introduced, a gas containing an oxygen element (or a gas containing silicon oxide) may be introduced to the chamber.

The oxide semiconductor used in this specification is a thin film expressed by $InMO_3(ZnO)_m$ (m>0), and a thin film transistor using the thin film as a semiconductor layer is manufactured. Note that M denotes one metal element or a plurality of metal elements selected from Ga, Fe, Ni, Mn, and Co. For example, M denotes Ga in some cases; meanwhile, M denotes the above metal element other than Ga, for example Ga and Ni or Ga and Fe in other cases. Further, the above oxide semiconductor may contain Fe or Ni, another transitional metal element, or an oxide of the transitional metal as an impurity element in addition to the metal element contained as M. In this specification, among the oxide semiconductor layers whose composition formulae are represented by $InMO_3(ZnO)_m$ (m>0), an oxide semiconductor whose composition formula includes at least Ga as M is referred to as an In—Ga—Zn—O-based oxide semiconductor, and a thin film of the In—Ga—Zn—O-based oxide semiconductor is referred to as an In—Ga—Zn—O-based non-single-crystal film.

As the oxide semiconductor which can be applied to the oxide semiconductor layer, any of the following oxide semiconductors can be represented besides the above materials: an In—Sn—Zn—O-based oxide semiconductor; an In—Al—Zn—O-based oxide semiconductor; a Sn—Ga—Zn—O-based oxide semiconductor; an Al—Ga—Zn—O-based oxide semiconductor; a Sn—Al—Zn—O-based oxide semiconductor; an In—Zn—O-based oxide semiconductor; a Sn—Zn—O-based oxide semiconductor; an Al—Zn—O-based oxide semiconductor; an In—O-based oxide semiconductor; a Sn—O-based oxide semiconductor; and a Zn—O-based oxide semiconductor. Silicon oxide may be added to the above-mentioned oxide semiconductor layers. The oxide semiconductor layer includes silicon oxide ($SiO_x$ (X>0)) which suppresses crystallization of the oxide semiconductor layer, whereby crystallization of the oxide semiconductor layer due to heat treatment can be suppressed. The oxide semiconductor layer preferably exists in an amorphous state; however, the oxide semiconductor layer may be partly crystallized.

Since a thin film transistor is easily broken due to static electricity or the like, a protective circuit for protecting the driver circuit is preferably provided over the same substrate for a gate line or a source line. The protective circuit is preferably formed with a non-linear element including an oxide semiconductor.

A gate insulating layer and an oxide semiconductor film may be successively processed (also called successive treatment, an in situ process, successive film formation) without exposure to air. Successive treatment without exposure to air makes it possible to form an interface between the gate insulating layer and the oxide semiconductor film without atmospheric components or impurity elements floating in air, such as moisture or hydrocarbon. Therefore, variation in characteristics of the thin film transistor can be reduced.

Note that the term "successive treatment" in this specification means that during a series of steps from a first treatment step using a plasma CVD method or a sputtering method to a second treatment step using a plasma CVD method or a sputtering method, an atmosphere in which a substrate to be processed is disposed is not contaminated by a contaminant atmosphere such as air, and is kept controlled to be vacuum or under an inert gas atmosphere (a nitrogen atmosphere or a rare gas atmosphere). By the successive treatment, a film can be formed while preventing moisture or the like from being attached again to the substrate to be processed which is cleaned.

Performing the process from the first treatment step to the second treatment step in the same chamber is within the scope of the successive treatment in this specification.

In addition, the following case is also within the scope of the successive treatment in this specification: in the case of performing the process from the first treatment step to the second treatment step in plural chambers, the substrate is transferred after the first treatment step to another chamber without being exposed to air and is then subjected to the second treatment.

Note that the case where there is a substrate transfer step, an alignment step, a slow cooling step, a step of heating or cooling a substrate to adjust the temperature of the substrate to suitable temperature for the second treatment step, or the like between the first treatment step and the second treatment step is also in the scope of the successive treatment in this specification.

A step in which liquid is used, such as a cleaning step, wet etching, or formation of a resist may be provided between the first treatment step and the second treatment step. This case is not within the scope of the successive treatment in this specification.

Note that the ordinal numbers such as "first" and "second" in this specification are used for convenience and do not denote the order of steps and the stacking order of layers. In addition, the ordinal numbers in this specification do not denote particular names which specify the present invention.

Moreover, as a display device including a driver circuit, a light-emitting display device in which a light-emitting element is used and a display device in which an electrophoretic display element is used, which is also referred to as an "electronic paper", are given in addition to a liquid crystal display device.

A light-emitting display device including a light-emitting element includes a pixel portion having a plurality of thin film transistors. The pixel portion includes a region where a gate electrode of one thin film transistor is connected to a source or drain wiring of another thin film transistor. In addition, in a driver circuit of the light-emitting display device in which a light-emitting element is used, there is a region where a gate electrode of a thin film transistor is connected to a source wiring or a drain wiring of the thin film transistor.

In this specification, a semiconductor device generally means a device which can function by utilizing semiconductor characteristics, and an electrooptic device, a semiconductor circuit, and electronic equipment are all semiconductor devices.

According to embodiments of the invention, a thin film transistor having stable electric characteristics can be manufactured and provided. Therefore, a semiconductor device which includes highly reliable thin film transistors having favorable electric characteristics can be provided.

BRIEF DESCRIPTION OF DRAWINGS

In the accompanying drawings:

FIGS. 6A to 6C are views illustrating a method for manufacturing a semiconductor device;

FIGS. 7A to 7C are views illustrating a method for manufacturing a semiconductor device;

FIGS. 9A1, 9A2, 9B1, and 9B2 are views illustrating a semiconductor device;

FIGS. 16A1, 16A2, and 16B are views each illustrating a semiconductor device;

FIGS. 17A and 17B are views illustrating a semiconductor device;

BEST MODE FOR CARRYING OUT THE INVENTION

Figure 1:
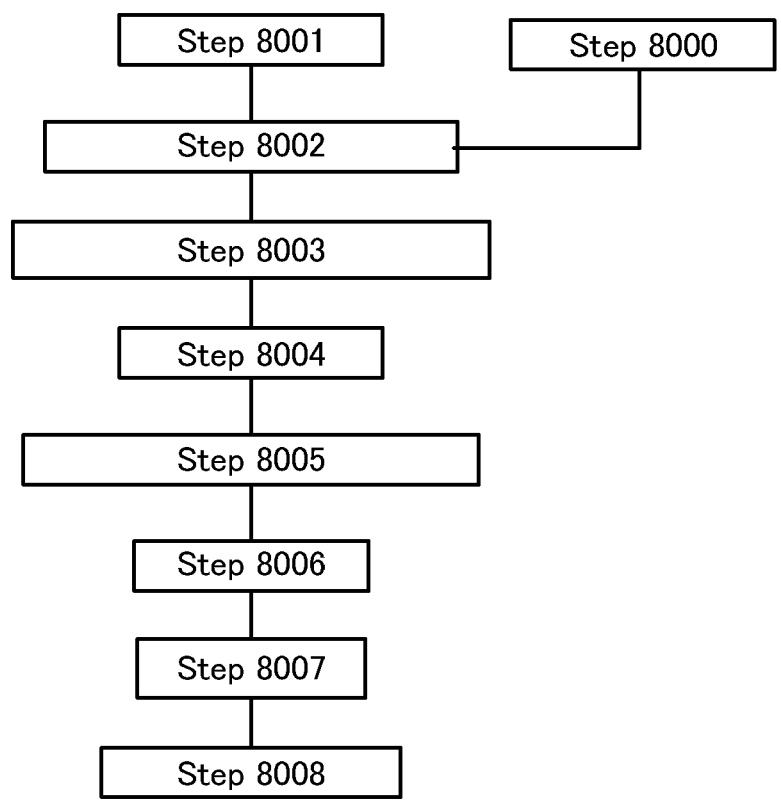
FIG. 1 is a flowchart illustrating a method for manufacturing a semiconductor device.

Embodiments of the present invention will be described with reference to drawings. However, the present invention is not limited to the following description, and various changes for the modes and details thereof will be apparent to those skilled in the art unless such changes depart from the spirit and the scope of the invention. Therefore, the present invention should not be interpreted as being limited to the following description of the embodiments. In the structures to be given below, the same portions or portions having similar functions are denoted by the same reference numerals in different drawings, and explanation thereof will not be repeated.

Embodiment 1

An embodiment of a method for manufacturing a semiconductor device will be described with reference to flowcharts in FIG. 1, FIG. 2, and FIG. 3.

In the method for manufacturing a semiconductor device having a thin film transistor in which a semiconductor layer including a channel formation region is an oxide semiconductor layer, an oxide insulating film in contact with the oxide semiconductor layer is formed. Hereinafter, the method for manufacturing a semiconductor device is described in detail.

As shown in FIG. 1, a gate electrode layer, a gate insulating layer, and an oxide semiconductor layer are formed over a substrate having an insulating surface (Step 8000). A source electrode layer and a drain electrode layer may also be formed. Note that the oxide semiconductor layer is introduced into a chamber in a state where at least part of the oxide semiconductor layer is exposed.

On the other hand, a chamber in which an oxide insulating film is formed is evacuated to a lower pressure (Step 8001). The pressure in the chamber may be greater than or equal to $1\times10^{-5}$ Pa and less than or equal to $5\times10^{-1}$ Pa (greater than or equal to $7.5\times10^{-8}$ Torr and less than or equal to $3.75\times10^{-3}$ Torr). The substrate, over which the oxide semiconductor layer is formed in a state where at least part of the oxide semiconductor layer is exposed, is introduced into the chamber where the pressure is reduced (Step 8002).

Heat treatment is performed while nitrogen is introduced into the chamber in which the substrate over which the oxide semiconductor layer is formed is provided (Step 8003). Heat treatment of the oxide semiconductor layer under a nitrogen atmosphere in the chamber where the pressure is reduced is preferably carried out at higher than or equal to 100° C. and lower than or equal to 500° C. (more preferably higher than or equal to 150° C. and lower than or equal to 400° C.).

Then, the pressure in the chamber in which heat treatment is performed under the nitrogen atmosphere is reduced again (Step 8004), and gas containing an oxygen element is introduced thereto (Step 8005). As the gas containing an oxygen element, oxygen or nitrogen oxide (nitrous oxide ($N_2O$) or nitrogen dioxide ($NO_2$)) can be used, and a rare gas such as helium or argon may be contained. Note that the step in which the pressure in the chamber is reduced before introduction of a gas containing an oxygen element (Step 8004) is not necessarily performed.

Plasma is generated in the chamber where a gas containing an oxygen element is introduced (Step 8006). The plasma includes at least oxygen plasma. The oxygen density of a surface of an exposed portion of the oxide semiconductor layer is increased by generation of the oxygen plasma. Thus, an oxygen-excess region can be formed.

Power for generating the plasma is preferably a low power of 500 W or lower (more preferably 150 W or lower) because damage to the oxide semiconductor layer can be reduced.

A deposition gas is introduced (Step 8007) into the chamber where the plasma is generated using the gas containing an oxygen element, and the oxide insulating film is formed (Step 8008).

A gas containing silane can be used for the deposition gas. An oxide insulating film containing silicon can be formed using the gas containing silane. The oxide insulating film in contact with the oxide semiconductor layer is an inorganic insulating film which blocks impurities such as moisture, a hydrogen ion, and a hydroxide ion ($OH^-$), and specifically, is a silicon oxide film or a silicon nitride oxide film.

Heat treatment of the oxide semiconductor layer is performed from the process of heat treatment under a nitrogen atmosphere to the process of formation of the oxide insulating film. The temperature during the heat treatment is preferably higher than or equal to 100° C. and lower than or equal to 500° C. (more preferably higher than or equal to 150° C. and lower than or equal to 400° C.).

The pressure in the chamber when the oxide insulating film is formed is preferably greater than or equal to 1 Pa and less than or equal to 300 Pa (greater than or equal to $7.5\times10^{-3}$ Torr and less than or equal to 2.25 Torr).

Note that in the case where a combustible gas is used for the gas containing an oxygen element and a gas containing silane is used for the deposition gas, a mix of the combustible gas and the gas containing silane might cause an explosion; therefore, the combustible gas is removed from the chamber, a combustion enhancing gas such as nitrogen oxide (nitrous oxide ($N_2O$) or nitrogen dioxide ($NO_2$)) is introduced, and then the gas containing silane is introduced.

Figure 2:
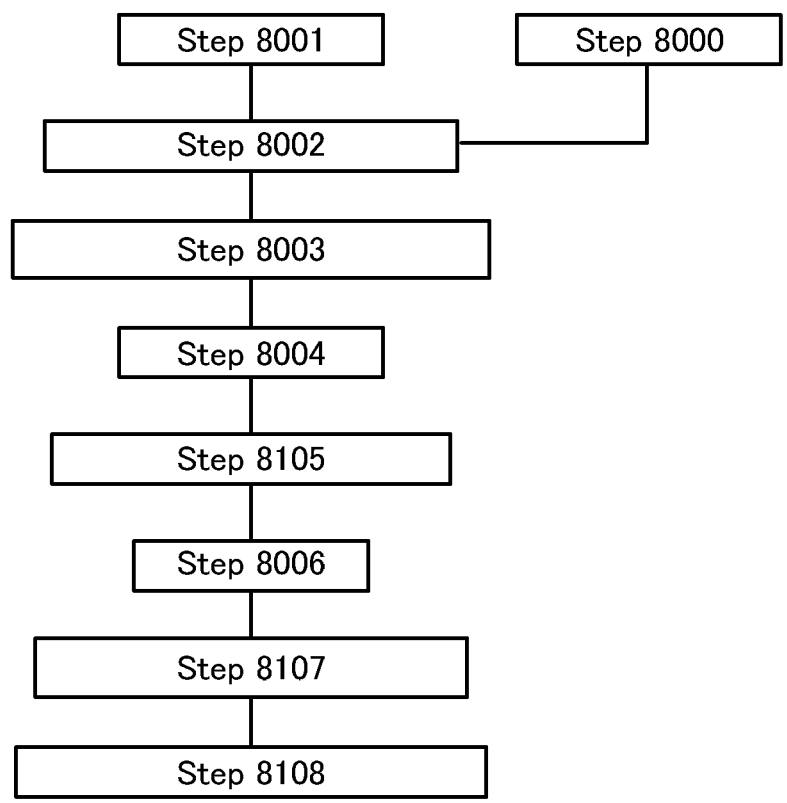
FIG. 2 is a flowchart illustrating a method for manufacturing a semiconductor device.

FIG. 2 shows an example where nitrogen oxide (nitrous oxide ($N_2O$) or nitrogen dioxide ($NO_2$)) is used for the gas containing an oxygen element (Step 8105) and a gas containing silane is used for the deposition gas (Step 8107), to form an oxide insulating film containing silicon as the oxide insulating film (Step 8108). For example, nitrous oxide ($N_2O$) and silane ($SiH_4$) can be used for the gas containing an oxygen element and the deposition gas, respectively, to form a silicon oxynitride film.

Figure 3:
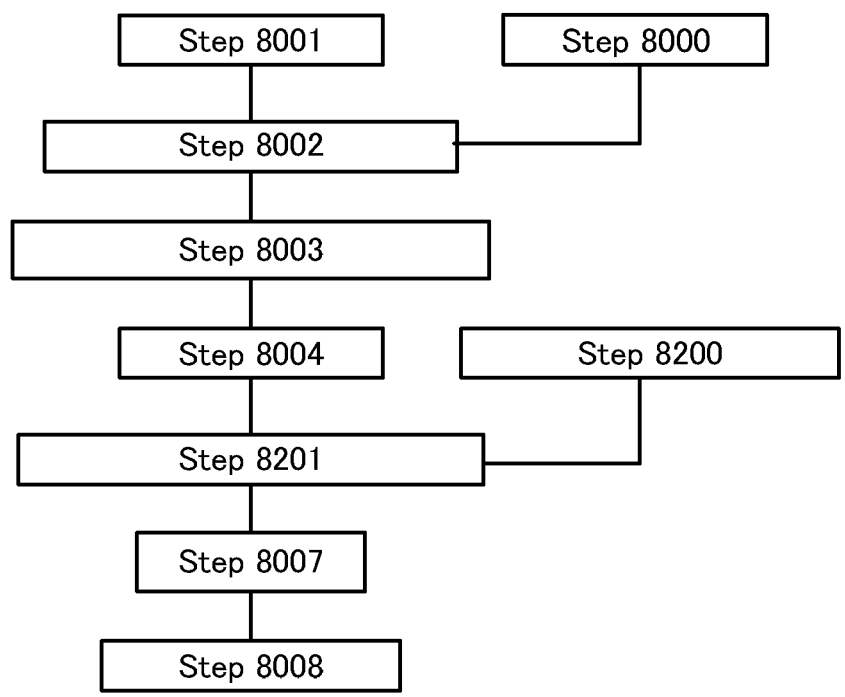
FIG. 3 is a flowchart illustrating a method for manufacturing a semiconductor device.

As shown in FIG. 1 and FIG. 2, plasma may be generated while the gas containing an oxygen element is introduced into the chamber, or as shown in FIG. 3, plasma may be introduced into the chamber using a remote plasma apparatus (a radical generator) which is connected with the chamber.

FIG. 3 shows an example where a remote plasma apparatus (a radical generator) is used (Step 8200) to introduce plasma into the chamber where heat treatment is performed under a nitrogen atmosphere (Step 8201). The plasma is generated using a gas containing an oxygen element in a chamber which is different from the chamber where the oxide insulating film is formed, using the remote plasma apparatus. As shown in FIG. 3, when plasma is generated outside the chamber where the oxide insulating film is formed and is introduced into the chamber using the remote plasma apparatus, damage to the oxide semiconductor layer in plasma generation can be prevented.

An example of a chamber which can be used will be described. A chamber is provided with a heater and the inside of the chamber is heated. In addition, the chamber is provided with a gas supply means and an exhaust means. By the gas supply means, a gas is introduced into the chamber. By the exhaust means, the chamber is evacuated or the pressure of the chamber is reduced.

The oxide insulating film is formed in contact with the oxide semiconductor layer by the above method, whereby a thin film transistor with stable electric characteristics can be manufactured and provided. Therefore, a semiconductor device which includes highly reliable thin film transistors having excellent electric characteristics can be provided.

Embodiment 2

An embodiment of a semiconductor device and a method for manufacturing the semiconductor device will be described with reference to FIGS. 4A to 4C and FIGS. 5A and 5B.

Figure 5A:
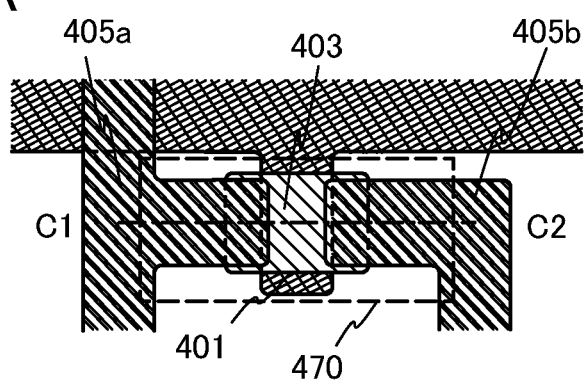
FIGS. 5A and 5B are views illustrating a method for manufacturing a semiconductor device.
Figure 5B:
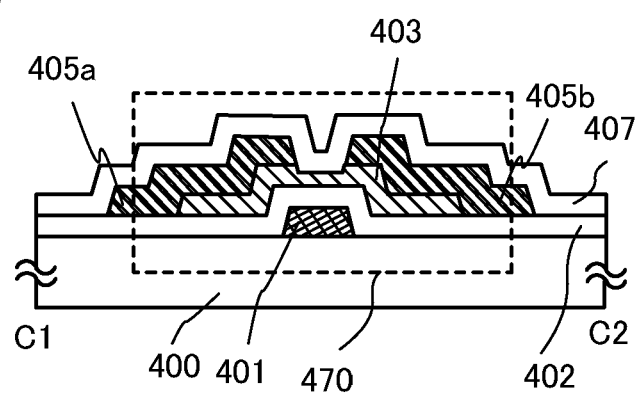

FIG. 5A is a plan view of a thin film transistor 470 included in a semiconductor device, and FIG. 5B is a cross-sectional view taken along line C1-C2 of FIG. 5A. The thin film transistor 470 is a bottom-gate thin film transistor and includes, over a substrate 400 having an insulating surface, a gate electrode layer 401, a gate insulating layer 402, an oxide semiconductor layer 403, and source and drain electrode layers 405a and 405b. In addition, an oxide insulating film 407 is provided to cover the thin film transistor 470 and be in contact with the oxide semiconductor layer 403.

Further, the source and drain electrode layers 405a and 405b are in contact with the oxide semiconductor layer 403. An element included in the source and drain electrode layers 405a and 405b is one or more elements selected from titanium, aluminum, manganese, magnesium, zirconium, beryllium, and thorium. An alloy film which combines any of the above-described elements and the like may be stacked.

As the oxide semiconductor layer 403 including a channel formation region, an oxide material having semiconductor characteristics may be used. Typically, an In—Ga—Zn—O-based non-single-crystal film is used.

Figure 4A:
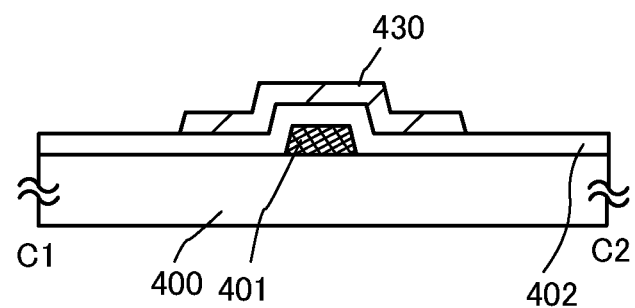
FIGS. 4A to 4C are views illustrating a method for manufacturing a semiconductor device.
Figure 4B:
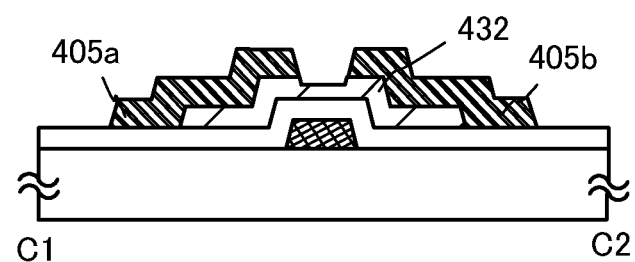
Figure 4C:
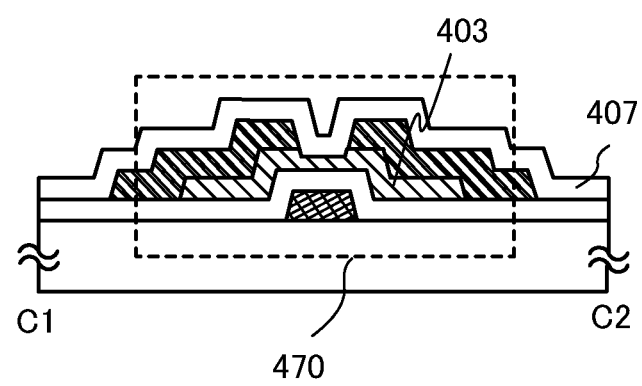

FIGS. 4A to 4C are cross-sectional views illustrating steps of manufacturing the thin film transistor 470.

In FIG. 4A, the gate electrode layer 401 is provided over the substrate 400 having an insulating surface. An insulating film serving as a base film may be provided between the substrate 400 and the gate electrode layer 401. The base film has a function of preventing diffusion of an impurity element from the substrate 400, and can be formed to have a single-layer or stacked-layer structure using one or more of a silicon nitride film, a silicon oxide film, a silicon nitride oxide film, and a silicon oxynitride film. The gate electrode layer 401 can be formed to have a single-layer or stacked-layer structure using a metal such as molybdenum, titanium, chromium, tantalum, tungsten, aluminum, copper, neodymium, or scandium, or an alloy which contains any of these materials as its main component.

For example, as a two-layer structure of the gate electrode layer 401, the following structures are preferable: a two-layer structure of an aluminum layer and a molybdenum layer stacked thereover, a two-layer structure of a copper layer and a molybdenum layer stacked thereover, a two-layer structure of a copper layer and a titanium nitride layer or a tantalum nitride layer stacked thereover, and a two-layer structure of a titanium nitride layer and a molybdenum layer. As a three-layer structure, a stack of a tungsten layer or a tungsten nitride layer, a layer of an alloy of aluminum and silicon or an alloy of aluminum and titanium, and a titanium nitride layer or a titanium layer is preferable.

Next, the gate insulating layer 402 is formed over the gate electrode layer 401.

The gate insulating layer 402 can be formed using a single layer or stacked layers of a silicon oxide layer, a silicon nitride layer, a silicon oxynitride layer, and/or a silicon nitride oxide layer with a plasma CVD method or a sputtering method. For example, a silicon oxynitride layer may be formed using a deposition gas containing silane ($SiH_4$), oxygen, and nitrogen with a plasma CVD method.

Then, an oxide semiconductor film is formed over the gate insulating layer 402.

Note that before the oxide semiconductor film is formed by a sputtering method, dust on a surface of the gate insulating layer 402 is preferably removed by reverse sputtering in which an argon gas is introduced and plasma is generated. The reverse sputtering is a method in which voltage is applied to a substrate, not to a target side, under an argon atmosphere by using an RF power supply and plasma is generated in the vicinity of the substrate to modify a surface. Note that instead of an argon atmosphere, a nitrogen atmosphere, a helium atmosphere, or the like may be used. Alternatively, oxygen, nitrous oxide ($N_2O$), or the like may be added to the argon atmosphere. Further alternatively, the plasma treatment may be performed in an argon atmosphere to which chlorine ($Cl_2$), carbon tetrafluoride ($CF_4$), and/or the like is added.

The oxide semiconductor film is formed by a sputtering method with use of an In—Ga—Zn—O-based oxide semiconductor target. The sputtering method can be carried out under a rare gas (typically argon) atmosphere, an oxygen atmosphere, or an atmosphere including a rare gas (typically argon) and oxygen.

The gate insulating layer 402 and the oxide semiconductor film may be formed successively without exposure to air. Successive film formation without exposure to air makes it possible to obtain an interface between stacked two layers without atmospheric components or impurity elements floating in air, such as moisture or hydrocarbon. Therefore, variation in characteristics of the thin film transistor can be reduced.

The oxide semiconductor film is processed into an island-like shape through a photolithography process, thereby forming an oxide semiconductor layer 430 (see FIG. 4A).

The oxide semiconductor layer 430 is preferably amorphous; however, the oxide semiconductor layer 430 may be partly crystallized.

Next, a conductive film is formed over the gate insulating layer 402 and the oxide semiconductor layer 430.

As the material of the conductive film, there are an element selected from Al, Cr, Ta, Ti, Mo, and W, an alloy containing any of these elements as a component, an alloy containing these elements in combination, and the like.

If heat treatment is performed after the conductive film is formed, it is preferable that the conductive film have heat resistance enough to withstand the heat treatment. Since use of Al alone brings disadvantages such as low heat resistance and a tendency to be corroded, aluminum is used in combination with a conductive material having heat resistance. As a conductive material having heat resistance which is to be used in combination with Al, an element selected from titanium (Ti), tantalum (Ta), tungsten (W), molybdenum (Mo), chromium (Cr), neodymium (Nd), and scandium (Sc), an alloy including any of the elements, an alloy including a combination of such elements, or nitride including any of the elements can be used.

The oxide semiconductor layer 430 and the conductive film are subjected to an etching treatment, so that an oxide semiconductor layer 432 and the source and drain electrode layers 405a and 405b are formed (see FIG. 4B). Note that a groove (depression) is formed in the oxide semiconductor layer 432 through the etching treatment.

As described in Embodiment 1, after the substrate over which the oxide semiconductor layer 432 is formed is introduced into the chamber where the pressure is reduced, the heat treatment step and the introduction step of plasma (at least containing oxygen plasma) are performed under a nitrogen atmosphere. Then, the deposition gas is introduced to form the oxide insulating film 407.

In Embodiment 2, nitrous oxide ($N_2O$) and silane ($SiH_4$) are used for the gas containing an oxygen element and the deposition gas, respectively, to form a silicon oxynitride film with a thickness of 300 nm as the oxide insulating film 407.

Heat treatment of the oxide semiconductor layer 432 under a nitrogen atmosphere in the chamber where the pressure is reduced is preferably carried out at higher than or equal to 100° C. and lower than or equal to 500° C. (more preferably higher than or equal to 150° C. and lower than or equal to 400° C.).

Heat treatment of the oxide semiconductor layer 432 is performed from a step of heat treatment under a nitrogen atmosphere to a step of formation of the oxide insulating film 407. The temperature during the heat treatment is preferably higher than or equal to 100° C. and lower than or equal to 500° C. (more preferably higher than or equal to 150° C. and lower than or equal to 400° C.).

The pressure in the chamber when the oxide insulating film 407 is formed is preferably greater than or equal to 1 Pa and less than or equal to 300 Pa (greater than or equal to $7.5 \times 10^{-3}$ Torr and less than or equal to 2.25 Torr).

When the oxide insulating film 407 is formed in contact with the oxide semiconductor layer 432 with the above method, in the oxide semiconductor layer 432, resistance of at least a region in contact with the oxide insulating film 407 can be increased (decreased in carrier concentration). Accordingly, the region becomes a high-resistance oxide semiconductor region. Therefore, the oxide semiconductor layer 432 becomes the oxide semiconductor layer 403 having a high-resistance oxide semiconductor region, and thus, the thin film transistor 470 can be manufactured (see FIG. 4C).

Further, after the oxide insulating film 407 is formed, the thin film transistor 470 may be subjected to heat treatment (preferably at higher than or equal to 150° C. and lower than 350° C.) under a nitrogen atmosphere or an atmospheric atmosphere (air atmosphere). By the heat treatment, the oxide semiconductor layer 403 is heated in contact with the oxide insulating film 407, whereby variation in electric characteristics of the thin film transistor 470 can be reduced. There is no particular limitation on the timing of the heat treatment as long as it is performed after the oxide insulating film 407 is formed. By performing another heat treatment step, for example, heat treatment when a resin film is formed or heat treatment to reduce resistance of a transparent conductive film, the heat treatment can be removed, by which increase in the number of steps can be avoided.

An oxide insulating film is formed in contact with an oxide semiconductor layer by the above method, whereby a thin film transistor with stable electric characteristics can be manufactured and provided. Therefore, a semiconductor device which includes highly reliable thin film transistors having excellent electric characteristics can be provided.

Embodiment 3

Manufacturing steps of a semiconductor device including a thin film transistor will be described with reference to FIGS. 6A to 6C, FIGS. 7A to 7C, FIG. 8, and FIGS. 9A1, 9A2, 9B1, and 9B2.

In FIG. 6A, as a substrate 100 having a light-transmitting property, a glass substrate of barium borosilicate glass, aluminoborosilicate glass, or the like can be used.

Next, a conductive layer is formed over a surface of the substrate 100, and then a first photolithography process is performed to form a resist mask. Then, an unnecessary portion is removed by etching, so that wirings and electrodes (a gate wiring including a gate electrode layer 101, a capacitor wiring 108, and a first terminal 121) are formed. At this time, the etching is performed so that at least end portions of the gate electrode layer 101 have a tapered shape.

Each of the gate wiring including the gate electrode layer 101, the capacitor wiring 108, and the first terminal 121 of a terminal portion is formed using a heat-resistance conductive material such as an element selected from titanium (Ti), tantalum (Ta), tungsten (W), molybdenum (Mo), chromium (Cr), neodymium (Nd), and scandium (Sc); an alloy including any of these elements; an alloy including any of these elements in combination; or a nitride including any of these elements.

Next, a gate insulating layer 102 is formed over an entire surface of the gate electrode layer 101. The gate insulating layer 102 is formed to a thickness of 50 nm to 250 nm using a sputtering method, a plasma CVD method, or the like.

For example, for the gate insulating layer 102, a silicon oxide film with a thickness of 100 nm is formed by a sputtering method. It can be readily understood that the main component of the gate insulating layer 102 is not limited to silicon oxide, and may be silicon oxynitride, silicon nitride, aluminum oxide, tantalum oxide, or the like. Alternatively, a single layer or a stack of layers formed from any of these materials may be used.

Next, an oxide semiconductor film (In—Ga—Zn—O-based non-single-crystal film) is formed over the gate insulating layer 102. It is effective to form the In—Ga—Zn—O-based non-single-crystal film without exposure to air after the formation of the gate insulating layer 102 because dust and moisture are not contained at the interface between the gate insulating layer and the semiconductor film. An oxide semiconductor target including In, Ga, and Zn ($In_2O_3$:$Ga_2O_3$:ZnO=1:1:1 [mol %] and In:Ga:Zn=1:1:0.5 [at %]) is used. The deposition condition is set as follows: the distant between the substrate and the target is 100 mm, the pressure is 0.2 Pa, the direct current (DC) power is 0.5 kW, and the atmosphere is a mixed atmosphere of argon and oxygen (argon:oxygen=30 sccm:20 sccm and the proportion of the oxygen flow is 40%). Note that a pulse direct current (DC) power is preferable because generation of dust can be suppressed and the film thickness dispersion can be reduced. The In—Ga—Zn—O-based non-single-crystal film is formed to have a thickness of 5 nm to 200 nm In Embodiment 3, as the oxide semiconductor film, an In—Ga—Zn—O-based non-single-crystal film with a thickness of 20 nm is formed by a sputtering method with use of an In—Ga—Zn—O-based oxide semiconductor target.

Examples of a sputtering method include an RF sputtering method in which a high-frequency power source is used for a sputtering power supply, a DC sputtering method, and a pulsed DC sputtering method in which a bias is applied in a pulsed manner. The RF sputtering method is mainly used in the case where an insulating film is formed, and the DC sputtering method is mainly used in the case where a metal film is formed.

Moreover, there is a multi-source sputtering apparatus in which a plurality of targets of different materials can be set. With the multi-source sputtering apparatus, films of different materials can be stacked in the same chamber, or a material film containing a plural kinds of materials can be deposited by electric discharge at the same time in the same chamber.

In addition, there are a sputtering apparatus provided with a magnet system inside a chamber and used for a magnetron sputtering method, and a sputtering apparatus used for an ECR sputtering method in which plasma generated with use of microwaves is used without using glow discharge.

Further, as a deposition method by sputtering, there are also a reactive sputtering method in which a target substance and a sputtering gas component are chemically reacted with each other during deposition to form a thin compound film thereof, and a bias sputtering method in which voltage is also applied to a substrate during deposition.

Next, a second photolithography process is performed to form a resist mask, and then the oxide semiconductor film is etched. For example, unnecessary portions are removed by wet etching using a mixed solution of phosphoric acid, acetic acid, and nitric acid, so that an oxide semiconductor layer 133 is formed (see FIG. 6A). Note that etching here is not limited to wet etching and dry etching may be used.

As the etching gas for dry etching, a gas containing chlorine (chlorine-based gas such as chlorine ($Cl_2$), boron chloride ($BCl_3$), silicon chloride ($SiCl_4$), or carbon tetrachloride ($CCl_4$)) is preferably used.

Alternatively, a gas containing fluorine (fluorine-based gas such as carbon tetrafluoride ($CF_4$), sulfur fluoride ($SF_6$), nitrogen fluoride ($NF_3$), or trifluoromethane ($CHF_3$)); hydrogen bromide (HBr); oxygen ($O_2$); any of these gases to which a rare gas such as helium (He) or argon (Ar) is added; or the like can be used.

As the dry etching method, a parallel plate RIE (reactive ion etching) method or an ICP (inductively coupled plasma) etching method can be used. In order to etch the films into desired shapes, the etching conditions (the electric power applied to a coil-shaped electrode, the electric power applied to an electrode on the substrate side, the temperature of the electrode on the substrate side, or the like) are adjusted as appropriate.

As an etchant used for wet etching, a mixed solution of phosphoric acid, acetic acid, and nitric acid, an ammonia hydrogen peroxide mixture (hydrogen peroxide:ammonia:water=5:2:2), or the like can be used. In addition, ITO07N (produced by KANTO CHEMICAL CO., INC.) may also be used.

The etchant after the wet etching is removed together with the etched materials by cleaning. The waste liquid including the etchant and the material etched off may be purified and the material may be reused. When a material such as indium included in the oxide semiconductor layer is collected from the waste liquid after the etching and reused, the resources can be efficiently used and the cost can be reduced.

Figure 8:
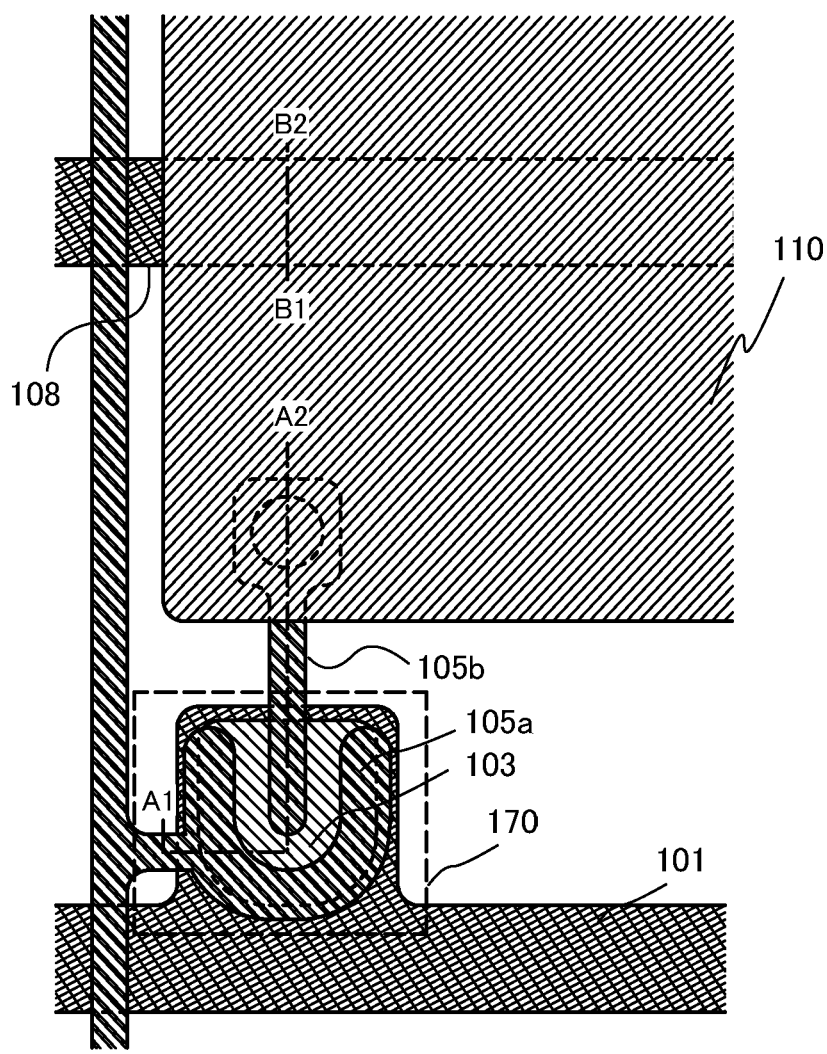
FIG. 8 is a view illustrating a semiconductor device.

The etching conditions (such as an etchant, etching time, and temperature) are appropriately adjusted depending on the material to obtain a desired shape. Here, as shown in FIG. 6A and FIG. 8, the etching is performed so that the whole of the oxide semiconductor layer 133 covers part of the gate electrode layer 101.

Next, a conductive film 132 is formed using a metal over the oxide semiconductor layer 133 by a sputtering method or a vacuum evaporation method (see FIG. 6B).

As the material of the conductive film 132, there are an element selected from Al, Cr, Ta, Ti, Mo, and W, an alloy containing any of these elements as a component, an alloy containing these elements in combination, and the like.

In the case where heat treatment is performed after the conductive film 132 is formed, the conductive film preferably has heat resistance enough to withstand the heat treatment.

Next, through a third photolithography process, a resist mask is formed and then unnecessary portions are etched away, so that source and drain electrode layers 105a and 105b and a second terminal 122 are formed (see FIG. 6C). Wet etching or dry etching is employed as an etching method at this time. For example, when an aluminum film or an aluminum-alloy film is used as the conductive film 132, wet etching using a mixed solution of phosphoric acid, acetic acid, and nitric acid can be carried out. Alternatively, the conductive film 132 may be wet-etched using an ammonia hydrogen peroxide mixture (hydrogen peroxide:ammonia:water=5:2:2) to form the source and drain electrode layers 105a and 105b. In this etching step, part of the oxide semiconductor layer 133 is etched, so that an oxide semiconductor layer 135 is formed. Therefore, a region of the oxide semiconductor layer 135, which lies between the source and drain electrode layers 105a and 105b, has a small thickness. As shown in FIG. 6C, the region of the oxide semiconductor layer 135 (exposed region) which has a smaller thickness than the region overlapped with the source electrode layer or drain electrode layer (105a or 105b) is exposed. In FIG. 6C, the etching for forming the source and drain electrode layers 105a and 105b and the oxide semiconductor layer 135 is performed at a time by dry etching. Accordingly, end portions of the source and drain electrode layers 105a and 105b are aligned with end portions of the oxide semiconductor layer 135; thus, continuous structure is formed. Namely, a side surface of the drain electrode layer 105b which faces to the source electrode layer 105a and one of side surfaces of the exposed region are coplanar. In a similar way, a side surface of the source electrode layer 105a which faces to the drain electrode layer 105b and the other of the side surfaces are coplanar. In other words, the side surface of the exposed region and at least one of the side surfaces of the source electrode layer 105a and the drain electrode layer 105b are coplanar.

In the third photolithography process, a second terminal 122 which is formed from the same material as the source and drain electrode layers 105a and 105b is left in a terminal portion. Note that the second terminal 122 is electrically connected to a source wiring (a source wiring including the source and drain electrode layers 105a and 105b).

Further, by use of a resist mask having regions with plural thicknesses (typically, two different thicknesses) which is formed using a multi-tone mask, the number of resist masks can be reduced, resulting in simplified process and lower costs.

Then, the resist mask is removed, and a protective insulating layer 107 which covers the gate insulating layer 102, the oxide semiconductor layer 103, and the source and drain electrode layers 105a and 105b is formed using a plasma CVD method.

Specifically, as described in Embodiment 1, after the source and drain electrode layers 105a and 105b are formed, the substrate 100 is introduced into the chamber where the pressure is reduced, and the heat treatment step is carried out under a nitrogen atmosphere. Then the introduction step of plasma (at least containing oxygen plasma) is performed, which is followed by the introduction of a deposition gas to form the protective insulating layer 107 which is an oxide insulating film.

In Embodiment 3, nitrous oxide ($N_2O$) and silane ($SiH_4$) are used for the gas containing an oxygen element and the deposition gas, respectively, to form the protective insulating layer 107 with a thickness of 300 nm.

Heat treatment of the oxide semiconductor layer 135 under a nitrogen atmosphere in the chamber where the pressure is reduced is preferably carried out at higher than or equal to 100° C. and lower than or equal to 500° C. (more preferably higher than or equal to 150° C. and lower than or equal to 400° C.).

Heat treatment of the oxide semiconductor layer 135 is performed from a step of heat treatment under a nitrogen atmosphere to a step of formation of the oxide insulating film. The temperature during the heat treatment is preferably higher than or equal to 100° C. and lower than or equal to 500° C. (more preferably higher than or equal to 150° C. and lower than or equal to 400° C.).

The pressure in the chamber when the protective insulating layer 107 is formed is preferably greater than or equal to 1 Pa and less than or equal to 300 Pa (greater than or equal to $7.5 \times 10^{-3}$ Torr and less than or equal to 2.25 Torr).

The exposed region of the oxide semiconductor layer 135, which is provided between the source and drain electrode layers 105a and 105b, and the oxide insulating film which is the protective insulating layer 107 are provided in contact with each other, so that electric resistance of the region in the oxide semiconductor layer 103, which is in contact with the protective insulating layer 107, is increased (decreased in the carrier concentration), and thus the oxide semiconductor layer 103 which includes a channel formation region with high electric resistance can be formed (see FIG. 7A).

Next, after the protective insulating layer 107 is formed, heat treatment may be carried out. The heat treatment may be performed at higher than or equal to 150° C. and lower than 350° C. under an atmospheric atmosphere or a nitrogen atmosphere. By the heat treatment, the oxide semiconductor layer 103 is heated in contact with the protective insulating layer 107, whereby the resistance of the oxide semiconductor layer 103 is further increased. Accordingly, electric characteristics of the thin film transistor can be improved and variation in electric characteristics of the thin film transistor can be reduced. There is no particular limitation on the timing of the heat treatment as long as it is performed after the protective insulating layer 107 is formed. By performing another heat treatment step such as heat treatment when a resin film is formed or heat treatment to reduce resistance of a transparent conductive film, the heat treatment can be removed, by which increase in the number of steps can be avoided.

Through the above steps, a thin film transistor 170 can be manufactured.

Next, a fourth photolithography process is performed to form a resist mask. The protective insulating layer 107 and the gate insulating layer 102 are etched to form a contact hole 125 that reaches the drain electrode layer 105b. In addition, a contact hole 127 reaching the second terminal 122 and a contact hole 126 reaching the first terminal 121 are also formed in the same etching step. FIG. 7B illustrates a cross-sectional view at this stage.

After the resist mask is removed, a transparent conductive film is formed. The transparent conductive film is formed using indium oxide ($In_2O_3$), an indium oxide-tin oxide alloy ($In_2O_3$—$SnO_2$, abbreviated as ITO), or the like by a sputtering method, a vacuum evaporation method, or the like. Such a material is etched with a hydrochloric acid-based solution. However, since a residue is easily left over the substrate particularly in etching ITO, indium oxide-zinc oxide alloy ($In_2O_3$—$ZnO$) may be used to improve etching processability. In the case where heat treatment to reduce resistance of the transparent conductive film is performed, it is possible to omit the above-mentioned heat treatment for improving electric characteristics of the thin film transistor and for reducing variation in electric characteristics of the thin film transistor by increase in resistance of the oxide semiconductor layer 103.

Next, a fifth photolithography process is performed to form a resist mask. Then, an unnecessary portion is etched away, so that a pixel electrode layer 110 is formed.

Through the fifth photolithography process, a storage capacitor is formed with the capacitor wiring 108 and the pixel electrode layer 110, in which the gate insulating layer 102 and the protective insulating layer 107 in the capacitor portion are used as a dielectric.

In addition, in the fifth photolithography process, the first terminal 121 and the second terminal 122 are covered with the resist mask, and transparent conductive films 128 and 129 are left in the terminal portions. The transparent conductive films 128 and 129 function as electrodes or wirings connected to an FPC. The transparent conductive film 128 formed over the first terminal 121 is a connecting terminal electrode serving as an input terminal of a gate wiring. The transparent conductive film 129 formed over the second terminal 122 is a connection terminal electrode which functions as an input terminal of the source wiring.

Then, the resist mask is removed, and a cross-sectional view at this stage is illustrated in FIG. 7C. Note that a plan view at this stage corresponds to FIG. 8.

FIGS. 9A1 and 9A2 are respectively a cross-sectional view and a plan view of a gate wiring terminal portion at this stage. FIG. 9A1 is a cross-sectional view along line E1-E2 of FIG. 9A2. In FIG. 9A1, a transparent conductive film 155 formed over a protective insulating film 154 is a connecting terminal electrode which functions as an input terminal. Furthermore, in a terminal portion of FIG. 9A1, a first terminal 151 formed using the same material as the material of the gate wiring and a connection electrode layer 153 formed using the same material as the material of the source wiring overlap each other with a gate insulating layer 152 interposed therebetween, and are electrically connected to each other through the transparent conductive film 155. Note that a portion where the transparent conductive film 128 and the first terminal 121 illustrated in FIG. 7C are in contact with each other corresponds to a portion where the transparent conductive film 155 and the first terminal 151 are in contact with each other in FIG. 9A1.

FIGS. 9B1 and 9B2 are a cross-sectional view and a plan view of a source wiring terminal portion which is different from that illustrated in FIG. 7C, respectively. The cross-sectional view of FIG. 9B1 is taken along line F1-F2 of FIG. 9B2. In FIG. 9B1, the transparent conductive film 155 formed over the protective insulating film 154 is a connection terminal electrode which functions as an input terminal. Furthermore, in FIG. 9B1, in the terminal portion, an electrode layer 156 formed from the same material as the gate wiring is located below and overlapped with a second terminal 150, which is electrically connected to the source wiring, with the gate insulating layer 152 interposed therebetween. The electrode layer 156 is not electrically connected to the second terminal 150, and a capacitor to prevent noise or static electricity can be formed if the potential of the electrode layer 156 is set to a potential different from that of the second terminal 150, such as floating, GND, or 0 V. The second terminal 150 is electrically connected to the transparent conductive film 155 with the protective insulating film 154 therebetween.

A plurality of gate wirings, source wirings, and capacitor wirings are provided depending on the pixel density. Also in the terminal portion, the first terminal at the same potential as the gate wiring, the second terminal at the same potential as the source wiring, the third terminal at the same potential as the capacitor wiring, and the like are each arranged in plurality. The number of each of the terminals may be any number, and the number of the terminals may be determined by a practitioner as appropriate.

Through these five photolithography steps, the storage capacitor and a pixel thin film transistor portion including the thin film transistor 170 of a bottom-gate staggered thin film transistor can be completed using the five photomasks. By disposing the thin film transistor and the storage capacitor in each pixel of a pixel portion in which pixels are arranged in a matrix form, one of substrates for manufacturing an active matrix display device can be obtained. In this specification, such a substrate is referred to as an active matrix substrate for convenience.

In the case of manufacturing an active matrix liquid crystal display device, the active matrix substrate and a counter substrate provided with a counter electrode are bonded to each other with a liquid crystal layer interposed therebetween.

Note that a common electrode electrically connected to the counter electrode on the counter substrate is provided over the active matrix substrate, and a fourth terminal electrically connected to the common electrode is provided in the terminal portion. The fourth terminal is provided so that the common electrode is set to a fixed potential such as GND or 0 V.

Alternatively, a pixel electrode may be overlapped with a gate wiring of an adjacent pixel with the protective insulating film and the gate insulating layer interposed therebetween to form a storage capacitor without a capacitor wiring.

In an active matrix liquid crystal display device, pixel electrodes arranged in a matrix form are driven to form a display pattern on a screen. Specifically, voltage is applied between a selected pixel electrode and the counter electrode corresponding to the pixel electrode, so that a liquid crystal layer provided between the pixel electrode and the counter electrode is optically modulated and this optical modulation is recognized as a display pattern by an observer.

In displaying moving images, a liquid crystal display device has a problem in that a long response time of liquid crystal molecules themselves causes afterimages or blurring of moving images. In order to improve the moving-image characteristics of a liquid crystal display device, a driving method called black insertion is employed in which black is displayed on the whole screen after every frame period.

Alternatively, a driving method called double-frame rate driving may be employed in which a vertical synchronizing frequency is 1.5 times or more, preferably 2 times or more as high as a usual vertical synchronizing frequency, whereby the response speed is increased, and the grayscale to be written is selected for a plurality of divided fields in each frame.

Further alternatively, in order to improve the moving-image characteristics of a liquid crystal display device, a driving method may be employed, in which a plurality of LEDs (light-emitting diodes) or a plurality of EL light sources are used to form a flat light source as a backlight, and each light source of the flat light source is independently driven to perform intermittent lighting in one frame period. As the flat light source, three or more kinds of LEDs may be used and an LED emitting white light may be used. Since a plurality of LEDs can be controlled independently, the light emission timing of LEDs can be synchronized with the timing at which a liquid crystal layer is optically modulated. According to this driving method, LEDs can be partly turned off; therefore, an effect of reducing power consumption can be obtained particularly in the case of displaying an image having a large part on which black is displayed.

By combining these driving methods, the display characteristics of a liquid crystal display device, such as moving-image characteristics, can be improved as compared to those of conventional liquid crystal display devices.

The thin film transistor disclosed in this specification includes an oxide semiconductor film which is used for a channel formation region and has excellent dynamic characteristics; thus, it can be combined with these driving methods.

In manufacturing a light-emitting display device, one electrode (also referred to as a cathode) of an organic light-emitting element is set to a low power supply potential such as GND or 0 V; thus, a terminal portion is provided with a fourth terminal for setting the cathode to a low power supply potential such as GND or 0 V. Also in manufacturing a light-emitting display device, a power supply line is provided in addition to a source wiring and a gate wiring. Accordingly, the terminal portion is provided with a fifth terminal electrically connected to the power supply line.

Further, in manufacturing a light-emitting display device, a partition is provided using an organic resin layer between organic light-emitting elements in some cases. In that case, the organic resin layer is subjected to heat treatment. Thus, it is possible to omit the heat treatment for improving electric characteristics of the transistor and for reducing variation in electric characteristics of the thin film transistor by increase in resistance of the oxide semiconductor layer 103.

The use of an oxide semiconductor for a thin film transistor leads to reduction in manufacturing cost. In particular, an oxide insulating film is formed in contact with an oxide semiconductor layer using the above method, whereby a thin film transistor having stable electric characteristics can be manufactured and provided. Therefore, a semiconductor device which includes highly reliable thin film transistors having excellent electric characteristics can be provided.

The channel formation region in the oxide semiconductor layer is a high-resistance region; thus, electric characteristics of the thin film transistor are stabilized and increase in off current can be prevented. Therefore, a semiconductor device including a highly reliable thin film transistor having excellent electric characteristics can be provided.

Embodiment 3 can be implemented in appropriate combination with the structure described in the other embodiments.

Embodiment 4

In Embodiment 4, as an embodiment of a method for manufacturing a semiconductor device, an example will be described in which an oxide semiconductor layer is subjected to heat treatment in advance before an oxide insulating film is formed. In Embodiment 4, the heat treatment is performed under a nitrogen atmosphere.

In this specification, heat treatment under a nitrogen atmosphere described in Embodiment 4, which is performed before the oxide insulating film is formed (before a substrate over which the oxide semiconductor layer is formed is introduced into a chamber in which the oxide insulating film is formed) is called heat treatment for dehydration and dehydrogenation. In this specification, dehydrogenation does not indicate elimination of $H_2$ by heat treatment. For convenience, elimination of H, OH, and the like is called dehydration and dehydrogenation.

The heat treatment step in Embodiment 4 may be performed before a step in which the oxide insulating layer is formed (the step described in Embodiment 1 with reference to FIG. 1, FIG. 2, and FIG. 3) and after the oxide semiconductor layer is formed. For example, in manufacturing a semiconductor device of Embodiment 2, the heat treatment may be performed between FIG. 4A and FIG. 4B before formation of the source and drain electrode layers 405a and 405b, or between FIG. 4B and FIG. 4C after formation of the source and drain electrode layers 405a and 405b. Alternatively, the heat treatment may be performed on the oxide semiconductor film which has not yet been processed into the island-like oxide semiconductor layer 430 as shown in FIG. 4A.

In Embodiment 4, heat treatment (heat treatment for dehydration and dehydrogenation) in which the purity of the oxide semiconductor film is increased and moisture or the like which is an impurity is reduced is carried out. In addition, not only impurities in the oxide semiconductor film but also impurities such as moisture in the gate insulating layer are reduced, and impurities such as moisture which exist at an interface between a film and the oxide semiconductor film which are provided over and below and in contact with each other are reduced.

In order to reduce impurities such as moisture, after the oxide semiconductor film is formed, heat treatment is performed in a state where the oxide semiconductor film is exposed, at 200° C. or higher, preferably higher than or equal to 400° C. and lower than or equal to 600° C. under an inert gas atmosphere of nitrogen or a rare gas (such as argon or helium) or under reduced pressure. Thus, moisture contained in the oxide semiconductor film is reduced. After the heat treatment, slow cooling is preferably performed to a temperature which is higher than or equal to room temperature and lower than 100° C. under an inert gas atmosphere.

Note that it is preferable that in the heat treatment for dehydration and dehydrogenation, water, hydrogen, or the like be not contained in nitrogen or a rare gas such as helium, neon, or argon. It is preferable that the purity of nitrogen or the rare gas such as helium, neon, or argon which is introduced into a heat treatment apparatus be set to be 6N (99.9999%) or higher, preferably 7N (99.99999%) or higher (that is, the impurity concentration is 1 ppm or lower, preferably 0.1 ppm or lower).

Further, as the heat treatment, a heating method using an electric furnace, a rapid heating method such as a gas rapid thermal anneal (GRTA) method using a heated gas or a lamp rapid thermal anneal (LRTA) method using lamp light, or the like can be used.

With use of an oxide semiconductor film in which moisture contained in the film is reduced by heat treatment under an inert gas atmosphere of nitrogen, argon, or the like or under reduced pressure, electric characteristics of a thin film transistor is improved and a thin film transistor provided with improved mass productivity and high performance is achieved.

Impurities ($H_2O$, H, OH, and the like) contained in the oxide semiconductor layer is reduced by heat treatment under an inert gas atmosphere and the carrier concentration is increased, and then slow cooling is performed. Then, the carrier concentration of the oxide semiconductor layer is reduced by formation of the oxide insulating film in contact with the oxide semiconductor layer or the like, which leads to improvement of reliability.

Electric resistance of the oxide semiconductor layer is reduced by heat treatment performed under a nitrogen atmosphere (that is, the carrier concentration is increased, preferably to $1\times10^{18}/cm^3$ or higher); thus, a low-resistance oxide semiconductor layer can be formed. After that, by formation of the oxide insulating film in contact with the low-resistance oxide semiconductor layer, increase in resistance of a region of the low-resistance oxide semiconductor layer, which is in contact with at least the oxide insulating film, is increased (that is, the carrier concentration is decreased, preferably to $1\times10^{18}/cm^3$ or lower, more preferable the carrier concentration of $1\times10^{14}/cm^3$ or lower); thus, a high-resistance oxide semiconductor region can be formed. During the process for manufacturing the semiconductor device in Embodiment 4, it is important to increase or decrease the carrier concentration of the oxide semiconductor layer by heating under an inert gas atmosphere (or under reduced pressure), slowly cooling, forming the oxide insulating film, and the like. The increase and decrease in the carrier concentration would originate from the heat treatment for dehydration and dehydrogenation which first changes the initially i-type oxide semiconductor layer to an oxygen-deficiency one, leading the oxide semiconductor layer to an n-type ($n^+$, $n^-$, or the like) one. The subsequent formation of the oxide insulating film would lead the oxide semiconductor layer to an oxygen-excess state, which allows it to be change to an i-type oxide semiconductor.

In this manner, over an oxide semiconductor layer which is subjected to heat treatment for dehydration and dehydrogenation under a nitrogen atmosphere, an oxide insulating film is formed by the method described in Embodiment 1, whereby a semiconductor device can be manufactured.

Accordingly, a semiconductor device including a highly reliable thin film transistor having excellent electric characteristics can be manufactured and provided.

Embodiment 5

In Embodiment 5, as an embodiment of a method for manufacturing a semiconductor device, an example is shown in which an oxide semiconductor layer is subjected to heat treatment in advance before an oxide insulating film is formed. In Embodiment 4, an example in which the heat treatment is carried out under a nitrogen atmosphere is described; however, in Embodiment 5, an example in which the heat treatment is carried out under an atmospheric atmosphere (air atmosphere) is described.

The heat treatment step in Embodiment 5 may be performed before a step in which the oxide insulating layer is formed (the step described in Embodiment 1 with reference to FIG. 1, FIG. 2, and FIG. 3) and after the oxide semiconductor layer is formed. For example, in the step of manufacturing a semiconductor device of Embodiment 2, the heat treatment may be performed between FIG. 4A and FIG. 4B before formation of the source and drain electrode layers 405a and 405b, or between FIG. 4B and FIG. 4C after formation of the source and drain electrode layers 405a and 405b. Alternatively, the heat treatment may be performed on the oxide semiconductor film which has not yet been processed into the island-like oxide semiconductor layer 430 as shown in FIG. 4A. The heat treatment is preferably performed at 200° C. to 600° C., typically 300° C. to 500° C. For example, the heat treatment is performed at 350° C. for 1 hour under an atmospheric atmosphere (air atmosphere).

In this manner, over an oxide semiconductor layer which is subjected to heat treatment under an atmospheric atmosphere (air atmosphere), an oxide insulating film is formed by the method described in Embodiment 1, whereby a semiconductor device can be manufactured.

Accordingly, a semiconductor device including a highly reliable thin film transistor having excellent electric characteristics can be manufactured and provided.

Embodiment 6

In Embodiment 6, an example will be described below in which a thin film transistor to be disposed in a pixel portion and at least part of a driver circuit are formed over one substrate.

The thin film transistor to be disposed in the pixel portion is formed according to any of Embodiments 1 to 5. Further, the thin film transistor described in any of Embodiments 1 to 5 is an n-channel TFT. Thus, part of a driver circuit that can be formed using n-channel TFTs among driver circuits is formed over the same substrate as that for the thin film transistor of the pixel portion.

Figure 20A:
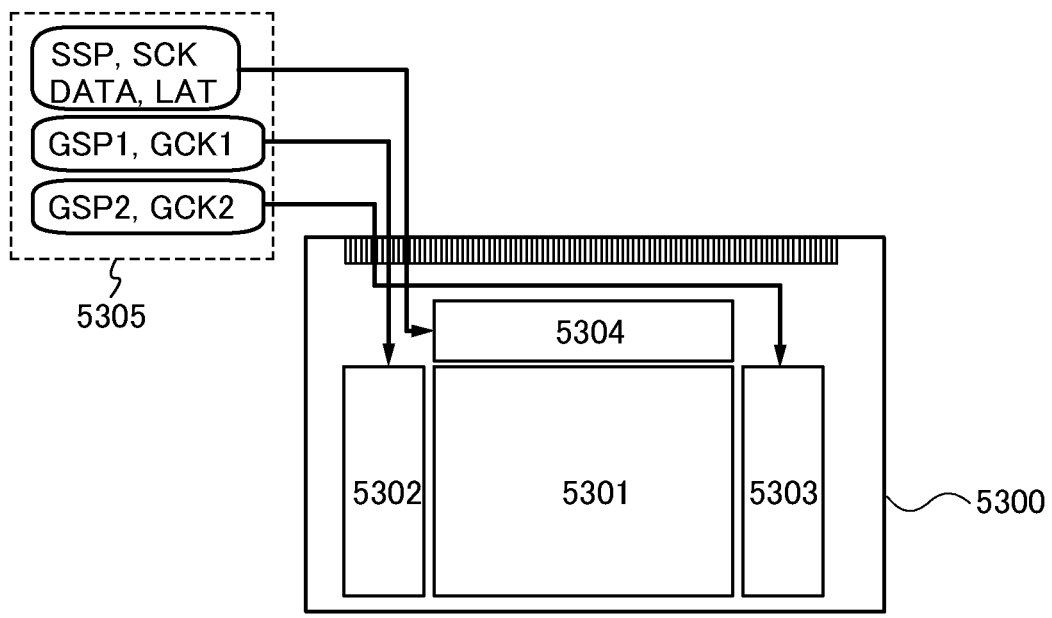
FIGS. 20A and 20B are block views each illustrating a semiconductor device.

FIG. 20A illustrates an example of a block view of an active matrix display device. Over a substrate 5300 in the display device, a pixel portion 5301, a first scan line driver circuit 5302, a second scan line driver circuit 5303, and a signal line driver circuit 5304 are provided. In the pixel portion 5301, a plurality of signal lines which are extended from the signal line driver circuit 5304 are provided and a plurality of scan lines which are extended from the first scan line driver circuit 5302 and the second scan line driver circuit 5303 are provided. Note that pixels which include display elements are provided in a matrix in respective regions where the scan lines and the signal lines intersect with each other. Further, the substrate 5300 in the display device is connected to a timing control circuit 5305 (also referred to as a controller or a controller IC) through a connection portion such as a Flexible Printed Circuit (FPC).

In FIG. 20A, the first scan line driver circuit 5302, the second scan line driver circuit 5303, and the signal line driver circuit 5304 are provided over the same substrate 5300 as the pixel portion 5301. Accordingly, the number of components of a drive circuit which is provided outside and the like are reduced, so that reduction in cost can be achieved. In addition, in the case where a driver circuit is provided outside the substrate 5300, the number of the connections in the connection portion can be reduced by extending wirings, whereby improvement in reliability and increase in yield can be achieved.

Note that as an example, the timing control circuit 5305 supplies a first scan line driver circuit start signal (GSP1) and a scan line driver circuit clock signal (GCK1) to the first scan line driver circuit 5302. The timing control circuit 5305 supplies, for example, a second scan line driver circuit start signal (GSP2) (also referred to as a start pulse) and a scan line driver circuit clock signal (GCK2) to the second scan line driver circuit 5303. The timing control circuit 5305 supplies a signal line driver circuit start signal (SSP), a signal line driver circuit clock signal (SCK), video signal data (DATA) (also simply referred to as a video signal) and a latch signal (LAT) to the signal line driver circuit 5304. Note that each clock signal may be a plurality of clock signals whose periods are different or may be supplied together with an inverted clock signal (CKB). Note that one of the first scan line driver circuit 5302 and the second scan line driver circuit 5303 can be omitted.

Figure 20B:
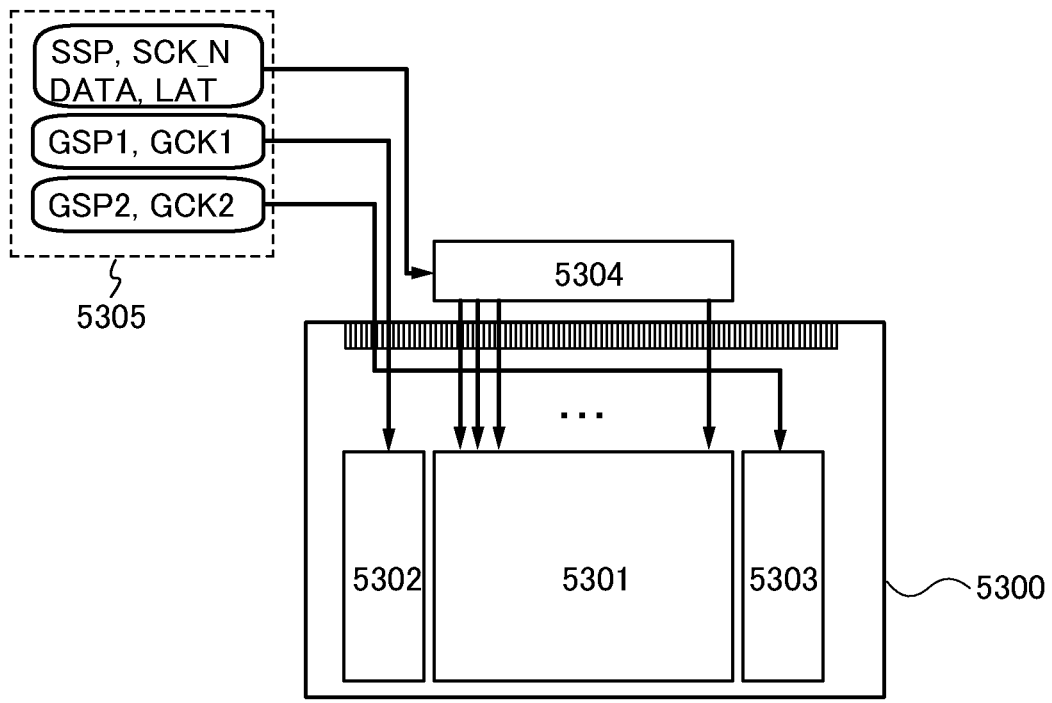

FIG. 20B shows a structure in which circuits with low driving frequency (e.g., the first scan line driver circuit 5302 and the second scan line driver circuit 5303) are formed over the same substrate 5300 as the pixel portion 5301, and the signal line driver circuit 5304 is formed over a substrate which is different from the substrate 5300 over which the pixel portion 5301 is formed. With this structure, a driver circuit formed over the substrate 5300 can be constituted by using thin film transistors with lower field-effect mobility as compared to that of a transistor formed using a single crystal semiconductor. Accordingly, increase in the size of the display device, reduction in the number of steps, reduction in cost, improvement in yield, and the like can be achieved.

Figure 21A:
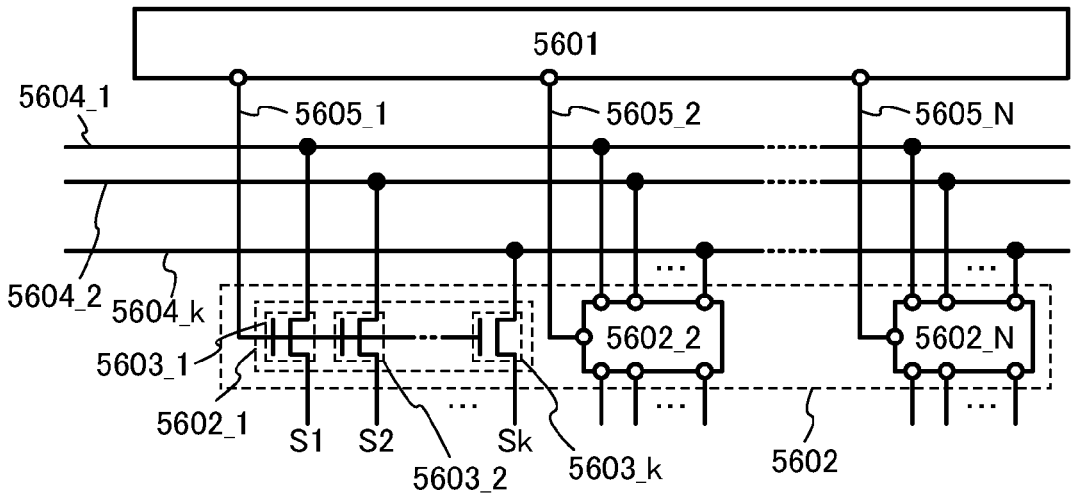
FIGS. 21A and 21B are a circuit view and a timing chart illustrating a configuration of a signal line driver circuit.
Figure 21B:
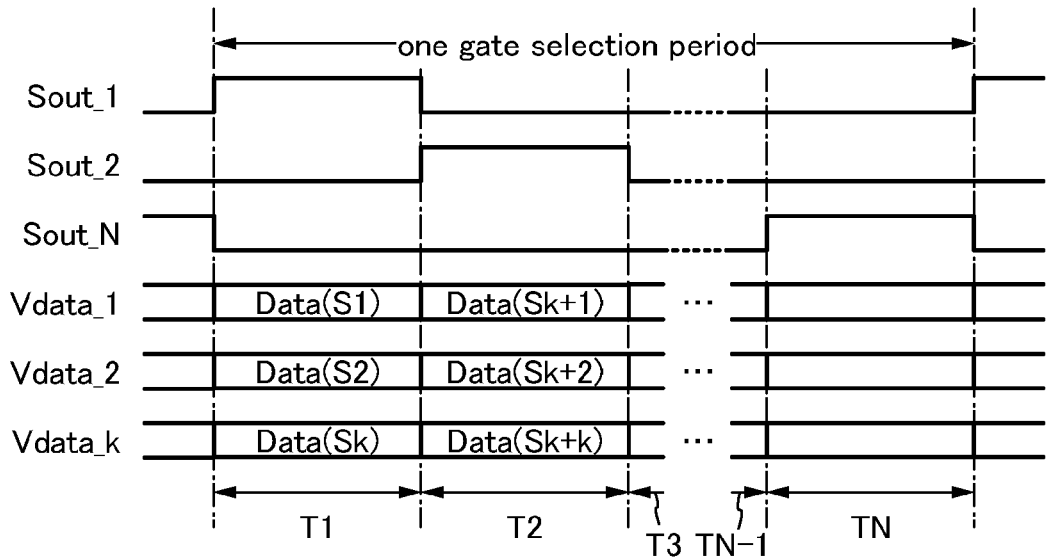

The thin film transistor described in any of Embodiments 1 to 5 is an n-channel TFT. In FIGS. 21A and 21B, an example of a structure and operation of a signal line driver circuit which is formed using the n-channel TFT is described as an example.

The signal line driver circuit includes a shift register 5601 and a switching circuit 5602. The switching circuit 5602 includes a plurality of switching circuits 5602_1 to 5602_N(N is a natural number). The switching circuits 5602_1 to 5602_N each include a plurality of thin film transistors 5603_1 to 5603_k (k is a natural number). An example in which the thin film transistors 5603_1 to 5603_k are n-channel TFTs will be described.

A connection relation of the signal line driver circuit will be described by using the switching circuit 5602_1 as an example. First terminals of the thin film transistors 5603_1 to 5603_k are connected to wirings 5604_1 to 5604_k, respectively. Second terminals of the thin film transistors 5603_1 to 5603_k are connected to signal lines S1 to Sk, respectively. Gates of the thin film transistors 5603_1 to 5603_k are connected to a wiring 5605_1.

The shift register 5601 has a function of outputting an H level signal (also referred to as an H signal or a high power supply potential level) to the wirings 5605_1 to 5605_N in order and selecting the switching circuits 5602_1 to 5602_N in order.

The switching circuit 5602_1 has a function of controlling electrical continuity between the wirings 5604_1 to 5604_k and the signal lines S1 to Sk (electrical continuity between the first terminal and the second terminal), namely a function of controlling whether or not to supply potentials of the wirings 5604_1 to 5604_k to the signal lines S1 to Sk. As thus described, the switching circuit 5602_1 functions as a selector. Further, the thin film transistors 5603_1 to 5603_k each have a function of controlling electrical continuity between the wirings 5604_1 to 5604_k and the signal lines S1 to Sk, namely a function of controlling whether or not to supply the potentials of the wirings 5604_1 to 5604_k to the signal lines S1 to Sk. In this manner, each of the thin film transistors 5603_1 to 5603_k functions as a switch.

Note that video signal data (DATA) is inputted to each of the wirings 5604_1 to 5604_k. The video signal data (DATA) is an analog signal corresponding to image data or image signals in many cases.

Next, operation of the signal line driver circuit in FIG. 21A will be described with reference to a timing chart in FIG. 21B. In FIG. 21B, an example of signals Sout_1 to Sout_N and signals Vdata_1 to Vdata_k is shown. The signals Sout_1 to Sout_N are examples of output signals of the shift register 5601, and the signals Vdata_1 to Vdata_k are examples of signals which are input to the wirings 5604_1 to 5604_k. Note that one operation period of the signal line driver circuit corresponds to one gate selection period in a display device. For example, one gate selection period is divided into periods T1 to TN. The periods T1 to TN are periods for writing video signal data (DATA) to the pixels which belong to a selected row.

In the periods T1 to TN, the shift register 5601 sequentially outputs H level signals to the wirings 5605_1 to 5605_N. For example, in the period T1, the shift register 5601 outputs an H level signal to the wiring 5605_1. Then, the thin film transistors 5603_1 to 5603_k are turned on, so that the wirings 5604_1 to 5604_k and the signal lines S1 to Sk have electrical continuity. In this case, Data (S1) to Data (Sk) are input to the wirings 5604_1 to 5604_k, respectively. The Data (S1) to Data (Sk) are input to pixels in a selected row in a first to k-th columns through the thin film transistors 5603_1 to 5603_k, respectively. Thus, in the periods T1 to TN, video signal data (DATA) is sequentially written to the pixels in the selected row of every k columns.

By writing video signal data (DATA) to pixels of every plurality of columns, the number of video signal data (DATA) or the number of wirings can be reduced. Thus, connections to an external circuit can be reduced. By writing video signals to pixels of every plurality of columns, writing time can be extended and insufficient of writing of video signals can be prevented.

Note that as the shift register 5601 and the switching circuit 5602, a circuit including the thin film transistor described in any of Embodiments 1 to 5 can be used.

An embodiment of a shift register which is used for part of a scan line driver circuit and/or a signal line driver circuit will be described with reference to FIGS. 22A to 22C and FIGS. 23A and 23B.

The scan line driver circuit includes a shift register. The scan line driver circuit may also include a level shifter, a buffer, or the like in some cases. In the scan line driver circuit, when the clock signal (CLK) and the start pulse signal (SP)

are input to the shift register, a selection signal is generated. The generated selection signal is buffered and amplified by the buffer, and the resulting signal is supplied to a corresponding scan line. Gate electrodes of transistors in pixels of one line are connected to the scan line. Since the transistors in the pixels of one line must be turned on all at once, a buffer which can supply a large current is used.

Figure 22A:
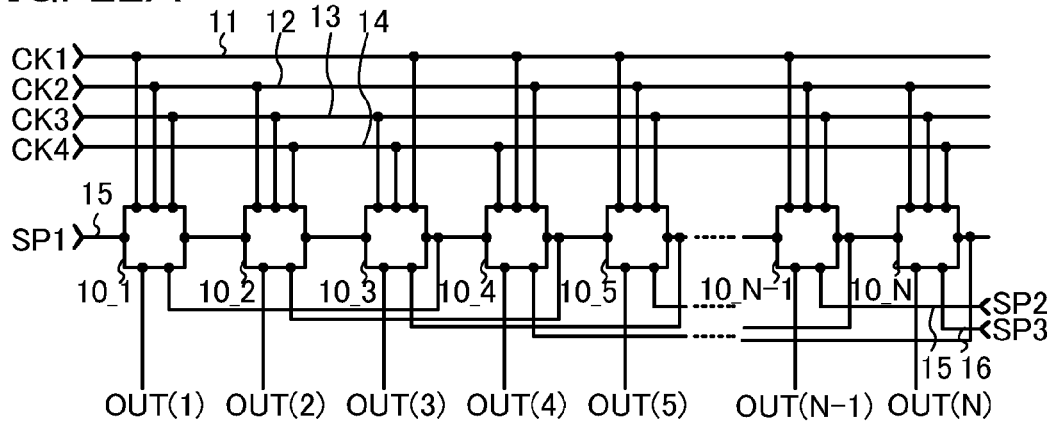
FIGS. 22A to 22C are circuit views each illustrating a configuration of a shift register.

The shift register includes first to N-th pulse output circuits 10_1 to 10_N(N is a natural number of 3 or more) (see FIG. 22A). A first clock signal CK1 from a first wiring 11, a second clock signal CK2 from a second wiring 12, a third clock signal CK3 from a third wiring 13, and a fourth clock signal CK4 from a fourth wiring 14 are supplied to the first to N-th pulse output circuits 10_1 to 10_N of the shift register shown in FIG. 22A. A start pulse SP1 (a first start pulse) from a fifth wiring 15 is input to the first pulse output circuit 10_1. A signal from a pulse output circuit in the previous stage 10_(n−1) (n is a natural number of more or equal to 2 and lower than or equal to N) is input to the n-th pulse output circuit in the second stage or its subsequent stages 10_n. A signal from the third pulse output circuit 10_3 which is two stages after the first pulse output circuit 10_1 is input to the first pulse output circuit 10_1. In a similar way, a signal from the (n+2)-th pulse output circuit 10_(n+2) which is two stages after the n-th pulse output circuit 10_n (referred to as the next stage signal OUT(n+2)) is input to the n-th pulse output circuit in the second stage or its subsequent stages. Therefore, a first output signal (OUT(1)(SR) to OUT(N)(SR)) is output from the n-th pulse output circuit to the next stage pulse output circuit ((n+1)-th pulse output circuit) and/or to the two stages before the n-th pulse output circuit ((n−2)-th pulse output circuit), and a second output signal (OUT(1) to OUT(N)) is output from the n-th pulse output circuit to another circuit or the like. Note that as shown in FIG. 22A, the next stage signal OUT(n+2) is not input to last two stages of the shift registers; therefore, as an example, a second start pulse SP2 and a third start pulse SP3 may be separately input to the last two stages of the shift registers.

Note that a clock signal (CK) is a signal which oscillates between an H level and an L level (referred to as an L signal or a low power supply potential level) at a constant cycle. The first to the fourth clock signals (CK1) to (CK4) are delayed by ¼ period sequentially. In Embodiment 6, by using the first to fourth clock signals (CK1) to (CK4), driving of a pulse output circuit is controlled. Note that the clock signal is also called GCK or SCK in accordance with an driver circuit to which the clock signal is input; however, description is made using CK as the clock signal.

A first input terminal 21, a second input terminal 22, and a third input terminal 23 are electrically connected to any of the first to fourth wirings 11 to 14. For example, in FIG. 22A, the first input terminal 21 of the first pulse output circuit 10_1 is electrically connected to the first wiring 11, the second input terminal 22 of the first pulse output circuit 10_1 is electrically connected to the second wiring 12, and the third input terminal 23 of the first pulse output circuit 10_1 is electrically connected to the third wiring 13. Similarly, the first input terminal 21 of the second pulse output circuit 10_2 is electrically connected to the second wiring 12, the second input terminal 22 of the second pulse output circuit 10_2 is electrically connected to the third wiring 13, and the third input terminal 23 of the second pulse output circuit 10_2 is electrically connected to the fourth wiring 14.

Figure 22B:
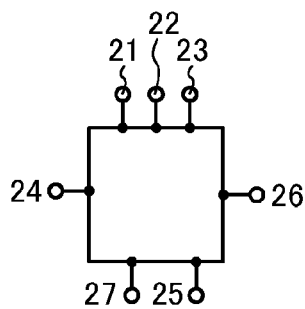

Each of the first to N-th pulse output circuits 10_1 to 10_N includes a first input terminal 21, a second input terminal 22, a third input terminal 23, a fourth input terminal 24, a fifth input terminal 25, a first output terminal 26, and a second output terminal 27 (see FIG. 22B). In the first pulse output circuit 10_1, the first clock signal CK1 is input to the first input terminal 21; the second clock signal CK2 is input to the second input terminal 22; the third clock signal CK3 is input to the third input terminal 23; the start pulse is input to the fourth input terminal 24; the next stage signal OUT (3) is input to the fifth input terminal 25; the first output signal OUT (1) (SR) is output from the first output terminal 26; and the second output signal OUT (1) is output from the second output terminal 27.

Next, an example of a specific circuit structure of the pulse output circuit which is shown in FIG. 22B will be described with reference to FIG. 22C.

Figure 22C:
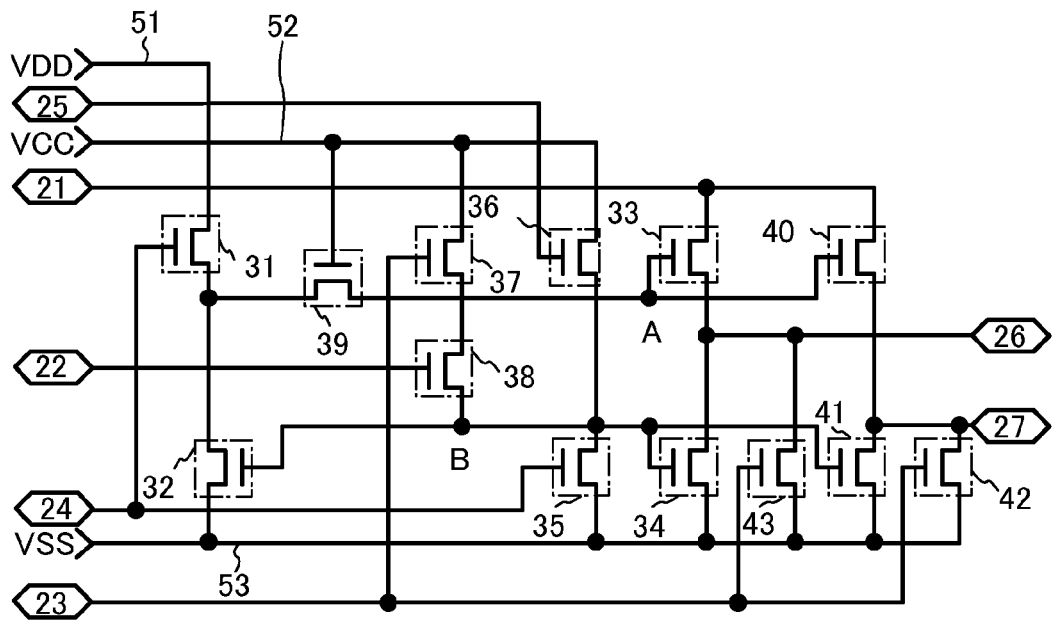

The pulse output circuit which is shown in FIG. 22C includes a first to thirteenth transistors 31 to 43. Signals or power supply potentials are supplied to the first to thirteenth transistors 31 to 43 from a power supply line 51 to which a first power supply potential VDD is supplied, a power supply line 52 to which a second power supply potential VCC is supplied, and a power supply line 53 to which a third power supply potential VSS is supplied, in addition to the above-described first to fifth input terminals 21 to 25 and the first and second output terminals 26 and 27. Here, a magnitude relation of the power supply potential of each power supply line in FIG. 22C is as follows: the first power supply potential VDD is higher than the second power supply potential VCC, and the second power supply potential VCC is higher than the third power supply potential VSS. Although the first to fourth clock signals (CK1) to (CK4) are signals which alternate between the H level signal and the L level signal at a constant cycle, their potential is adjusted to VDD when the clock signal is at the H level, and adjusted to VSS when the clock signal is at the L level. Note that when the potential VDD of the power supply line 51 is set to be higher than the potential VCC of the power supply line 52, a potential applied to the gate electrode of the transistor can be reduced without adversely affecting the operation; thus, the shift of the threshold value of the transistor can be reduced and deterioration can be suppressed.

In FIG. 22C, a first terminal of the first transistor 31 is electrically connected to the power supply line 51, a second terminal of the first transistor 31 is electrically connected to a first terminal of the ninth transistor 39, and a gate electrode of the first transistor 31 is electrically connected to a fourth input terminal 24. A first terminal of the second transistor 32 is electrically connected to the power supply line 53, a second terminal of the second transistor 32 is electrically connected to the first terminal of the ninth transistor 39, and a gate electrode of the second transistor 32 is electrically connected to a gate electrode of the fourth transistor 34. A first terminal of the third transistor 33 is electrically connected to the first input terminal 21, and a second terminal of the third transistor 33 is electrically connected to the first output terminal 26. A first terminal of the fourth transistor 34 is electrically connected to the power supply line 53, and a second terminal of the fourth transistor 34 is electrically connected to the first output terminal 26. A first terminal of the fifth transistor 35 is electrically connected to the power supply line 53, a second terminal of the fifth transistor 35 is electrically connected to the gate electrode of the second transistor 32 and the gate electrode of the fourth transistor 34, and a gate electrode of the fifth transistor 35 is electrically connected to the fourth input terminal 24. A first terminal of the sixth transistor 36 is electrically connected to the power supply line 52, a second terminal of the sixth transistor 36 is electrically connected to the gate electrode of the second transistor 32 and the gate electrode of the fourth transistor 34, and a gate electrode of the sixth transistor 36 is electrically connected to the fifth input terminal 25. A first terminal of the seventh transistor 37 is electrically connected to the power supply line 52, a second terminal of the seventh transistor 37 is electrically connected to a second terminal of the eighth transistor 38, and a gate electrode of the seventh transistor 37 is electrically connected to the third input terminal 23. A first terminal of the eighth transistor 38 is electrically connected to the gate electrode of the second transistor 32 and the gate electrode of the fourth transistor 34, and a gate electrode of the eighth transistor 38 is electrically connected to the second input terminal 22. The first terminal of the ninth transistor 39 is electrically connected to the second terminal of the first transistor 31 and the second terminal of the second transistor 32, a second terminal of the ninth transistor 39 is electrically connected to a gate electrode of the third transistor 33 and a gate electrode of the tenth transistor 40, and a gate electrode of the ninth transistor 39 is electrically connected to the power supply line 52. A first terminal of the tenth transistor 40 is electrically connected to the first input terminal 21, a second terminal of the tenth transistor 40 is electrically connected to the second output terminal 27, and the gate electrode of the tenth transistor 40 is electrically connected to the second terminal of the ninth transistor 39. A first terminal of the eleventh transistor 41 is electrically connected to the power supply line 53, a second terminal of the eleventh transistor 41 is electrically connected to the second output terminal 27, and the gate electrode of the eleventh transistor 41 is electrically connected to the gate electrode of the second transistor 32 and the gate electrode of the fourth transistor 34. A first terminal of the twelfth transistor 42 is electrically connected to the power supply line 53, a second terminal of the twelfth transistor 42 is electrically connected to the second output terminal 27, and a gate electrode of the twelfth transistor 42 is electrically connected to the gate electrode of the seventh transistor 37. A first terminal of the thirteenth transistor 43 is electrically connected to the power supply line 53, a second terminal of the thirteenth transistor 43 is electrically connected to the first output terminal 26, and a gate electrode of the thirteenth transistor 43 is electrically connected to the gate electrode of the seventh transistor 37.

In FIG. 22C, a connection point of the gate electrode of the third transistor 33, the gate electrode of the tenth transistor 40, and the second terminal of the ninth transistor 39 is referred to as a node A. In addition, a connection point of the gate electrode of the second transistor 32, the gate electrode of the fourth transistor 34, the second terminal of the fifth transistor 35, the second terminal of the sixth transistor 36, the first terminal of the eighth transistor 38, and the gate electrode of the eleventh transistor 41 is referred to as a node B.

Figure 23A:
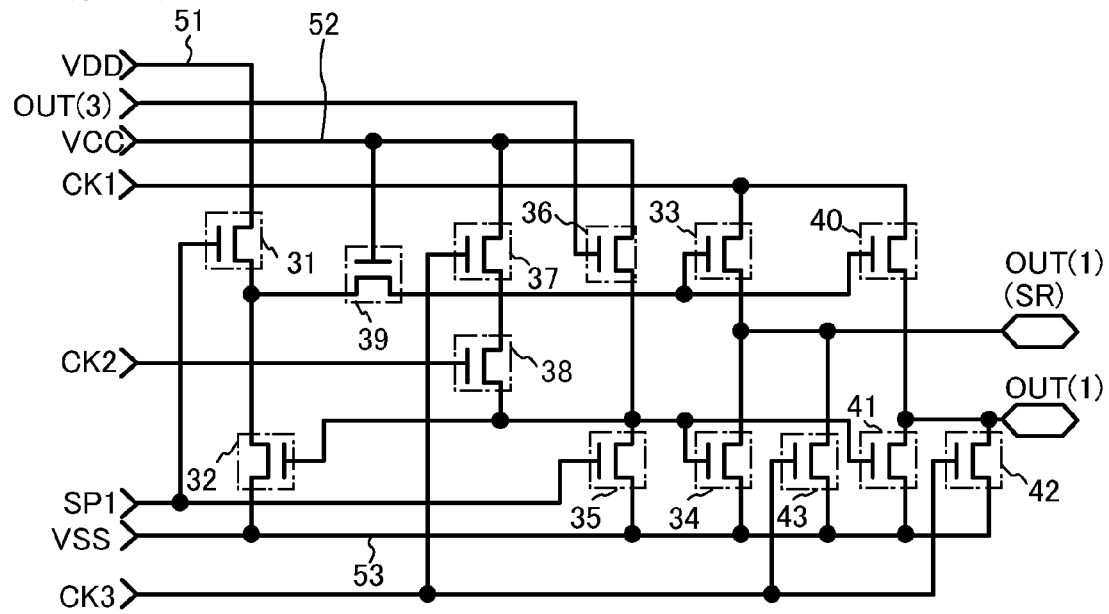
FIGS. 23A and 23B are a circuit view and a timing chart illustrating operations of the shift register.

FIG. 23A shows signals which are input to or output from the first input terminal 21 to the fifth input terminal 25, the first output terminal 26, and the second output terminal 27 when the pulse output circuit described in FIG. 22C is applied to the first pulse output circuit 10_1.

Specifically, the first clock signal CK1 is input to the first input terminal 21; the second clock signal CK2 is input to the second input terminal 22; the third clock signal CK3 is input to the third input terminal 23; the start pulse SP1 is input to the fourth input terminal 24; the next stage signal OUT (3) is input to the fifth input terminal 25; the first output signal OUT (1) (SR) is output from the first output terminal 26; and the second output signal OUT (1) is output from the second output terminal 27.

Note that a thin film transistor is an element having at least three terminals of a gate, a drain, and a source. The thin film transistor has a semiconductor in which a channel region is formed in a region overlapped with the gate, and current which flows between the drain and the source through the channel region can be controlled by controlling the potential of the gate. Here, since the source and the drain of the thin film transistor may interchange depending on the structure, the operating condition, and the like of the thin film transistor, it is difficult to define which is a source or a drain. Therefore, a region functioning as a source and a drain is not called the source or the drain in some cases. In such a case, for example, one of the source and the drain may be referred to as a first terminal and the other thereof may be referred to as a second terminal.

Figure 23B:
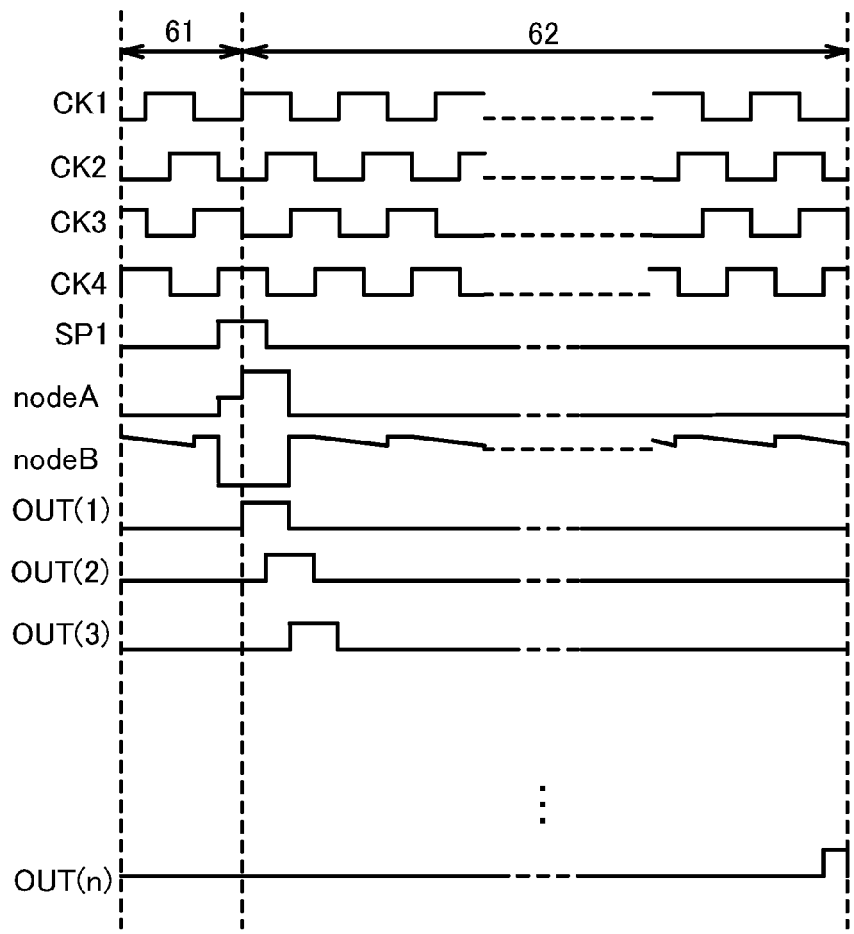

Here, FIG. 23B shows a timing chart of the shift register including the plurality of pulse output circuits shown in FIG. 23A. Note that when the shift register is a scan line driver circuit, a period 61 and a period 62 in FIG. 23B correspond to a vertical retrace period and a gate selection period, respectively.

Note that as shown in FIG. 23A, by providing of the ninth transistor 39 whose gate is supplied with the second power supply potential VCC, advantages described below are obtained before and after a bootstrap operation.

Without the ninth transistor 39 whose gate is supplied with the second power supply potential VCC, if the potential of the node A is raised by the bootstrap operation, the potential of a source which is the second terminal of the first transistor 31 increases to a value higher than the first power supply potential VDD. Then, the first terminal of the first transistor 31, namely the power supply line 51, becomes to serve as the source thereof. Therefore, in the first transistor 31, a large bias voltage is applied and thus significant stress is applied between the gate and the source and between the gate and the drain, which can cause deterioration in the transistor. By providing of the ninth transistor 39 whose gate is supplied the second power supply potential VCC, the potential of the node A is raised by the bootstrap operation, but at the same time, an increase in the potential of the second terminal of the first transistor 31 can be prevented. In other words, by providing of the ninth transistor 39, a negative bias voltage applied between the gate and the source of the first transistor 31 can be reduced. Accordingly, with a circuit structure in Embodiment 6, a negative bias voltage applied between the gate and the source of the first transistor 31 can be reduced, so that deterioration in the first transistor 31, which is due to stress, can further be restrained.

Note that the ninth transistor 39 is provided so as to be connected between the second terminal of the first transistor 31 and the gate of the third transistor 33 through the first terminal and the second terminal thereof. When the shift register including a plurality of the pulse output circuits shown in Embodiment 6 is used, in a signal line driver circuit having more stages than a scan line driver circuit, the ninth transistor 39 may be omitted and the number of transistors can be reduced.

When an oxide semiconductor is used for semiconductor layers of the first transistor 31 to the thirteenth transistor 43, off-current of the thin film transistor can be reduced, on-current and field effect mobility can be increased, and the degree of deterioration can be decreased; thus malfunction in a circuit can be reduced. The degree of deterioration of the transistor formed using an oxide semiconductor, which is caused by application of a high potential to the gate electrode, is small in comparison with that of the transistor formed using amorphous silicon. Therefore, even when the first power supply potential VDD is supplied to a power supply line to which the second power supply potential VCC is supplied, a similar operation can be performed, and the number of power supply lines which are provided in a circuit can be reduced, so that the circuit can be miniaturized.

Note that even if a wiring connection is changed so that the clock signal which is supplied to the gate electrode of the seventh transistor 37 through the third input terminal 23 and the clock signal which is supplied to the gate electrode of the eighth transistor 38 through the second input terminal 22 are the clock signal which is supplied to the gate electrode of the seventh transistor 37 through the second input terminal 22 and the clock signal which is supplied to the gate electrode of the eighth transistor 38 through the third input terminal 23, respectively, similar operation effect can be obtained. Note that in the shift register shown in FIG. 23A, after the seventh transistor 37 and the eighth transistor 38 are both turned on, the seventh transistor 37 is turned off and the eighth transistor 38 is still on, and then the seventh transistor 37 is still off and the eighth transistor 38 is turned off. Therefore, a decrease in the potential of the node B, which is caused by a decrease in the potentials of the second input terminal 22 and the third input terminal 23, occurs twice because of a decrease in the potential of the gate electrode of the seventh transistor 37 and a decrease in the potential of the gate electrode of the eighth transistor 38. On the other hand, in the shift register shown in FIG. 23A, the number of decreases in the potential of the node B, which is caused by a decrease in the potential of the second input terminal 22 and the third input terminal 23, can be reduced to one time which takes place when the potential of the gate electrode of the eighth transistor 38 is decreased. The number of decreases in the potential of the node B can be decreased by the following manner: as demonstrated in the period 62 of FIG. 23B, after the seventh transistor 37 and the eighth transistor 38 are both turned on, the seventh transistor 37 is still on and the eighth transistor 38 is turned off, and then the seventh transistor 37 is turned off and the eighth transistor 38 is still off. Therefore, with use of the clock signal which is supplied to the gate electrode of the seventh transistor 37 through the third input terminal 23 and the clock signal which is supplied to the gate electrode of the eighth transistor 38 through the second input terminal 22, variation in the potential of the node B is reduced; thus, noise can be reduced, which is preferable.

In this way, in a period during which the potentials of the first output terminal 26 and the second output terminal 27 are held at the L level, the H level signal is regularly supplied to the node B; therefore, malfunction of a pulse output circuit can be suppressed.

Embodiment 7

When a thin film transistor is manufactured and used for a pixel portion and further for a driver circuit, a semiconductor device having a display function (also referred to as a display device) can be manufactured. Furthermore, when part or whole of a driver circuit using a thin film transistor is formed over the same substrate as a pixel portion, a system-on-panel can be obtained.

The display device includes a display element. As the display element, a liquid crystal element (also referred to as a liquid crystal display element) or a light-emitting element (also referred to as a light-emitting display element) can be used. Light-emitting elements include, in its category, an element whose luminance is controlled by current or voltage, and specifically include an inorganic electroluminescent (EL) element, an organic EL element, and the like. Furthermore, a display medium whose contrast is changed by an electric action, such as electronic ink, can be used.

The display device includes a panel in which the display element is sealed, and a module in which an IC or the like including a controller is mounted on the panel. The display device also relates to an element substrate, which corresponds to one mode before the display element is completed in a manufacturing process of the display device, and the element substrate is provided with means for supplying current to the display element in each of a plurality of pixels. Specifically, the element substrate may be in a state after only a pixel electrode (pixel electrode layer) of the display element is formed, a state after a conductive film to be a pixel electrode is formed and before the conductive film is etched to form the pixel electrode, or any of other states.

Note that a display device in this specification means an image display device, a display device, or a light source (including a lighting device). Furthermore, the display device also includes the following modules in its category: a module to which a connector such as a flexible printed circuit (FPC), a tape automated bonding (TAB) tape, or a tape carrier package (TCP) is attached; a module having a TAB tape or a TCP at the tip of which a printed wiring board is provided; and a module in which an integrated circuit (IC) is directly mounted on a display element by a chip on glass (COG) method.

The appearance and a cross section of a liquid crystal display panel, which is an embodiment of a semiconductor device, will be described with reference to FIGS. 16A1, 16A2 and 16B. FIGS. 16A1 and 16A2 are each a plan view of a panel in which highly reliable thin film transistors 4010 and 4011 each including an oxide semiconductor layer formed over a first substrate 4001 which is described in Embodiment 3, and a liquid crystal element 4013 are sealed between the first substrate 4001 and a second substrate 4006 with a sealant 4005. FIG. 16B is a cross-sectional view taken along line M-N of FIGS. 16A1 and 16A2.

The sealant 4005 is provided to surround a pixel portion 4002 and a scan line driver circuit 4004 that are provided over the first substrate 4001. The second substrate 4006 is provided over the pixel portion 4002 and the scan line driver circuit 4004. Therefore, the pixel portion 4002 and the scan line driver circuit 4004 are sealed together with a liquid crystal layer 4008, by the first substrate 4001, the sealant 4005, and the second substrate 4006. A signal line driver circuit 4003 that is formed using a single crystal semiconductor film or a polycrystalline semiconductor film over a substrate separately prepared is mounted in a region different from the region surrounded by the sealant 4005 over the first substrate 4001.

Note that there is no particular limitation on the connection method of a driver circuit which is separately formed, and a COG method, a wire bonding method, a TAB method, or the like can be used. FIG. 16A1 illustrates an example of mounting the signal line driver circuit 4003 by a COG method, and FIG. 16A2 illustrates an example of mounting the signal line driver circuit 4003 by a TAB method.

The pixel portion 4002 and the scan line driver circuit 4004 provided over the first substrate 4001 each include a plurality of thin film transistors. FIG. 16B illustrates the thin film transistor 4010 included in the pixel portion 4002 and the thin film transistor 4011 included in the scan line driver circuit 4004. Protective insulating layers 4020 and 4021 are provided over the thin film transistors 4010 and 4011.

As the thin film transistors 4010 and 4011, the thin film transistor including an oxide semiconductor layer which is described in Embodiment 3 can be employed. Alternatively, the thin film transistor described in Embodiment 1 or Embodiment 2 may be employed. In Embodiment 7, the thin film transistors 4010 and 4011 are n-channel thin film transistors.

A pixel electrode layer 4030 included in the liquid crystal element 4013 is electrically connected to the thin film transistor 4010. A counter electrode layer 4031 of the liquid crystal element 4013 is formed on the second substrate 4006. A portion where the pixel electrode layer 4030, the counter electrode layer 4031, and the liquid crystal layer 4008 overlap with one another corresponds to the liquid crystal element 4013. Note that the pixel electrode layer 4030 and the counter electrode layer 4031 are provided with an insulating layer 4032 and an insulating layer 4033, respectively, each of which functions as an alignment film. The liquid crystal layer 4008 is sandwiched between the pixel electrode layer 4030 and the counter electrode layer 4031 with the insulating layers 4032 and 4033 interposed therebetween.

Note that the first substrate 4001 and the second substrate 4006 can be made of glass, metal (typically, stainless steel), ceramic, or plastic. As plastic, a fiberglass-reinforced plastics (FRP) plate, a poly(vinyl fluoride) (PVF) film, a polyester film, or an acrylic resin film can be used. Alternatively, a sheet with a structure in which an aluminum foil is sandwiched between PVF films or polyester films can be used.

A columnar spacer 4035 is obtained by selective etching of an insulating film and is provided in order to control the distance (a cell gap) between the pixel electrode layer 4030 and the counter electrode layer 4031. Note that a spherical spacer may be used. The counter electrode layer 4031 is electrically connected to a common potential line provided over the same substrate as the thin film transistor 4010. With the use of the common connection portion, the counter electrode layer 4031 can be electrically connected to the common potential line through conductive particles provided between the pair of substrates. Note that the conductive particles are contained in the sealant 4005.

Alternatively, a liquid crystal showing a blue phase for which an alignment film is unnecessary may be used. A blue phase is one of the liquid crystal phases, which is generated just before a cholesteric phase changes into an isotropic phase while temperature of cholesteric liquid crystal is increased. Since the blue phase is generated within a relatively narrow range of temperatures, a liquid crystal composition containing a chiral agent at 5 wt % or more may be used for the liquid crystal layer 4008 in order to increase the temperature range. The liquid crystal composition which includes a liquid crystal showing a blue phase and a chiral agent has a small response time of 1 msec or less, has optical isotropy, which makes the alignment process unneeded, and has a small viewing angle dependence.

An embodiment of the present invention can also be applied to a reflective liquid crystal display device or a transflective liquid crystal display device, in addition to a transmissive liquid crystal display device.

An example of the liquid crystal display device will be described in which a polarizing plate is provided on the outer surface of the substrate (on the viewer side) and a coloring layer (color filter) and an electrode layer used for a display element are provided on the inner surface of the substrate in this order; however, the polarizing plate may be provided on the inner surface of the substrate. The stack structure of the polarizing plate and the coloring layer is not limited to that described in Embodiment 7 and may be set as appropriate depending on materials of the polarizing plate and the coloring layer or conditions of manufacturing steps. Furthermore, a light-blocking film serving as a black matrix may be provided.

Over the thin film transistors 4010 and 4011, the insulating layer 4020, as a protective insulating film, is formed in contact with the oxide semiconductor layer including a channel formation region. The insulating layer 4020 is formed using a material and a method similar to those of the oxide insulating film 407 shown in Embodiment 1. In order to reduce the surface roughness of the thin film transistor, the thin film transistors are covered with the insulating layer 4021 serving as a planarizing insulating film.

Here, the insulating layer 4020 having a stack structure is formed as the protective insulating film. As a first layer of the insulating layer 4020, a silicon oxynitride film is formed by a plasma CVD method shown in Embodiment 1.

As a second layer of the insulating layer 4020, a silicon nitride film is formed by a plasma CVD method. The use of the silicon nitride film as the protective film can prevent mobile ions such as sodium ions from entering the semiconductor layer, thereby suppressing variations in electric characteristics of the TFT.

After the protective insulating film is formed, heat treatment (at 300° C. or lower) may be carried out under a nitrogen atmosphere or an atmospheric atmosphere.

The insulating layer 4021 is formed as the planarizing insulating film. As the insulating layer 4021, an organic material having heat resistance such as polyimide, an acrylic resin, a benzocyclobutene-based resin, polyamide, or an epoxy resin can be used. Other than such organic materials, it is also possible to use a low-dielectric constant material (a low-k material), a siloxane-based resin, phosphosilicate glass (PSG), borophosphosilicate glass (BPSG), or the like. Note that the insulating layer 4021 may be formed by stacking a plurality of insulating films formed of these materials.

Note that a siloxane resin is a resin formed from a siloxane material as a starting material and having a Si—O—Si bond. The siloxane-based resin may include as a substituent an organic group (e.g., an alkyl group or an aryl group). The organic group may include a fluoro group.

There is no particular limitation on the method for forming the insulating layer 4021, and the insulating layer 4021 can be formed, depending on the material, by a sputtering method, an SOG method, a spin coating method, a dipping method, a spray coating method, a droplet discharge method (e.g., an inkjet method, screen printing, offset printing, or the like), or with a tool (equipment) such as a doctor knife, a roll coater, a curtain coater, or a knife coater. The baking step of the insulating layer 4021 also serves as the annealing step of the oxide semiconductor layer, whereby a semiconductor device can be manufactured efficiently.

The pixel electrode layer 4030 and the counter electrode layer 4031 can be made of a light-transmitting conductive material such as indium oxide containing tungsten oxide, indium zinc oxide containing tungsten oxide, indium oxide containing titanium oxide, indium tin oxide containing titanium oxide, indium tin oxide (hereinafter referred to as ITO), indium zinc oxide, or indium tin oxide to which silicon oxide is added.

A conductive composition containing a conductive high molecule (also referred to as a conductive polymer) can be used for the pixel electrode layer 4030 and the counter electrode layer 4031. The pixel electrode made of the conductive composition preferably has a sheet resistance of 10000 ohms per square or less and a transmittance of 70% or more at a wavelength of 550 nm. Furthermore, the resistivity of the conductive high molecule contained in the conductive composition is preferably 0.1 Ω·cm or less.

As the conductive high molecule, a so-called π-electron conjugated conductive polymer can be used. For example, it is possible to use polyaniline or a derivative thereof, polypyrrole or a derivative thereof, polythiophene or a derivative thereof, or a copolymer of two or more kinds of them.

A variety of signals and potentials are supplied to the signal line driver circuit 4003 that is formed separately, and the scan line driver circuit 4004 or the pixel portion 4002 from an FPC 4018.

A connection terminal electrode 4015 is formed from the same conductive film as the pixel electrode layer 4030 included in the liquid crystal element 4013, and a terminal electrode 4016 is formed from the same conductive film as a source and drain electrode layers of the thin film transistor 4011.

The connection terminal electrode 4015 is electrically connected to a terminal included in the FPC 4018 through an anisotropic conductive film 4019.

Note that FIGS. 16A1, 16A2 and 16B illustrate an example in which the signal line driver circuit 4003 is formed separately and mounted on the first substrate 4001; however, Embodiment 7 is not limited to this structure. The scan line driver circuit may be separately formed and then mounted, or only part of the signal line driver circuit or part of the scan line driver circuit may be separately formed and then mounted.

Figure 26:
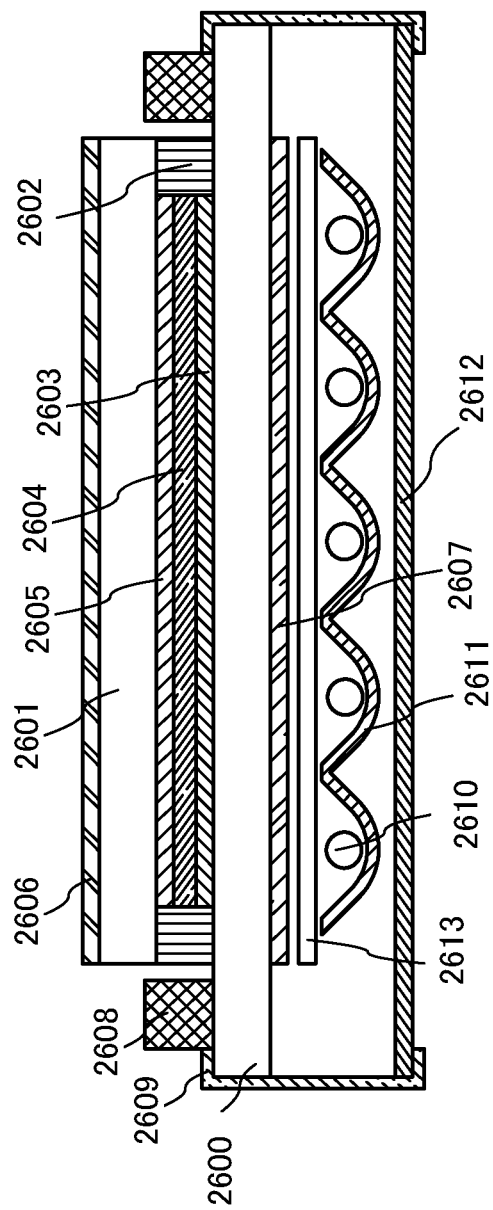
FIG. 26 is a view illustrating a semiconductor device.

FIG. 26 illustrates an example of a liquid crystal display module which is formed as a semiconductor device by using a TFT substrate 2600 manufactured according to a manufacturing method disclosed in this specification.

FIG. 26 illustrates an example of a liquid crystal display module, in which the TFT substrate 2600 and a counter substrate 2601 are bonded to each other with a sealant 2602, and a pixel portion 2603 including a TFT or the like, a display element 2604 including a liquid crystal layer, and a coloring layer 2605 are provided between the substrates to form a display region. The coloring layer 2605 is necessary to perform color display. In the case of the RGB system, respective coloring layers corresponding to colors of red, green, and blue are provided for respective pixels. Polarizing plates 2606 and 2607 and a diffusion plate 2613 are provided outside the TFT substrate 2600 and the counter substrate 2601. A light source includes a cold cathode tube 2610 and a reflective plate 2611. A circuit board 2612 is connected to a wiring circuit portion 2608 of the TFT substrate 2600 through a flexible wiring board 2609 and includes an external circuit such as a control circuit or a power source circuit. The polarizing plate and the liquid crystal layer may be stacked with a retardation plate interposed therebetween.

For the liquid crystal display module, a TN (twisted nematic) mode, an IPS (in-plane-switching) mode, an FFS (fringe field switching) mode, an MVA (multi-domain vertical alignment) mode, a PVA (patterned vertical alignment) mode, an ASM (axially symmetric aligned micro-cell) mode, an OCB (optical compensated birefringence) mode, an FLC (ferroelectric liquid crystal) mode, an AFLC (antiferroelectric liquid crystal) mode, or the like can be used.

Through the above process, a highly reliable liquid crystal display panel as a semiconductor device can be manufactured.

Embodiment 7 can be implemented in appropriate combination with the structures described in the other embodiments.

Embodiment 8

In Embodiment 8, an example of an electronic paper will be described as a semiconductor device of an embodiment of the present invention.

The semiconductor device which can be manufactured using the present invention can be used for electronic paper in which electronic ink is driven by an element electrically connected to a switching element. The electronic paper is also referred to as an electrophoretic display device (an electrophoretic display) and is advantageous in that it has the same level of readability as plain paper, it has lower power consumption than other display devices, and it can be made thin and lightweight.

Electrophoretic displays can have various modes. Electrophoretic displays contain a plurality of microcapsules dispersed in a solvent or a solute, each microcapsule containing first particles which are positively charged and second particles which are negatively charged. By applying an electric field to the microcapsules, the particles in the microcapsules move in opposite directions to each other and only the color of the particles gathering on one side is displayed. Note that the first particles and the second particles each contain pigment and do not move without an electric field. Moreover, the first particles and the second particles have different colors (which may be colorless).

Thus, an electrophoretic display is a display that utilizes a so-called dielectrophoretic effect by which a substance having a high dielectric constant moves to a high-electric field region. An electrophoretic display device does not need to use a polarizing plate which is required in a liquid crystal display device.

A solution in which the above microcapsules are dispersed in a solvent is referred to as electronic ink. This electronic ink can be printed on a surface of glass, plastic, cloth, paper, or the like. Furthermore, by using a color filter or particles that have a pigment, color display can also be achieved.

In addition, if a plurality of the above microcapsules is arranged as appropriate over an active matrix substrate so as to be interposed between two electrodes, an active matrix display device can be completed, and display can be performed by application of an electric field to the microcapsules. For example, the active matrix substrate obtained by the thin film transistors described in any of Embodiments 1 to 4 can be used.

Note that the first particles and the second particles in the microcapsules may each be formed of a single material selected from a conductive material, an insulating material, a semiconductor material, a magnetic material, a liquid crystal material, a ferroelectric material, an electroluminescent material, an electrochromic material, and a magnetophoretic material, or formed of a composite material of any of these materials.

Figure 24:
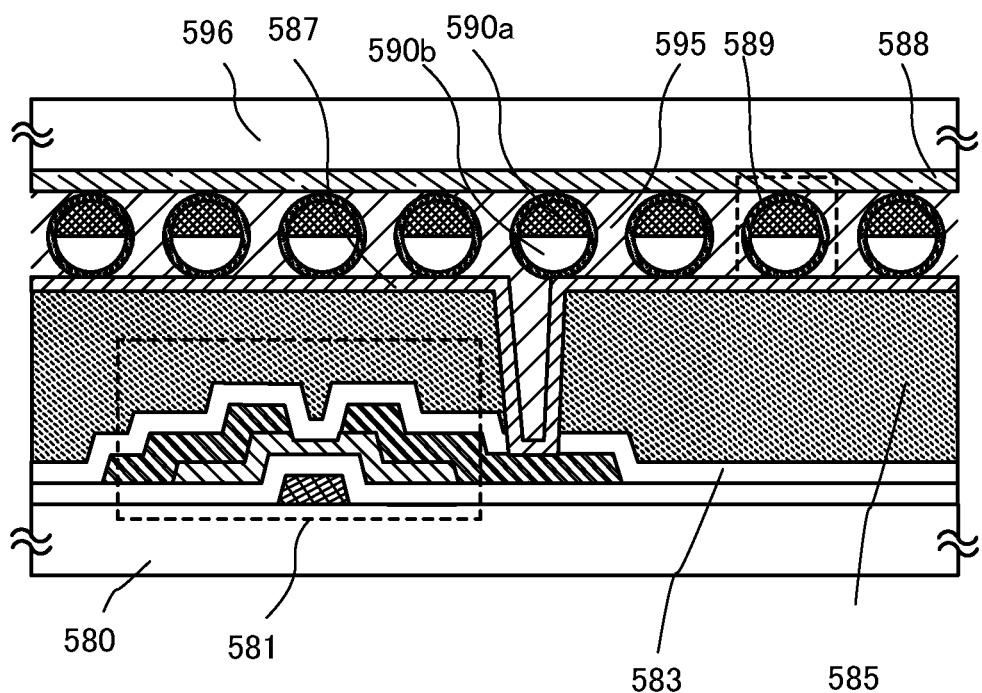
FIG. 24 is a view illustrating a semiconductor device.

FIG. 24 illustrates active matrix electronic paper as an example of a semiconductor device. A thin film transistor 581 used for the semiconductor device can be manufactured in a manner similar to that of the thin film transistor described in Embodiment 2 and is a highly reliable thin film transistor including an oxide semiconductor layer. The thin film transistor described in any of Embodiments 1 and 3 to 5 can also be used as the thin film transistor 581 of Embodiment 8.

The electronic paper in FIG. 24 is an example of a display device using a twisting ball display system. The twisting ball display system refers to a method in which spherical particles each colored in black and white are arranged between a first electrode layer and a second electrode layer which are electrode layers used for a display element, and a potential difference is generated between the first electrode layer and the second electrode layer to control orientation of the spherical particles, so that display is performed.

The thin film transistor 581 formed over a substrate 580 is a thin film transistor with a bottom gate structure and is covered with an insulating film 583 which is in contact with the oxide semiconductor layer. A source or drain electrode layer of the thin film transistor 581 is in contact with a first electrode layer 587 through an opening formed in an insulating layer 585, whereby the thin film transistor 581 is electrically connected to the first electrode layer 587. Between the first electrode layer 587 and a second electrode layer 588 formed over a substrate 596, spherical particles 589 each having a black region 590a and a white region 590b are provided. A space around the spherical particles 589 is filled with a filler 595 such as a resin. The first electrode layer 587 corresponds to a pixel electrode, and the second electrode layer 588 corresponds to a common electrode. The second electrode layer 588 is electrically connected to a common potential line provided over the same substrate as the thin film transistor 581. With the use of a common connection portion, the second electrode layer 588 can be electrically connected to the common potential line through conductive particles provided between a pair of substrates.

Instead of the element using the twisting ball, an electrophoretic element can also be used. A microcapsule having a diameter of about 10 μm to 200 μm in which transparent liquid, positively-charged white microparticles, and negatively-charged black microparticles are encapsulated, is used. In the microcapsule which is provided between the first electrode layer and the second electrode layer, when an electric field is applied between the first electrode layer and the second electrode layer, the white microparticles and the black microparticles move to opposite sides from each other, so that white or black can be displayed. A display element using this principle is an electrophoretic display element and is generally called electronic paper. The electrophoretic display element has higher reflectance than a liquid crystal display element, and thus, an auxiliary light is unnecessary, power consumption is low, and a display portion can be recognized in a dim environment. In addition, even when power is not supplied to the display portion, an image which has been displayed once can be maintained. Accordingly, a displayed image can be stored even if a semiconductor device having a display function (which may be referred to simply as a display device or a semiconductor device provided with a display device) is disconnected from a power supply.

Through the above process, a highly reliable electronic paper as a semiconductor device can be manufactured.

Embodiment 8 can be implemented in appropriate combination with the structures described in the other embodiments.

Embodiment 9

An example of a light-emitting display device will be described as a semiconductor device. As a display element included in a display device, a light-emitting element utilizing electroluminescence is described here. Light-emitting elements utilizing electroluminescence are classified according to whether a light-emitting material is an organic compound or an inorganic compound. In general, the former is referred to as an organic EL element, and the latter is referred to as an inorganic EL element.

In an organic EL element, by application of a voltage to a light-emitting element, electrons and holes are separately injected from a pair of electrodes into a layer containing a light-emitting organic compound, and current flows. Then, the carriers (electrons and holes) recombine, so that the light-emitting organic compound is excited. The light-emitting organic compound returns to a ground state from the excited state, thereby emitting light. Owing to such a mechanism, this light-emitting element is referred to as a current-excitation light-emitting element.

The inorganic EL elements are classified according to their element structures into a dispersion-type inorganic EL element and a thin-film inorganic EL element. A dispersion-type inorganic EL element has a light-emitting layer where particles of a light-emitting material are dispersed in a binder, and its light emission mechanism is donor-acceptor recombination type light emission which utilizes a donor level and an acceptor level. A thin-film inorganic EL element has a structure where a light-emitting layer is sandwiched between dielectric layers, which are further sandwiched between electrodes, and its light emission mechanism is localized type light emission that utilizes inner-shell electron transition of metal ions. Note that description is made here using an organic EL element as a light-emitting element.

Figure 18:
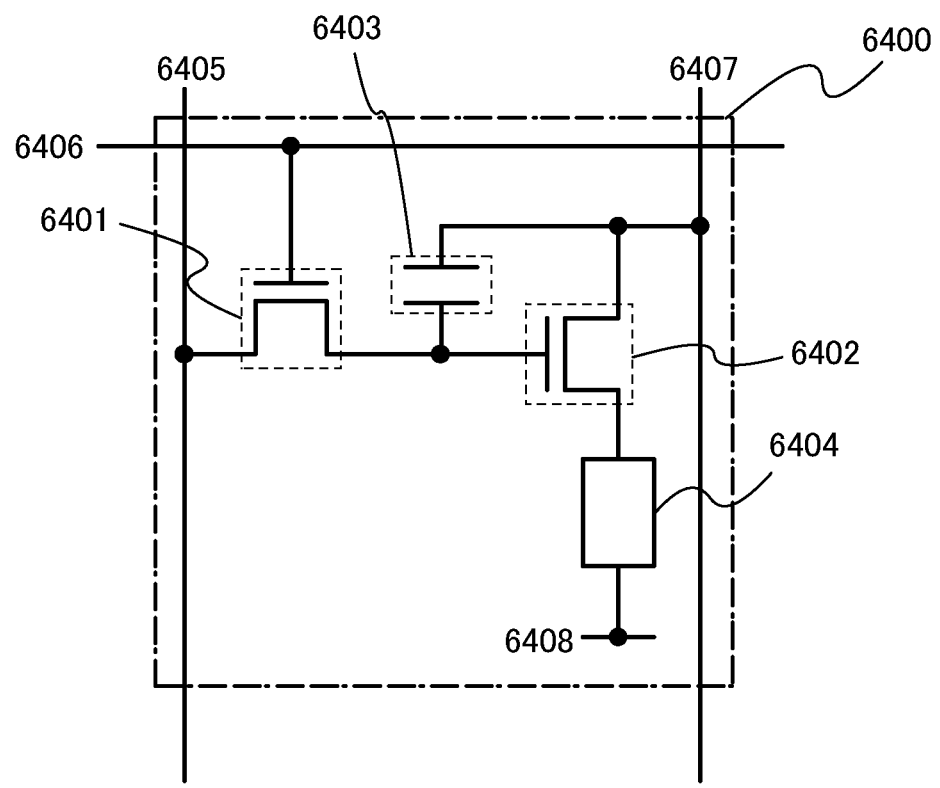
FIG. 18 is a view illustrating a pixel equivalent circuit of a semiconductor device.

FIG. 18 illustrates an example of a pixel structure as an example of a semiconductor device which can be driven by a digital time grayscale method.

The structure and operation of a pixel which can be driven by a digital time grayscale method will be described. An example is described here in which one pixel includes two n-channel transistors using an oxide semiconductor layer in a channel formation region.

A pixel 6400 includes a switching transistor 6401, a transistor 6402 for driving a light-emitting element, a light-emitting element 6404, and a capacitor 6403. A gate of the switching transistor 6401 is connected to a scan line 6406, a first electrode (one of a source electrode and a drain electrode) of the switching transistor 6401 is connected to a signal line 6405, and a second electrode (the other of the source electrode and the drain electrode) of the switching transistor 6401 is connected to a gate of the transistor 6402 for driving the light-emitting element. The gate of the transistor 6402 for driving the light-emitting element is connected to a power supply line 6407 through the capacitor 6403, a first electrode of the driving transistor 6402 is connected to the power supply line 6407, and a second electrode of the transistor 6402 for driving the light-emitting element is connected to a first electrode (pixel electrode) of the light-emitting element 6404. A second electrode of the light-emitting element 6404 corresponds to a common electrode 6408. The common electrode 6408 is electrically connected to a common potential line provided over the same substrate.

Note that the second electrode (common electrode 6408) of the light-emitting element 6404 is set to a low power supply potential. The low power supply potential is lower than a high power supply potential which is supplied to the power supply line 6407. For example, GND or 0 V may be set as the low power supply potential. The difference between the high power supply potential and the low power supply potential is applied to the light-emitting element 6404 so that current flows through the light-emitting element 6404, whereby the light-emitting element 6404 emits light. Thus, each potential is set so that the difference between the high power supply potential and the low power supply potential is greater than or equal to a forward threshold voltage.

When the gate capacitance of the transistor 6402 for driving the light-emitting element is used as a substitute for the capacitor 6403, the capacitor 6403 can be omitted. The gate capacitance of the transistor 6402 for driving the light-emitting element may be formed between a channel region and a gate electrode.

Here, in the case of using a voltage-input voltage driving method, a video signal is input to the gate of the transistor 6402 for driving the light-emitting element to make the transistor 6402 for driving the light-emitting element completely turn on or off. That is, the transistor 6402 for driving the light-emitting element operates in a linear region, and thus, a voltage higher than the voltage of the power supply line 6407 is applied to the gate of the transistor 6402 for driving the light-emitting element. Note that a voltage greater than or equal to (power supply line voltage+$V_{th}$ of the transistor 6402 for driving the light-emitting element) is applied to the signal line 6405.

In the case of using an analog grayscale method instead of the digital time grayscale method, the same pixel structure as in FIG. 18 can be employed by inputting signals in a different way.

In the case of using the analog grayscale method, a voltage greater than or equal to (forward voltage of the light-emitting element 6404+$V_{th}$ of the transistor 6402 for driving the light-emitting element) is applied to the gate of the transistor 6402 for driving the light-emitting element. The forward voltage of the light-emitting element 6404 refers to a voltage to obtain a desired luminance, and includes at least a forward threshold voltage. By inputting a video signal to enable the transistor 6402 for driving the light-emitting element to operate in a saturation region, current can be supplied to the light-emitting element 6404. In order that the transistor 6402 for driving the light-emitting element can operate in the saturation region, the potential of the power supply line 6407 is higher than a gate potential of the transistor 6402 for driving the light-emitting element. Since the video signal is an analog signal, current in accordance with the video signal flows in the light-emitting element 6404, and the analog grayscale method can be performed.

Note that the pixel structure is not limited to that illustrated in FIG. 18. For example, the pixel in FIG. 18 can further include a switch, a resistor, a capacitor, a transistor, a logic circuit, or the like.

Next, structures of the light-emitting element will be described with reference to FIGS. 19A to 19C. Here, a cross-sectional structure of a pixel will be described by taking an n-channel TFT for driving a light-emitting element as an example. TFTs 7001, 7011, and 7021 which are TFTs for driving light-emitting elements used for semiconductor devices illustrated in FIGS. 19A to 19C can be manufactured in a manner similar to that of the thin film transistor used in a pixel, which is described in Embodiment 2. The TFTs 7001, 7011, and 7021 are highly reliable thin film transistors each including an oxide semiconductor layer. Alternatively, the thin film transistor used in a pixel, which is described in Embodiments 1 and 3 to 5, can be employed as the driving TFTs 7001, 7011, and 7021.

In order to extract light emitted from the light-emitting element, at least one of the anode and the cathode is required to transmit light. A thin film transistor and a light-emitting element are formed over a substrate. A light-emitting element can have a top emission structure in which light is extracted through the surface opposite to the substrate, a bottom emission structure in which light is extracted through the surface on the substrate side, or a dual emission structure in which light is extracted through the surface opposite to the substrate and the surface on the substrate side. The pixel structure can be applied to a light-emitting element having any of these emission structures.

A light-emitting element having a top emission structure will be described with reference to FIG. 19A.

Figure 19A:
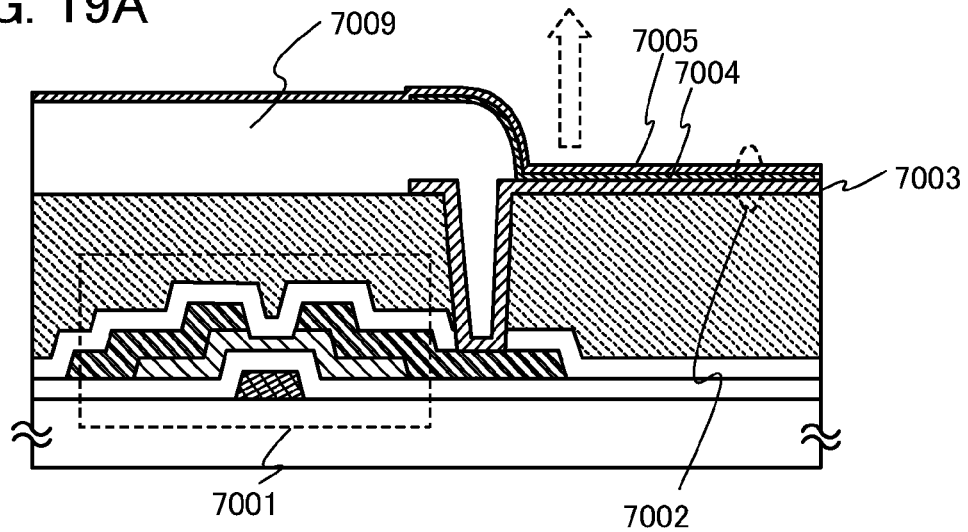
FIGS. 19A to 19C are views each illustrating a semiconductor device.

FIG. 19A is a cross-sectional view of a pixel in the case where the TFT 7001 for driving the light-emitting element is of an n-type and light is emitted from a light-emitting element 7002 to an anode 7005 side. In FIG. 19A, a cathode 7003 of the light-emitting element 7002 is electrically connected to the TFT 7001 for driving the light-emitting element, and a light-emitting layer 7004 and the anode 7005 are stacked in this order over the cathode 7003. The cathode 7003 can be made of a variety of conductive materials as long as they have a low work function and reflect light. For example, Ca, Al, CaF, MgAg, AlLi, or the like is preferably used. The light-emitting layer 7004 may be formed as a single layer or a plurality of layers stacked. When the light-emitting layer 7004 is formed as a plurality of layers, the light-emitting layer 7004 is formed by stacking an electron-injection layer, an electron-transport layer, a light-emitting layer, a hole-transport layer, and a hole-injection layer in this order over the cathode 7003. Note that not all of these layers need to be provided. The anode 7005 is made of a light-transmitting conductive material such as indium oxide including tungsten oxide, indium zinc oxide including tungsten oxide, indium oxide including titanium oxide, indium tin oxide including titanium oxide, indium tin oxide (hereinafter referred to as ITO), indium zinc oxide, or indium tin oxide to which silicon oxide is added.

Further, a partition 7009 is provided between the cathode 7003 and a cathode of an adjacent pixel, so as to cover each end portion thereof. The partition 7009 is formed using an organic resin film such as polyimide, an acrylic resin, polyamide, or an epoxy resin, an inorganic insulating film, or polysiloxane. It is particularly preferable that the partition 7009 be formed using a photosensitive resin material so that a sidewall of the partition 7009 is formed as a tilted surface with continuous curvature. In the case where a photosensitive resin material is used for the partition 7009, a step of forming a resist mask can be omitted.

The light-emitting element 7002 corresponds to a region where the light-emitting layer 7004 is sandwiched between the cathode 7003 and the anode 7005. In the case of the pixel illustrated in FIG. 19A, light is emitted from the light-emitting element 7002 to the anode 7005 side as indicated by an arrow.

Next, a light-emitting element having a bottom emission structure will be described with reference to FIG. 19B. FIG. 19B is a cross-sectional view of a pixel in the case where the TFT 7011 for driving the light-emitting element is of an n-type and light is emitted from a light-emitting element 7012 to a cathode 7013 side. In FIG. 19B, the cathode 7013 of the light-emitting element 7012 is formed over a light-transmitting conductive film 7017 which is electrically connected to the TFT 7011 for driving the light-emitting element, and a light-emitting layer 7014 and an anode 7015 are stacked in this order over the cathode 7013. Note that a light-blocking film 7016 for reflecting or blocking light may be formed to cover the anode 7015 when the anode 7015 has a light-transmitting property. For the cathode 7013, various materials can be used, like in the case of FIG. 19A, as long as they are conductive materials having a low work function. Note that the cathode 7013 is formed to have a thickness that can transmit light (preferably, approximately 5 to 30 nm). For example, an aluminum film with a thickness of 20 nm can be used as the cathode 7013. Similarly to the case of FIG. 19A, the light-emitting layer 7014 may be formed using either a single layer or a plurality of layers stacked. The anode 7015 is not required to transmit light, but can be made of a light-transmitting conductive material like in the case of FIG. 19A. As the light-blocking film 7016, a metal which reflects light can be used for example; however, it is not limited to a metal film. For example, a resin to which black pigments are added can also be used.

Further, a partition 7019 is provided between the conductive film 7017 and a conductive film of an adjacent pixel, so as to cover each end portion thereof. The partition 7019 is formed using an organic resin film such as polyimide, an acrylic resin, polyamide, or an epoxy resin, an inorganic insulating film, or polysiloxane. It is particularly preferable that the partition 7019 be formed using a photosensitive resin material so that a sidewall of the partition 7019 is formed as a tilted surface with continuous curvature. In the case where a photosensitive resin material is used for the partition 7019, a step of forming a resist mask can be omitted.

The light-emitting element 7012 corresponds to a region where the light-emitting layer 7014 is sandwiched between the cathode 7013 and the anode 7015. In the case of the pixel illustrated in FIG. 19B, light is emitted from the light-emitting element 7012 to the cathode 7013 side as indicated by an arrow.

Next, a light-emitting element having a dual emission structure will be described with reference to FIG. 19C. In FIG. 19C, a cathode 7023 of a light-emitting element 7022 is formed over a light-transmitting conductive film 7027 which is electrically connected to the TFT 7021 for driving the light-emitting element, and a light-emitting layer 7024 and an anode 7025 are stacked in this order over the cathode 7023. Like in the case of FIG. 19A, the cathode 7023 can be made of a variety of conductive materials as long as they have a low work function. Note that the cathode 7023 is formed to have a thickness that can transmit light. For example, an aluminum film with a thickness of 20 nm can be used as the cathode 7023. Like in FIG. 19A, the light-emitting layer 7024 may be formed as either a single layer or a plurality of layers stacked. The anode 7025 can be made of a light-transmitting conductive material like in the case of FIG. 19A.

Further, a partition 7029 is provided between the conductive film 7027 and a conductive film of an adjacent pixel, so as to cover each end portion thereof. The partition 7029 is formed using an organic resin film such as polyimide, an acrylic resin, polyamide, or an epoxy resin, an inorganic insulating film, or polysiloxane. It is particularly preferable that the partition 7029 be formed using a photosensitive resin material so that a sidewall of the partition 7029 is formed as a tilted surface with continuous curvature. In the case where a photosensitive resin material is used for the partition 7029, a step of forming a resist mask can be omitted.

The light-emitting element 7022 corresponds to a region where the cathode 7023, the light-emitting layer 7024, and the anode 7025 overlap with one another. In the case of the pixel illustrated in FIG. 19C, light is emitted from the light-emitting element 7022 to both the anode 7025 side and the cathode 7023 side as indicated by arrows.

Although an organic EL element is described here as a light-emitting element, an inorganic EL element can also be provided as a light-emitting element.

The example is described in which a thin film transistor (a TFT for driving a light-emitting element) which controls the driving of a light-emitting element is electrically connected to the light-emitting element; however, a structure may be employed in which a TFT for current control is connected between the TFT for driving the light-emitting element and the light-emitting element.

Figure 19B:
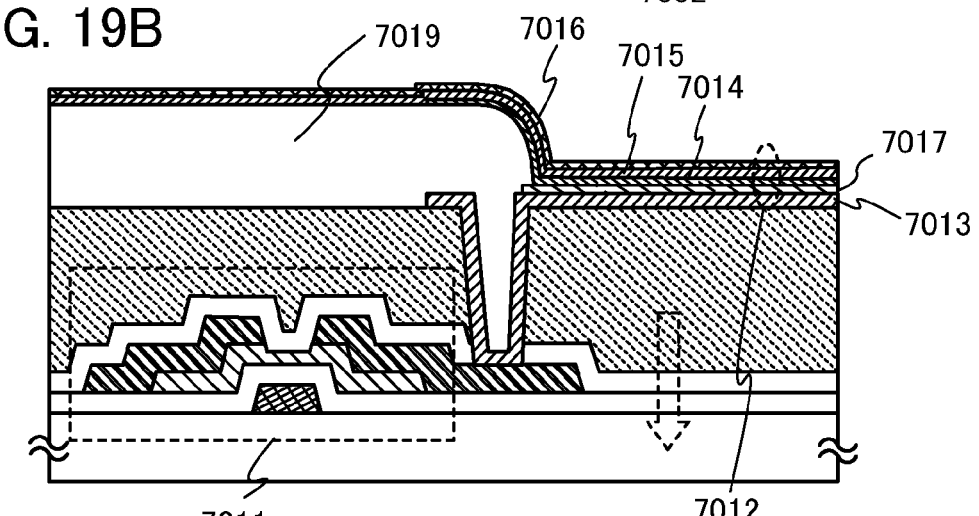
Figure 19C:
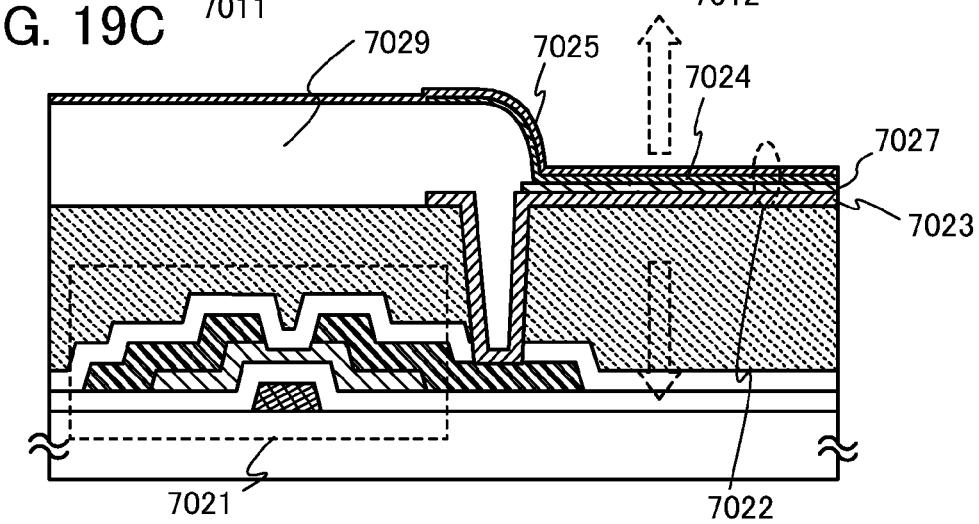

Note that the structure of the semiconductor device is not limited to those illustrated in FIGS. 19A to 19C and can be modified in various ways based on the spirit of techniques according to the present invention.

Next, the appearance and a cross section of a light-emitting display panel (also referred to as a light-emitting panel), which is an embodiment of the semiconductor device, will be described with reference to FIGS. 17A and 17B. FIG. 17A is a plan view of a panel in which a thin film transistor and a light-emitting element are sealed between a first substrate and a second substrate with a sealant. FIG. 17B is a cross-sectional view taken along line H-I of FIG. 17A.

A sealant 4505 is provided to surround a pixel portion 4502, signal line driver circuits 4503a and 4503b, and scan line driver circuits 4504a and 4504b, which are provided over a first substrate 4501. In addition, a second substrate 4506 is provided over the pixel portion 4502, the signal line driver circuits 4503a and 4503b, and the scan line driver circuits 4504a and 4504b. Accordingly, the pixel portion 4502, the signal line driver circuits 4503a and 4503b, and the scan line driver circuits 4504a and 4504b are sealed together with a filler 4507, by the first substrate 4501, the sealant 4505, and the second substrate 4506. It is preferable that a display device be thus packaged (sealed) with a protective film (such as a bonding film or an ultraviolet curable resin film) or a cover material with high air-tightness and little degasification so that the display device is not exposed to the outside air.

The pixel portion 4502, the signal line driver circuits 4503a and 4503b, and the scan line driver circuits 4504a and 4504b formed over the first substrate 4501 each include a plurality of thin film transistors, and a thin film transistor 4510 included in the pixel portion 4502 and a thin film transistor 4509 included in the signal line driver circuit 4503a are illustrated as an example in FIG. 17B.

As the thin film transistors 4509 and 4510, the thin film transistor including an oxide semiconductor layer which is described in Embodiment 3 can be employed. Alternatively, the thin film transistor described in any of Embodiments 1, 2, 4, and 5 can be employed. The thin film transistors 4509 and 4510 are n-channel thin film transistors.

Reference numeral 4511 denotes a light-emitting element. A first electrode layer 4517 that is a pixel electrode included in the light-emitting element 4511 is electrically connected to a source electrode layer or a drain electrode layer of the thin film transistor 4510. Note that a structure of the light-emitting element 4511 is not limited to the stack structure described in Embodiment 9, which includes the first electrode layer 4517, an electroluminescent layer 4512, and a second electrode layer 4513. The structure of the light-emitting element 4511 can be changed as appropriate depending on the direction in which light is extracted from the light-emitting element 4511, or the like.

A partition wall 4520 is made of an organic resin film, an inorganic insulating film, or polysiloxane. It is particularly preferable that the partition wall 4520 be formed of a photosensitive material to have an opening over the first electrode layer 4517 so that a sidewall of the opening is formed as an inclined surface with continuous curvature.

The electroluminescent layer 4512 may be formed as a single layer or a plurality of layers stacked.

A protective film may be formed over the second electrode layer 4513 and the partition wall 4520 in order to prevent oxygen, hydrogen, moisture, carbon dioxide, or the like from entering into the light-emitting element 4511. As the protective film, a silicon nitride film, a silicon nitride oxide film, a DLC film, or the like can be formed.

A variety of signals and potentials are supplied to the signal line driver circuits 4503a and 4503b, the scan line driver circuits 4504a and 4504b, or the pixel portion 4502 from FPCs 4518a and 4518b.

A connection terminal electrode 4515 is formed from the same conductive film as the first electrode layer 4517 included in the light-emitting element 4511, and a terminal electrode 4516 is formed from the same conductive film as the source and drain electrode layers included in the thin film transistor 4509.

The connection terminal electrode 4515 is electrically connected to a terminal of the FPC 4518*a* through an anisotropic conductive film 4519.

The substrate located in the direction in which light is extracted from the light-emitting element 4511 needs to have a light-transmitting property. In that case, a light-transmitting material such as a glass plate, a plastic plate, a polyester film, or an acrylic film is used.

As the filler 4507, an ultraviolet curable resin or a thermosetting resin can be used, in addition to an inert gas such as nitrogen or argon. For example, PVC (polyvinyl chloride), an acrylic resin, polyimide, an epoxy resin, a silicone resin, PVB (polyvinyl butyral), or EVA (a copolymer of ethylene with vinyl acetate) can be used.

If needed, an optical film, such as a polarizing plate, a circularly polarizing plate (including an elliptically polarizing plate), a retardation plate (a quarter-wave plate or a half-wave plate), or a color filter, may be provided as appropriate on a light-emitting surface of the light-emitting element. Furthermore, the polarizing plate or the circularly polarizing plate may be provided with an anti-reflection film. For example, anti-glare treatment by which reflected light can be diffused by projections and depressions on the surface so as to reduce the glare can be performed.

The signal line driver circuits 4503*a* and 4503*b* and the scan line driver circuits 4504*a* and 4504*b* may be mounted as driver circuits formed using a single crystal semiconductor film or a polycrystalline semiconductor film over a substrate separately prepared. Alternatively, only the signal line driver circuits or part thereof, or only the scan line driver circuits or part thereof may be separately formed and mounted. Embodiment 9 is not limited to the structure illustrated in FIGS. 17A and 17B.

Through the above process, a highly reliable light-emitting display device (display panel) as a semiconductor device can be manufactured.

Embodiment 9 can be implemented in appropriate combination with the structures described in the other embodiments.

Embodiment 10

A semiconductor device disclosed in this specification can be applied to an electronic paper. An electronic paper can be used for electronic appliances of a variety of fields as long as they can display data. For example, an electronic paper can be applied to an e-book reader (electronic book), a poster, an advertisement in a vehicle such as a train, or displays of various cards such as a credit card. Examples of the electronic appliances are illustrated in FIG. 27.

Figure 27:
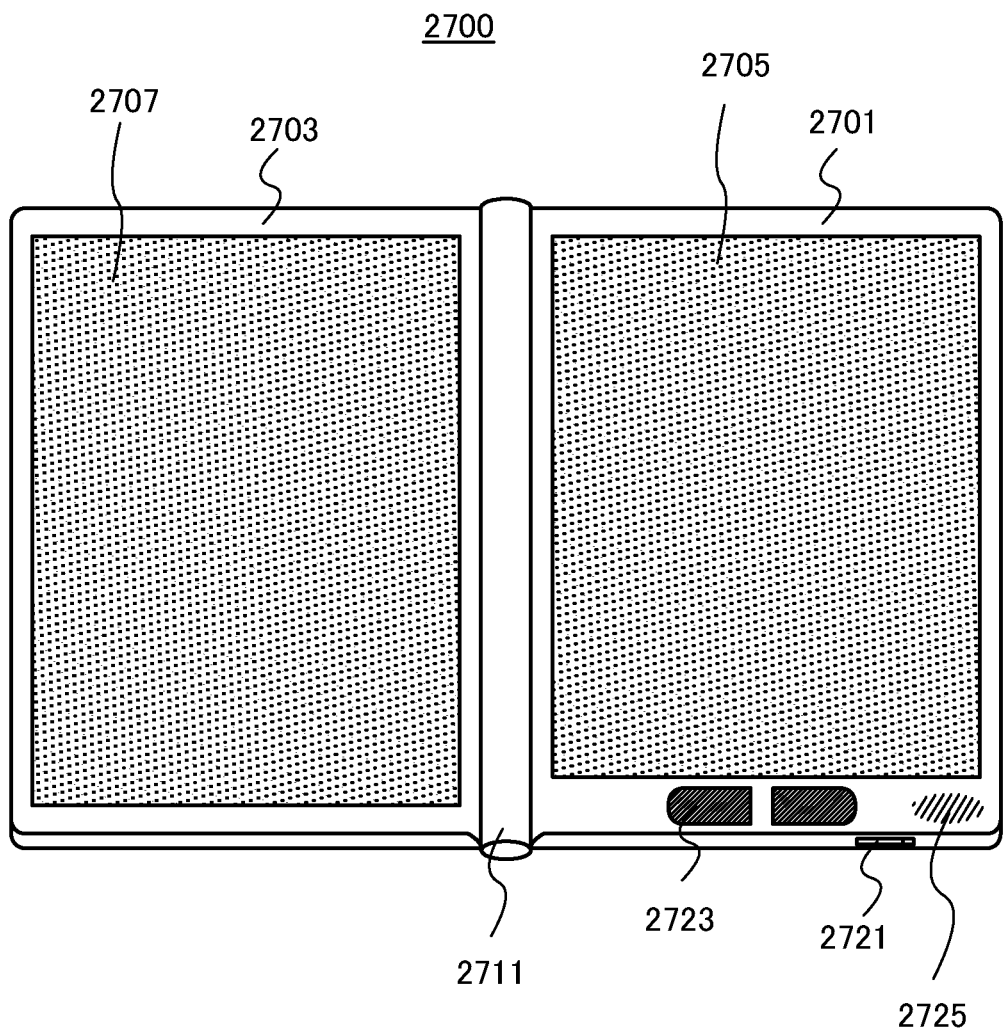
FIG. 27 is an external view illustrating an example of an e-book reader.

FIG. 27 illustrates an example of an e-book reader 2700. For example, the e-book reader 2700 includes a housing 2701 and a housing 2703. The housing 2701 and the housing 2703 are combined with a hinge 2711 so that the e-book reader 2700 can be opened and closed with the hinge 2711 as an axis. With such a structure, the e-book reader 2700 can operate like a paper book.

A display portion 2705 and a display portion 2707 are incorporated in the housing 2701 and the housing 2703, respectively. The display portion 2705 and the display portion 2707 may display one image or different images. In the case where the display portion 2705 and the display portion 2707 display different images, for example, text can be displayed on a display portion on the right side (the display portion 2705 in FIG. 27) and graphics can be displayed on a display portion on the left side (the display portion 2707 in FIG. 27).

FIG. 27 illustrates an example in which the housing 2701 is provided with an operation portion and the like. For example, the housing 2701 is provided with a power switch 2721, an operation key 2723, a speaker 2725, and the like. With the operation key 2723, pages can be turned. Note that a keyboard, a pointing device, and the like may be provided on the same surface as the display portion of the housing. Furthermore, an external connection terminal (an earphone terminal, a USB terminal, a terminal that can be connected to various cables such as an AC adapter and a USB cable, or the like), a recording medium insertion portion, and the like may be provided on the back surface or the side surface of the housing. Moreover, the e-book reader 2700 may have a function of an electronic dictionary.

The e-book reader 2700 may have a configuration capable of wirelessly transmitting and receiving data. Through wireless communication, desired book data or the like can be purchased and downloaded from an electronic book server.

Embodiment 11

A semiconductor device disclosed in this specification can be applied to a variety of electronic appliances (including amusement machines). Examples of electronic appliances include television sets (also referred to as televisions or television receivers), monitor of computers or the like, cameras such as digital cameras or digital video cameras, digital photo frames, cellular phones (also referred to as mobile phones or mobile phone sets), portable game consoles, portable information terminals, audio reproducing devices, large-sized game machines such as pachinko machines, and the like.

Figure 28A:
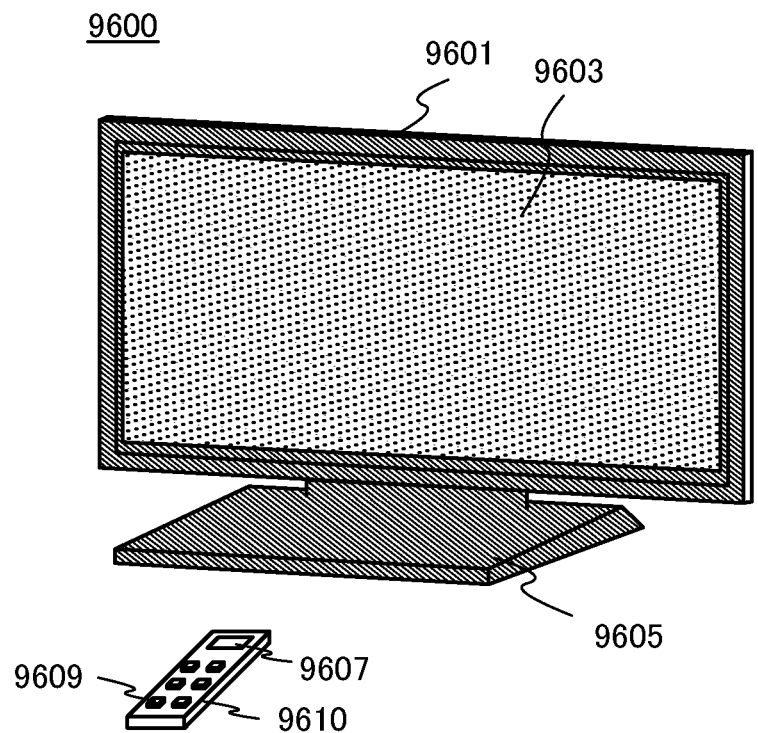
FIGS. 28A and 28B are external views respectively illustrating an example of a television set and an example of a digital photo frame.

FIG. 28A illustrates an example of a television set 9600. In the television set 9600, a display portion 9603 is incorporated in a housing 9601. Images can be displayed on the display portion 9603. Here, the housing 9601 is supported by a stand 9605.

The television set 9600 can be operated with an operation switch of the housing 9601 or a separate remote controller 9610. Channels and volume can be controlled with an operation key 9609 of the remote controller 9610 so that an image displayed on the display portion 9603 can be controlled. Furthermore, the remote controller 9610 may be provided with a display portion 9607 for displaying data output from the remote controller 9610.

Note that the television set 9600 is provided with a receiver, a modem, and the like. With the receiver, a general television broadcast can be received. Furthermore, when the television set 9600 is connected to a communication network by wired or wireless connection via the modem, one-way (from a transmitter to a receiver) or two-way (between a transmitter and a receiver, between receivers, or the like) data communication can be performed.

Figure 28B:
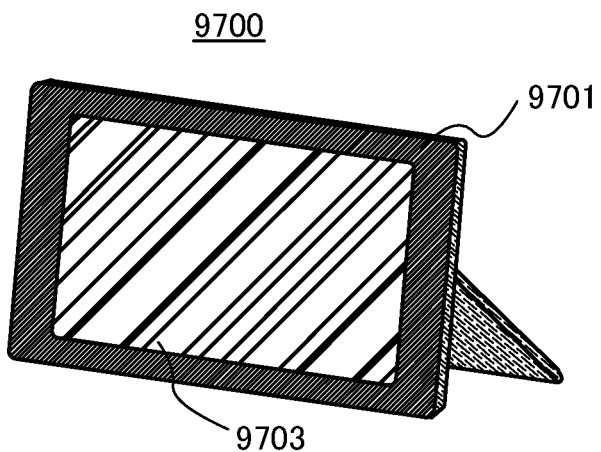

FIG. 28B illustrates an example of a digital photo frame 9700. For example, in the digital photo frame 9700, a display portion 9703 is incorporated in a housing 9701. Various images can be displayed on the display portion 9703. For example, the display portion 9703 can display data of an image shot by a digital camera or the like to function as a normal photo frame.

Note that the digital photo frame 9700 is provided with an operation portion, an external connection portion (a USB terminal, a terminal that can be connected to various cables such as a USB cable, or the like), a recording medium insertion portion, and the like. Although they may be provided on the same surface as the display portion, it is preferable to provide them on the side surface or the back surface for the design of the digital photo frame 9700. For example, a memory storing data of an image shot by a digital camera is inserted in the recording medium insertion portion of the digital photo frame, whereby the image data can be downloaded and displayed on the display portion 9703.

The digital photo frame 9700 may have a configuration capable of wirelessly transmitting and receiving data. Through wireless communication, desired image data can be downloaded to be displayed.

Figure 29A:
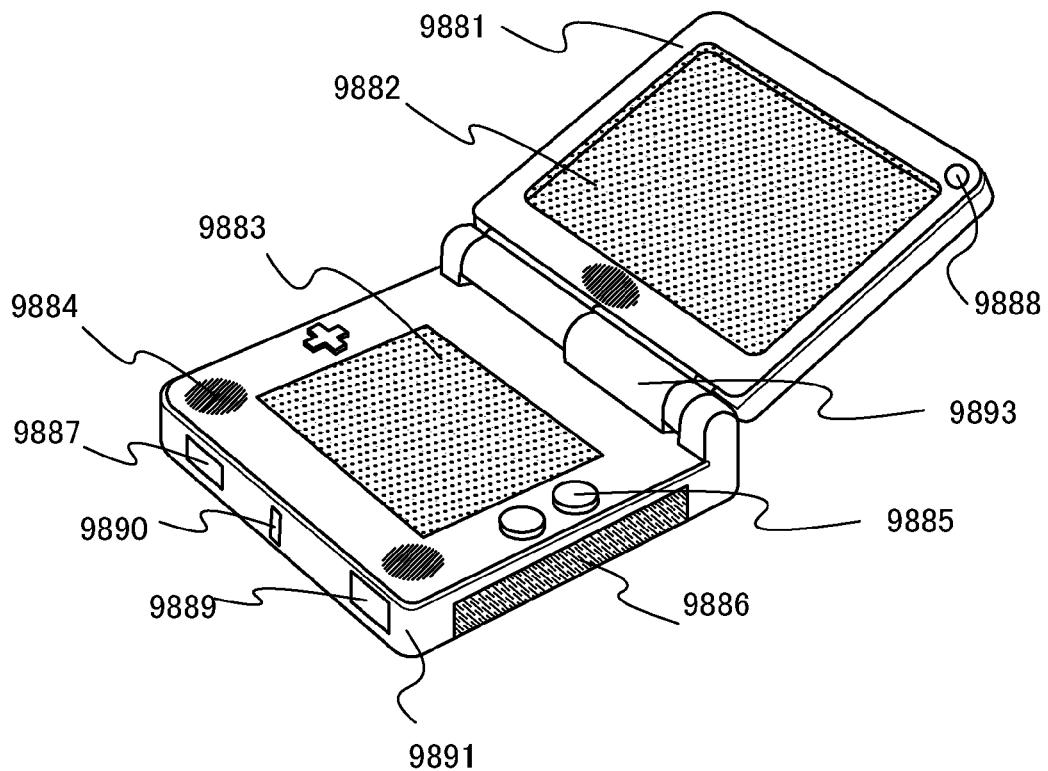
FIGS. 29A and 29B are external views illustrating examples of game machines.

FIG. 29A illustrates a portable amusement machine including two housings: a housing 9881 and a housing 9891. The housings 9881 and 9891 are connected with a connection portion 9893 so as to be opened and closed. A display portion 9882 and a display portion 9883 are incorporated in the housing 9881 and the housing 9891, respectively. In addition, the portable amusement machine illustrated in FIG. 29A includes a speaker portion 9884, a recording medium insertion portion 9886, an LED lamp 9890, an input means (an operation key 9885, a connection terminal 9887, a sensor 9888 (a sensor having a function of measuring force, displacement, position, speed, acceleration, angular velocity, rotational frequency, distance, light, liquid, magnetism, temperature, chemical substance, sound, time, hardness, electric field, current, voltage, electric power, radiation, flow rate, humidity, gradient, oscillation, odor, or infrared rays), and a microphone 9889), and the like. It is needless to say that the structure of the portable amusement machine is not limited to the above and other structures provided with at least a semiconductor device disclosed in this specification can be employed. The portable amusement machine may include other accessory equipment as appropriate. The portable amusement machine illustrated in FIG. 29A has a function of reading a program or data stored in a recording medium to display it on the display portion, and a function of sharing information with another portable amusement machine by wireless communication. Note that the portable amusement machine illustrated in FIG. 29A can have various functions without limitation to the above.

Figure 29B:
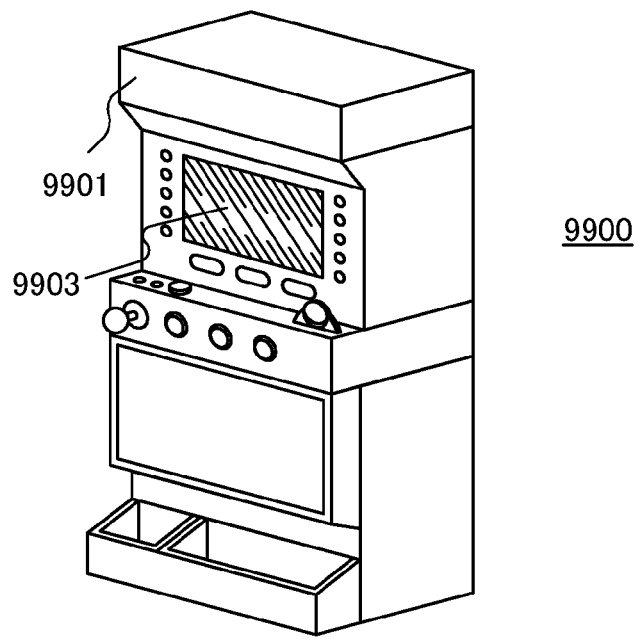

FIG. 29B illustrates an example of a slot machine 9900 which is a large-sized amusement machine. In the slot machine 9900, a display portion 9903 is incorporated in a housing 9901. In addition, the slot machine 9900 includes an operation means such as a start lever or a stop switch, a coin slot, a speaker, and the like. It is needless to say that the structure of the slot machine 9900 is not limited to the above and other structures provided with at least a semiconductor device disclosed in this specification may be employed. The slot machine 9900 may include other accessory equipment as appropriate.

Figure 30A:
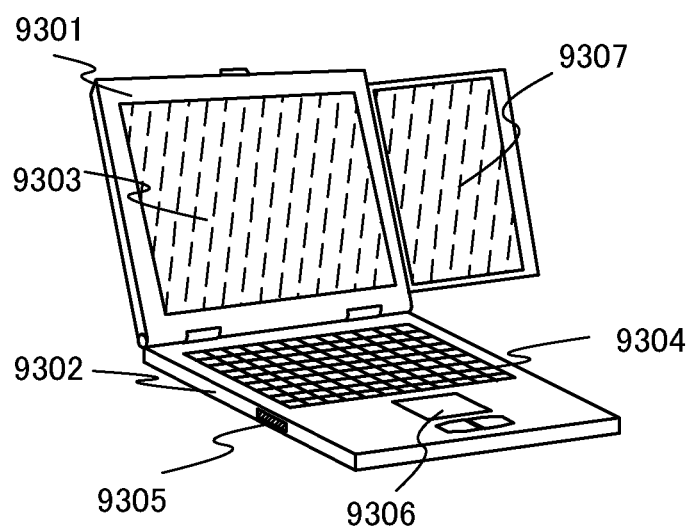
FIGS. 30A and 30B are external views respectively illustrating an example of a portable computer and an example of a mobile phone.

FIG. 30A is a perspective view illustrating an example of a portable computer.

In the portable computer of FIG. 30A, a top housing 9301 having a display portion 9303 and a bottom housing 9302 having a keyboard 9304 can overlap with each other by closing a hinge unit which connects the top housing 9301 and the bottom housing 9302. The portable computer of FIG. 30A can be convenient for carrying, and in the case of using the keyboard for input, the hinge unit is opened and the user can input looking at the display portion 9303.

The bottom housing 9302 includes a pointing device 9306 with which input can be performed, in addition to the keyboard 9304. Further, when the display portion 9303 is a touch input panel, input can be performed by touching part of the display portion. The bottom housing 9302 includes an arithmetic function portion such as a CPU or hard disk. In addition, the bottom housing 9302 includes another device, for example, an external connection port 9305 into which a communication cable conformable to communication standards of a USB is inserted.

The top housing 9301, which includes a display portion 9307 and can keep the display portion 9307 therein by sliding it toward the inside of the top housing 9301, can have a large display screen. In addition, the user can adjust the orientation of a screen of the display portion 9307 which can be kept in the top housing 9301. When the display portion 9307 which can be kept in the top housing 9301 is a touch input panel, input can be performed by touching part of the display portion 9307 which can be kept in the top housing 9301.

The display portion 9303 or the display portion 9307 which can be kept in the top housing 9301 are formed using an image display device of a liquid crystal display panel, a light-emitting display panel such as an organic light-emitting element or an inorganic light-emitting element, or the like.

In addition, the portable computer of FIG. 30A can be provided with a receiver and the like and can receive a television broadcast to display an image on the display portion 9303 or the display portion 9307. The user can watch a television broadcast when the whole screen of the display portion 9307 is exposed by sliding the display portion 9307 while the hinge unit which connects the top housing 9301 and the bottom housing 9302 is kept closed. In this case, the hinge unit is not opened and display is not performed on the display portion 9303. In addition, start up of only a circuit for displaying a television broadcast is performed. Therefore, power can be consumed to the minimum, which is useful for the portable computer whose battery capacity is limited.

Figure 30B:
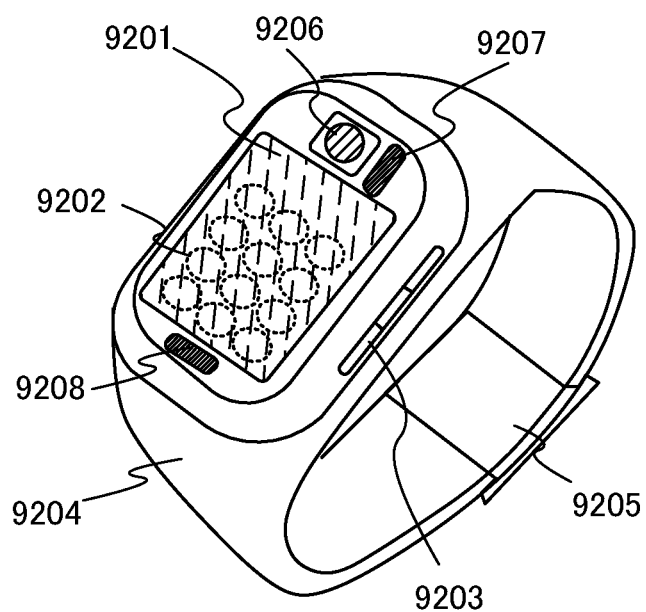

FIG. 30B is a perspective view illustrating an example of a cellular phone that the user can wear on the wrist like a wristwatch.

This cellular phone is formed with a main body which includes a communication device including at least a telephone function, and battery; a band portion 9204 which enables the main body to be wore on the wrist; an adjusting portion 9205 for adjusting the fixation of the band portion fixed for the wrist; a display portion 9201; a speaker 9207; and a microphone 9208.

In addition, the main body includes operating switches 9203. The operating switches 9203 serve, for example, as a button for starting a program for the Internet when the switch is pushed, in addition to serving as a switch for turning on a power source, a switch for shifting a display, a switch for instructing to start taking images, or the like, and can be used so as to correspond to each function.

Input to this cellular phone is operated by touching the display portion 9201 with a finger or an input pen, operating the operating switches 9203, or inputting voice into the microphone 9208. Note that displayed buttons 9202 which are displayed on the display portion 9201 are illustrated in FIG. 30B. Input can be performed by touching the displayed buttons 9202 with a finger or the like.

Further, the main body includes a camera portion 9206 including an image pick-up means having a function of converting an image of an object, which is formed through a camera lens, to an electronic image signal. Note that the camera portion is not necessarily provided.

The cellular phone illustrated in FIG. 30B is provided with a receiver of a television broadcast and the like, and can display an image on the display portion 9201 by receiving a television broadcast. In addition, the cellular phone illustrated in FIG. 30B is provided with a memory device and the like such as a memory, and can record a television broadcast in the memory. The cellular phone illustrated in FIG. 30B may have a function of detecting location information such as GPS.

An image display device of a liquid crystal display panel, a light-emitting display panel such as an organic light-emitting element or an inorganic light-emitting element, or the like is used as the display portion 9201. The cellular phone illustrated in FIG. 30B is compact and lightweight and the battery capacity of the cellular phone illustrated in FIG. 30B is limited. Therefore, a panel which can be driven with low power consumption is preferably used as a display device for the display portion 9201.

Note that FIG. 30B illustrates the electronic apparatus which is worn on the wrist; however, this embodiment is not limited thereto as long as a portable shape is employed.

Example 1

In Example 1, a thin film transistor of an embodiment of the present invention is manufactured and the results of the electric characteristic evaluation are shown.

A method for manufacturing the thin film transistor of Example 1 will be described. A stacked-layer film of a silicon nitride film with a thickness of 150 nm and a silicon oxynitride film with a thickness of 100 nm was formed as a base film over a glass substrate by a plasma CVD method. Then, a tungsten film with a thickness of 150 nm was formed as a gate electrode layer over the silicon oxynitride film by a sputtering method. A silicon oxynitride film with a thickness of 100 nm was formed as a gate insulating layer over the gate electrode layer by a plasma CVD method.

An In—Ga—Zn—O-based oxide semiconductor target ($In_2O_3$:$Ga_2O_3$:ZnO=1:1:1 [mol %] and In:Ga:Zn=1:1:0.5 [at %]) was used to form an oxide semiconductor layer with a thickness of 20 nm. The deposition condition was set as follows: the distance between the substrate and the target was 100 mm, the pressure was 0.2 Pa, the direct current (DC) power supply was 0.5 kW, and the atmosphere was a mixed atmosphere of argon and oxygen (argon:oxygen=30 sccm:20 sccm and the proportion of the oxygen flow was 40%).

As a source and drain electrode layers, a titanium film (100 nm in thickness), an aluminum film (200 nm in thickness), and a titanium film (100 nm in thickness) were stacked over the oxide semiconductor layer by a sputtering method.

Next, the oxide semiconductor layer was heated at 350° C. under an atmospheric atmosphere for one hour.

First, the pressure of the chamber in which an oxide insulating film is formed was reduced to $1 \times 10^{-3}$ Pa (the time needed for reducing the pressure was approximately 5 minutes). Then, a substrate over which the oxide semiconductor layer was formed was transferred to the chamber where the pressure had been reduced. After nitrogen was introduced into the chamber for five minutes and was heated at 330° C. for five minutes, the pressure of the chamber was reduced (the time needed for reducing the pressure was approximately 3 minutes). Nitrous oxide ($N_2O$) was introduced into the chamber and the pressure of the chamber was adjusted to 22 Pa.

Plasma was generated in the chamber into which the nitrous oxide ($N_2O$) had been introduced and silane ($SiH_4$) was introduced, so that a silicon oxynitride film with a thickness of 300 nm, which is an oxide insulating film, was formed in contact with the oxide semiconductor layer. $SiH_4$ and $N_2O$ ($SiH_4$:$N_2O$=10 sccm:1200 sccm) were used for the deposition gas. When the plasma was generated and when the oxide insulating film was formed, the conditions were set as follows: the pressure of the chamber was 22 Pa; the electric power was 30 W; the power supply frequency was 13.56 MHz; and the temperature was 330° C.

An opening which is to be a contact hole was formed in the oxide insulating film and the gate insulating layer, and then, the substrate was heated at 350° C. under an atmospheric atmosphere for one hour.

In this manner, the thin film transistor of Example 1 was formed. Note that the oxide semiconductor layer included in the thin film transistor has a channel length (L) of 20 μm and a channel width (W) of 20 μm.

As a method for examining the reliability of a thin film transistor, there is a bias-temperature stress test (hereinafter, referred to as a BT test). The BT test is a kind of an acceleration test, and a change in characteristics of the thin film transistor which is caused by long-term use can be evaluated in a short time by this method. A difference in the threshold voltage of the thin film transistor between before and after the BT test is an important index for examining the reliability of the thin film transistor. As a difference in the threshold voltage between before and after the BT test is small, the thin film transistor has higher reliability.

Specifically, the temperature of the substrate (substrate temperature) over which the thin film transistor is formed is maintained as a constant value, and while the source and the drain of the thin film transistor are set to the same potential, a potential different from that of the source and the drain are applied to a gate of the thin film transistor for a certain period. The substrate temperature may be determined as appropriate in accordance with the test purpose. A BT test in which a potential applied to a gate is higher than the potential of a source and a drain is referred to as +BT test and a BT test in which a potential applied to a gate is lower than the potential of a source and a drain is referred to as −BT test.

The test intensity of a BT test can be determined in accordance with a substrate temperature, the intensity of electric field intensity applied to a gate insulating film, and a time of applying the electric field. The intensity of the electric field applied to the gate insulating film is determined in accordance with a value obtained by dividing a potential difference between a gate and a source and a drain by the thickness of the gate insulating film. For example, when the intensity of the electric field applied to the gate insulating film with a thickness of 100 nm is adjusted to 2 MV/cm, the potential difference is set to be 20 V.

Results of a BT test of the thin film transistor of Example 1 will be described.

Note that a voltage refers to the difference between potentials of two points, and a potential refers to electrostatic energy (electric potential energy) of a unit charge at a given point in an electrostatic field. Note that in general, a difference between a potential of one point and a reference potential is merely called a potential or a voltage, and a potential and a voltage are used as synonymous words in many cases. Thus, in this specification, a potential may be rephrased as a voltage and a voltage may be rephrased as a potential unless otherwise specified.

Both a +BT test and a −BT test were carried out under the following conditions: the substrate temperature was 150° C.; the intensity of the electric field applied to the gate insulating film was 2 MV/cm; and the time of application was one hour.

First, the +BT test will be described. In order to measure initial characteristics of the thin film transistor which is to be the BT test target, a substrate temperature was set to 40° C. and a source-drain voltage was set to 10 V. Accordingly, change in a source-drain current (hereinafter, referred to as a drain current) upon the change in the source-drain voltage (hereinafter, referred to as a gate voltage) from −20 V to +20

V, namely Vg-Id characteristics, was measured. Although the substrate temperature was set to 40° C. in order to prevent the sample surface from adsorbing moisture, the substrate temperature may be a room temperature (25° C.) as long as there is no particular problem.

Next, after the substrate temperature was increased to 150° C., a potential of the source and drain of the thin film transistor was set to 0V. Then, voltage was applied so that the intensity of the electric field applied to the gate insulating film was 2 MV/cm. Since the thickness of the gate insulating film of the thin film transistor was 100 nm, +20 V was applied to the gate and this voltage was kept for one hour. The time of voltage application was one hour here; however, the time may be determined as appropriate in accordance with the purpose.

Next, the substrate temperature was decreased to 40° C. while a voltage is applied between the gate and the source and the drain. At this time, if the application of the voltage is stopped before the substrate temperature is completely decreased, damage which is given to the thin film transistor in the BT test is repaired due to remaining heat; therefore, the substrate temperature must be decreased while the voltage is applied. After the substrate temperature was decreased to 40° C., the application of the voltage was stopped. Strictly, the time of decreasing temperature must be added to the time of the voltage application; however, since the temperature was able to be decreased to 40° C. in several minutes actually, this was considered to be an error range and the time of decreasing temperature was not added to the time of application.

Then, Vg-Id characteristics were measured under the same conditions as those of the measurement of the initial characteristics, and Vg-Id characteristics after the +BT test were obtained.

Next, the −BT test will be explained. The −BT test was performed in almost the same manner as that of the +BT test; however, the −BT test was different from the +BT test in that a voltage applied to the gate after the substrate temperature was increased to 150° C. was −20 V.

Note that in a BT test, it is important to perform a BT test on a thin film transistor on which a BT test has not been performed. For example, when a −BT test is performed on a thin film transistor on which a +BT test has been performed, results of the −BT test cannot be evaluated correctly due to the +BT test which has been performed first. Further, the same applies to the case where a +BT test is performed on a thin film transistor on which a +BT test has been performed. Note that the same does not apply to the case where a BT test is intentionally repeated in consideration of these influences.

Figure 25A:
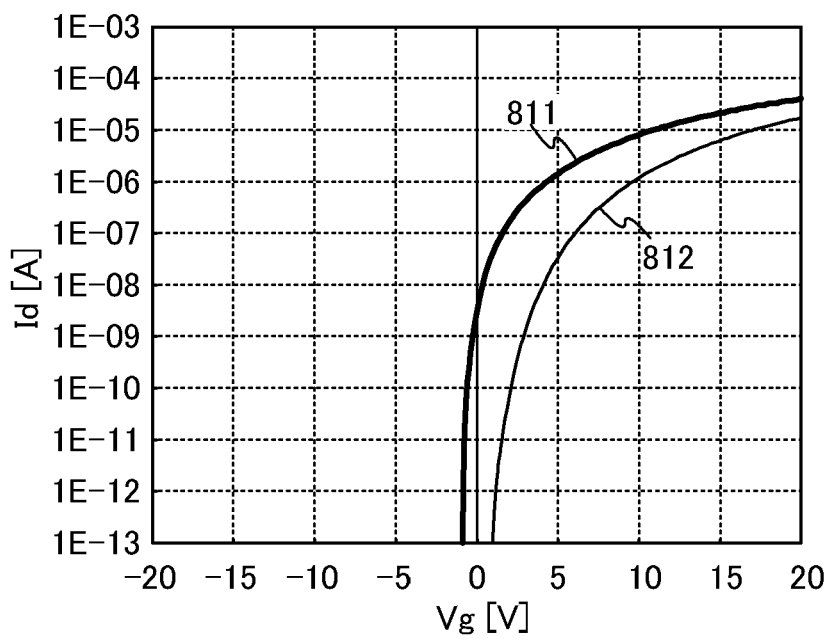
FIGS. 25A and 25B are graphs showing evaluation results of electric characteristics of thin film transistors.
Figure 25B:
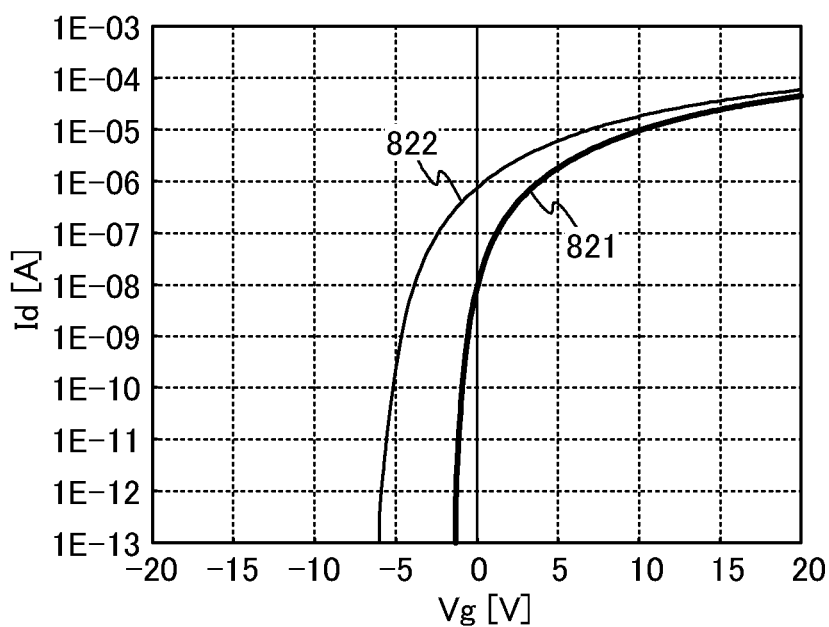

FIGS. 25A and 25B show the Vg-Id characteristics of the thin film transistor before and after the BT test. In both of FIGS. 25A and 25B, the horizontal axis indicates a gate voltage (Vg) and the vertical axis indicates a drain current (Id) in a logarithm scale.

FIG. 25A shows the Vg-Id characteristics of the thin film transistor before and after the +BT test. A curve 811 of initial characteristics represents the Vg-Id characteristics of the thin film transistor before the +BT test and a curve 812 represents the Vg-Id characteristics of the thin film transistor after the +BT test.

FIG. 25B shows the Vg-Id characteristics of the thin film transistor before and after the +BT test. A curve 821 of initial characteristics represents the Vg-Id characteristics of the thin film transistor before the +BT test and a curve 822 represents the Vg-Id characteristics of the thin film transistor after the +BT test.

Note that in these measurements of the Vg-Id characteristics of the thin film transistors of Example 1, the Id became less than or equal to the detection limit of the measurement device in an off region (a region where Vg is from approximately 0V to a negative value for most n-channel transistors). Therefore, FIGS. 25A and 25B do not show a part in which the Id is less than or equal to the detection limit of the measurement device.

In FIG. 25A, the threshold voltage of the curve 812 is shifted in the positive direction in comparison with that of the curve 811 of the initial characteristics, and in FIG. 25B, the curve 822 is shifted in the negative direction in comparison with that of the curve 821 of the initial characteristics. Accordingly, since the amount of change of the threshold voltage is as small as several volts in both of the BT tests, the thin film transistor of Example 1 was confirmed to be a thin film transistor with high reliability in the BT tests.

Example 2

In Example 2, calculation results of the steps from introduction of the gas containing an oxygen element (Step 8005 or Step 8105) to formation of the oxide insulating film (Step 8008 or Step 8108) in Embodiment 1 using models are shown.

First, results obtained by calculating an example in which oxygen is used as the gas containing an oxygen element are shown. An interaction between an oxide semiconductor layer and an oxygen molecule ($O_2$) was calculated using a first-principle MD (molecular dynamics) method. As software for the calculation, CASTEP produced by Accelrys Software Inc. was used, and the calculation conditions were as follows: an NVT ensemble was used; the time was 0.5 picoseconds; and the temperature was 350° C. A density functional theory with use of a plan wave basis pseudopotential method was employed. As a functional, GGAPBE was used.

Here, as a calculation model for an IGZO surface, an amorphous structure formed of 12 In atoms, 12 Ga atoms, 12 Zn atoms, and 46 O atoms was employed. A primitive lattice for the calculation was a rectangular solid of 1.02 nm×1.02 nm×2.06 nm Periodic boundary conditions were used as a boundary. A model to which oxygen molecule ($O_2$) or dinitrogen monoxide ($N_2O$) molecule was added was used for the above surface model below.

Figure 10A:
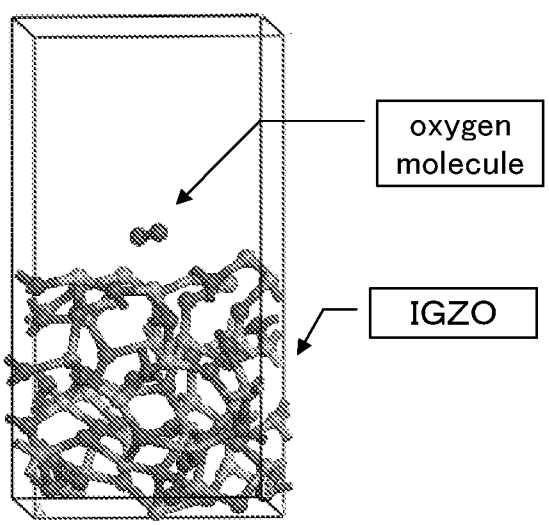
FIGS. 10A and 10B are views illustrating calculation results of an interaction between oxygen molecules ($O_2$) and a surface of an oxide semiconductor layer.
Figure 10B:
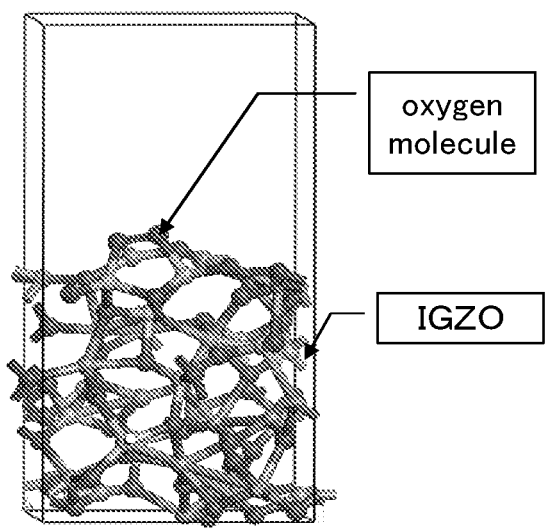

FIG. 10A shows an initial state of the oxygen molecule ($O_2$) arranged over and near a surface of the oxide semiconductor layer, and FIG. 10B shows the positions thereof after 0.5 picoseconds. In FIG. 10B, the oxygen molecule ($O_2$) was adsorbed to metals on the surface of the oxide semiconductor layer. A covalent bond of the oxygen molecule ($O_2$) was not lost within 0.5 picoseconds.

However, oxygen atoms are thermodynamically more stable in a state where the oxygen-oxygen bond is cleaved and the resulting oxygen atoms are adjacent to a metal atom than in a state where oxygen atoms are bonded to each other. In addition, a structure model prepared using a density measurement value of the oxide semiconductor layer shows that a space inside the oxide semiconductor layer is too narrow to diffuse oxygen molecules ($O_2$) while the covalent bond is kept. Therefore, oxygen atoms are diffused inside the oxide semiconductor layer in the state of thermodynamical equilibrium.

Next, results obtained by calculating an example in which nitride oxide is used as the gas containing an oxygen element are shown. A nitrous oxide (dinitrogen monoxide ($N_2O$)) molecule is arranged near a surface of the oxide semiconductor layer, and an interaction between an oxide semiconductor layer and a nitrous oxide (dinitrogen monoxide ($N_2O$)) molecule was calculated using a first-principle MD method. The calculation conditions were as follows: an NVT ensemble was used; the time was 0.5 picoseconds; and the temperature was 350° C.

Figure 11A:
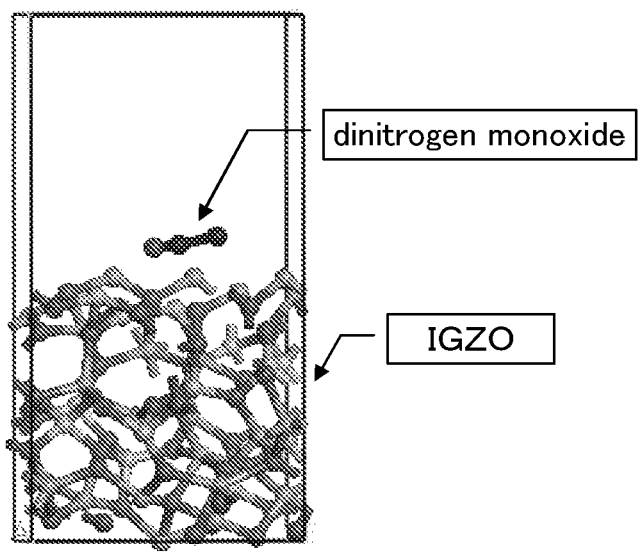
FIGS. 11A and 11B are views illustrating calculation results of interactions between dinitrogen monoxide molecules and a surface of an oxide semiconductor layer.
Figure 11B:
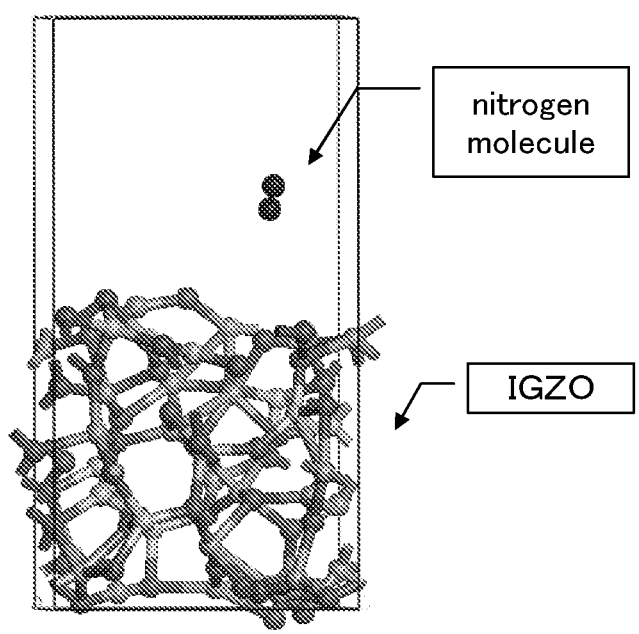

FIG. 11A shows an initial state of the N$_2$O molecule arranged over and near a surface of the oxide semiconductor layer, and FIG. 11B shows the positions thereof after 0.5 picoseconds. In FIG. 11B, the N$_2$O molecule was decomposed and a nitrogen molecule was observed near the surface of the oxide semiconductor layer. In addition, an oxygen atom originating from the N$_2$O molecule was diffused into the oxide semiconductor layer.

Figure 12A:
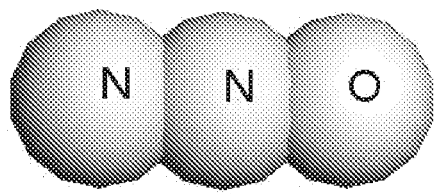
FIGS. 12A and 12B are views each illustrating a dinitrogen monoxide molecule structure.
Figure 12B:

A structure of the N$_2$O molecule is shown in FIGS. 12A and 12B. In the N$_2$O molecule, the nitrogen atoms and oxygen atom are arranged linearly as shown in FIG. 12A. The nitrogen atoms and the oxygen atom which are arranged linearly are bonded to each other in a resonance state as shown in FIG. 12B.

Next, an oxygen diffusion phenomenon on heat treatment in the oxide semiconductor layer including a region having high oxygen density and a region having low oxygen density was calculated. The results are described with reference to FIG. 13 and FIG. 14. Here, as software for the calculation, Materials Explorer 5.0 manufactured by Fujitsu Limited was used.

Figure 13:
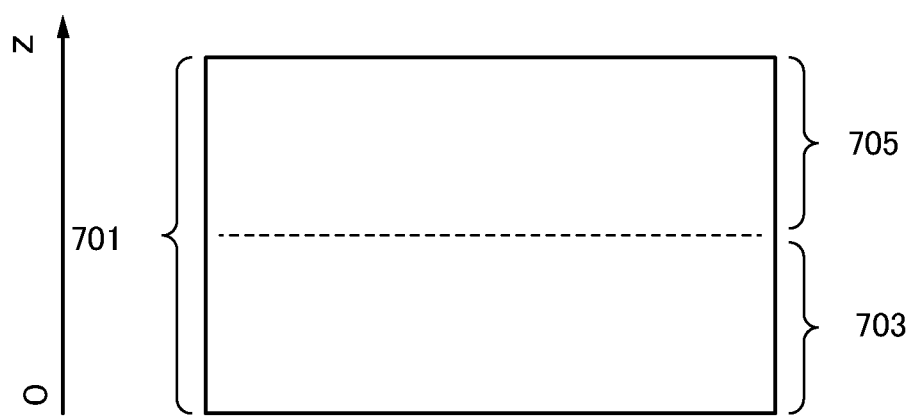
FIG. 13 is a view illustrating a structure of an oxide semiconductor layer used for a calculation.

FIG. 13 shows a model of an oxide semiconductor layer which was used for the calculation. An oxide semiconductor layer 701 has a stacked-layer structure of a layer 703 having low oxygen density and a layer 705 having high oxygen density.

Here, as the layer 703 having low oxygen density, an amorphous structure formed of 15 In atoms, 15 Ga atoms, 15 Zn atoms, and 54 O atoms was employed.

As the layer 705 having high oxygen density, an amorphous structure formed of 15 In atoms, 15 Ga atoms, 15 Zn atoms, and 66 O atoms was employed.

The density of the oxide semiconductor layer 701 was set to 5.9 g/cm$^3$.

Next, a classical MD (molecular dynamics) calculation was performed on the oxide semiconductor layer 701 using an NVT ensemble at 250° C. The time step width and the total calculation time were set to 0.2 fs and 200 ps, respectively. A Born-Mayer-Huggins potential was applied to a metal-oxygen bond and an oxygen-oxygen bond. The atoms of an upper end and a lower end of the oxide semiconductor layer 701 was fixed.

Figure 14:
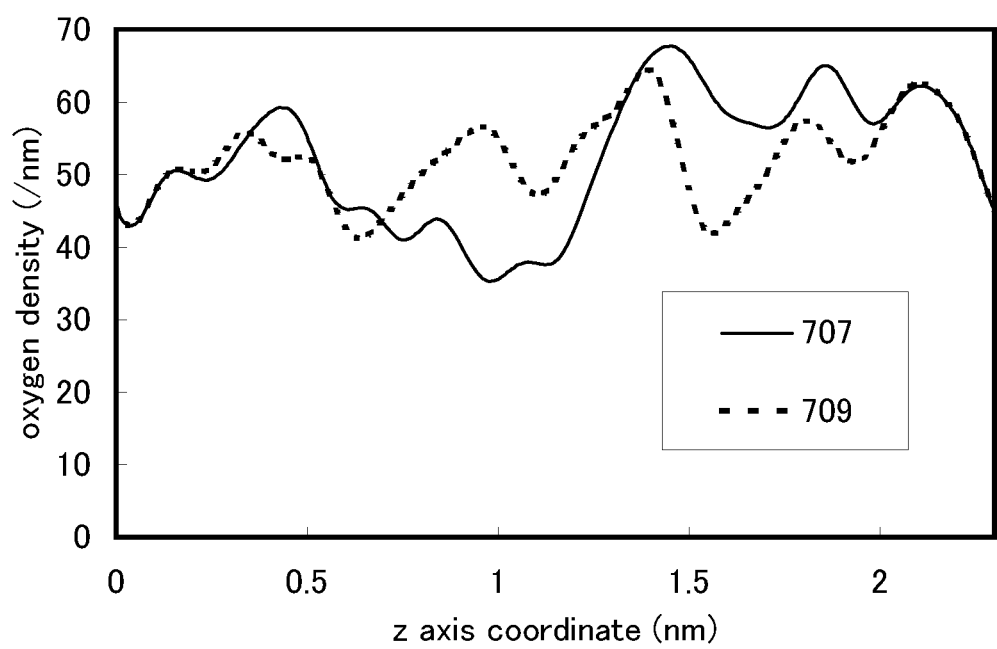
FIG. 14 is a graph showing calculation results of oxygen density of an oxide semiconductor layer.

The calculation results are shown in FIG. 14. The layer 703 having low oxygen density is represented by a range from 0 nm to 1.15 nm in a z axis coordinate and the layer 705 having high oxygen density is represented by a range from 1.15 nm to 2.3 nm in a z axis coordinate. Density distribution of oxygen before the MD calculation is represented by a solid line 707, and density distribution of oxygen after the MD calculation is represented by a dashed line 709.

In the solid line 707, the density of oxygen of the layer 705 having high oxygen density was higher than that of an interface between the layer 703 having low oxygen density and the layer 705 having high oxygen density. On the other hand, as demonstrated by the dashed line 709, the layer 703 having low oxygen density and the layer 705 having high oxygen density have almost the same oxygen density.

Therefore, in the case where density distribution is uneven as in a stacked-layer state of the layer 703 having low oxygen density and the layer 705 having high oxygen density, it is found that by heat treatment, the oxygen density becomes homogeneous.

In other words, as shown in Embodiment 1, since by formation of an oxide insulating film over an oxide semiconductor layer, the oxygen density at the interface between the oxide semiconductor layer and the oxide insulating layer is increased, the oxygen is diffused into the oxide semiconductor layer, and the resistance of the oxide semiconductor layer is increased. Thus, the reliability of the thin film transistor can be improved.

Figure 15A:
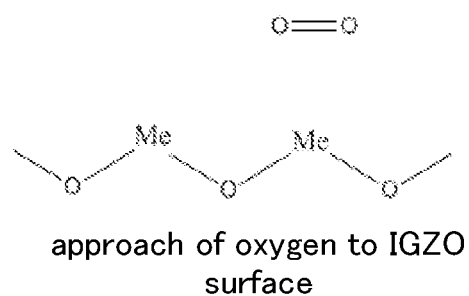
FIGS. 15A to 15C are views illustrating an interaction between oxygen and a surface of an oxide semiconductor film.
Figure 15B:
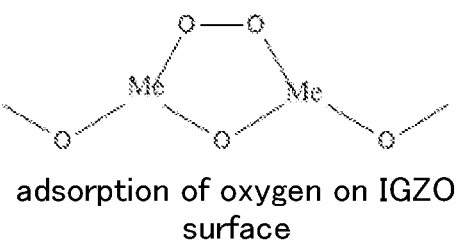
Figure 15C:
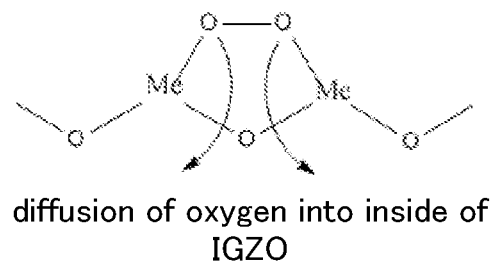

As shown in Example 2, after oxygen is adsorbed to the surface of the oxide semiconductor layer, the oxygen is ionically bonded to a metal ion (Me) contained in the oxide semiconductor layer and diffuses inside the oxide semiconductor layer in a state of an oxygen atom (see FIGS. 15A to 15C).

This application is based on Japanese Patent Application Serial No. 2009-159065 filed with Japan Patent Office on Jul. 3, 2009, the entire contents of which are hereby incorporated by reference.

EXPLANATION OF REFERENCE

100: substrate; 101: gate electrode layer; 102: gate insulating layer; 103: oxide semiconductor layer; 105a: source electrode layer; 105b: drain electrode layer; 107: protective insulating layer; 108: capacitor wiring; 110: pixel electrode layer; 121: first terminal; 122: second terminal; 125: contact hole; 126: contact hole; 127: contact hole; 128: transparent conductive film; 129: transparent conductive film; 132: conductive film; 133: oxide semiconductor layer; 135: oxide semiconductor layer; 150: second terminal; 151: first terminal; 152: gate insulating layer; 153: connection electrode layer; 154: protective insulating layer; 155: transparent conductive film; 156: electrode layer; 170: thin film transistor; 400: substrate; 401: gate electrode layer; 402: gate insulating layer; 403: oxide semiconductor layer; 405a: source electrode layer; 407: oxide insulating layer; 430: oxide semiconductor layer; 431: oxide semiconductor layer; 432: oxide semiconductor layer; 470: thin film transistor; 580: substrate; 581: thin film transistor; 583: insulating film; 585: insulating layer; 587: first electrode layer; 588: second electrode layer; 589: spherical particle; 590a: black region; 590b: white region; 595: filler; 596: substrate; 701: oxide semiconductor layer; 703: layer; 705: layer; 2600: TFT substrate; 2601: counter substrate; 2602: sealant; 2603: pixel portion; 2604: display element; 2605: coloring layer; 2606: polarizing plate; 2607: polarizing plate; 2608: wiring circuit portion; 2609: flexible wiring board; 2610: cold cathode tube; 2611: reflective plate; 2612: circuit board; 2613: diffusion plate; 2700: e-book reader; 2701: housing; 2703: housing; 2705: display portion; 2707: display portion; 2711: hinge; 2721: power switch; 2723: operation key; 2725: speaker; 4001: first substrate; 4002: pixel portion; 4003: signal line driver circuit; 4004: scan line driver circuit; 4005: sealant; 4006: second substrate; 4008: liquid crystal layer; 4010: thin film transistor; 4011: thin film transistor; 4013: liquid crystal element; 4015: connection terminal electrode; 4016: terminal electrode; 4018: FPC; 4019: anisotropic conductive film; 4020: protective insulating layer; 4021: protective insulating layer; 4030: pixel electrode layer; 4031: counter electrode layer; 4032: insulating layer; 4035: spacer; 4501: first substrate; 4502: pixel portion; 4503a: signal line driver circuit; 4504a: scan line driver circuit; 4505: sealant; 4506: second substrate; 4507: filler; 4509: thin film transistor; 4510: thin film transistor; 4511: light-emitting element; 4512: electroluminescent layer; 4513: second electrode layer; 4515: connection terminal electrode; 4516: terminal electrode; 4517: first electrode layer; 4518a: FPC; 4519: anisotropic conductive film; 4520: partition wall; 5300: substrate; 5301: pixel portion; 5302: first scan line driver circuit; 5303: second scan line driver circuit;

5304: signal line driver circuit; 5305: timing control circuit; 5601: shift register; 5602: switching circuit; 5603: thin film transistor; 5604: wiring; 5605: wiring; 6400: pixel; 6401: switching transistor; 6402: transistor for driving a light-emitting element; 6403: capacitor; 6404: light-emitting element; 6405: signal line; 6406: scan line: 6407: power supply line; 6408: common electrode; 7001: TFT; 7002: light-emitting element; 7003: cathode; 7004: light-emitting layer; 7005: anode; 7009: partition; 7011: transistor for driving a light-emitting element; 7012: light-emitting element; 7013: cathode; 7014: light-emitting layer; 7015: anode; 7016: light-blocking film; 7017: conductive film; 7019: partition; 7021: transistor for driving a light-emitting element; 7022: light-emitting element; 7023: cathode; 7024: light-emitting layer; 7025: anode; 7027: conductive film; 7029: partition; 9201: display portion; 9202: displayed button; 9203: operating switch; 9204: band portion; 9205: adjusting portion; 9206: camera portion; 9207: speaker; 9208: microphone; 9301: top housing; 9302: bottom housing; 9303: display portion; 9304: keyboard; 9305: external connection port; 9306: pointing device; 9307: display portion; 9600: television set; 9601: housing; 9603: display portion; 9605: stand; 9607: display portion; 9609: operation key; 9610: remote controller; 9700: digital photo frame; 9701: housing; 9703: display portion; 9881: housing; 9882: display portion; 9883: display portion; 9884: speaker portion; 9885: input means; 9886: recording medium insertion portion; 9887: connection terminal; 9888: sensor; 9889: microphone; 9890: LED lamp; 9891: housing; 9893: connection portion; 9900: slot machine; 9901: housing; and 9903: display portion.

The invention claimed is:

1. A method for manufacturing a semiconductor device, the method comprising the steps of:
    forming a gate electrode layer over a substrate having an insulating surface;
    forming a gate insulating layer over the gate electrode layer;
    forming an oxide semiconductor layer over the gate insulating layer;
    forming a metal film over and in contact with the oxide semiconductor layer;
    etching the metal film to form an exposed region in the oxide semiconductor layer and to form a source electrode layer and a drain electrode layer over and in contact with the oxide semiconductor layer;
    performing plasma treatment on the exposed region in the presence of a gas containing an oxygen element; and
    forming an oxide insulating film over and in contact with the oxide semiconductor layer, the source electrode layer, and the drain electrode layer,
    wherein the etching is performed so that the exposed region of the oxide semiconductor layer has a smaller thickness than a region of the oxide semiconductor layer which is covered with the source electrode layer or the drain electrode layer.

2. The method according to claim 1,
    wherein the oxide semiconductor layer comprises indium, zinc, oxygen, and a metal which is selected from Ga, Fe, Ni, Mn, and Co.

3. The method according to claim 1,
    wherein the oxide semiconductor layer has a composition expressed by $InMO_3(ZnO)_m$,
    wherein M is a metal selected from Ga, Fe, Ni, Mn, and Co, and
    wherein m is larger than 0.

4. The method according to claim 1, wherein the gas is selected from an oxygen gas, a nitrogen oxide gas, and a nitrogen dioxide gas.

5. The method according to claim 1, further comprising a heat treatment step,
    wherein the heat treatment step is performed from the plasma treatment until the formation of the oxide insulating film.

6. The method according to claim 1,
    wherein the oxide insulating film comprises silicon.

7. The method according to claim 1,
    wherein a side surface of the exposed region and at least one of side surfaces of the source electrode layer and the drain electrode layer are coplanar.

8. The method according to claim 1,
    wherein the etching is performed so that the whole of the oxide semiconductor layer covers part of the gate electrode layer.

9. A method for manufacturing a semiconductor device, the method comprising the steps of:
    forming a gate electrode layer over a substrate having an insulating surface;
    forming a gate insulating layer over the gate electrode layer;
    forming an oxide semiconductor layer over the gate insulating layer;
    forming a metal film over and in contact with the oxide semiconductor layer;
    etching the metal film to form an exposed region in the oxide semiconductor layer and to form a source electrode layer and a drain electrode layer over and in contact with the oxide semiconductor layer;
    introducing the substrate into a chamber;
    introducing a gas containing an oxygen element into the chamber with the substrate left in the chamber;
    generating plasma in the presence of the gas in the chamber with the substrate left in the chamber; and
    forming an oxide insulating film over and in contact with the oxide semiconductor layer, the source electrode layer, and the drain electrode layer in the chamber,
    wherein the etching is performed so that the exposed region of the oxide semiconductor layer has a smaller thickness than a region of the oxide semiconductor layer which is covered with the source electrode layer or the drain electrode layer.

10. The method according to claim 9,
    wherein the oxide semiconductor layer comprises indium, zinc, oxygen, and a metal which is selected from Ga, Fe, Ni, Mn, and Co.

11. The method according to claim 9,
    wherein the oxide semiconductor layer has a composition expressed by $InMO_3(ZnO)_m$,
    wherein M is a metal selected from Ga, Fe, Ni, Mn, and Co, and
    wherein m is larger than 0.

12. The method according to claim 9, wherein the gas is selected from an oxygen gas, a nitrogen oxide gas, and a nitrogen dioxide gas.

13. The method according to claim 9, further comprising a heat treatment step,
    wherein the heat treatment step is performed after the substrate is introduced to the chamber and until the formation of the oxide insulating film is completed.

14. The method according to claim 9,
    wherein the oxide insulating film comprises silicon.

15. The method according to claim 9,
wherein a side surface of the exposed region and at least one of side surfaces of the source electrode layer and the drain electrode layer are coplanar.

16. The method according to claim 9,
wherein the etching is performed so that the whole of the oxide semiconductor layer covers part of the gate electrode layer.

17. A method for manufacturing a semiconductor device, the method comprising the steps of:
forming a gate electrode layer over a substrate having an insulating surface;
forming a gate insulating layer over the gate electrode layer;
forming an oxide semiconductor layer over the gate insulating layer;
forming a metal film over and in contact with the oxide semiconductor layer;
etching the metal film to form an exposed region in the oxide semiconductor layer and to form a source electrode layer and a drain electrode layer over and in contact with the oxide semiconductor layer;
introducing the substrate into a chamber;
evacuating the chamber with the substrate left in the chamber;
introducing a nitrogen gas to the chamber with the substrate left in the chamber;
heating the substrate in the chamber with the substrate left in the chamber;
introducing a gas containing an oxygen element into the chamber with the substrate left in the chamber;
introducing plasma into the chamber in the presence of the gas with the substrate left in the chamber; and
forming an oxide insulating film over and in contact with the oxide semiconductor layer, the source electrode layer, and the drain electrode layer in the chamber,
wherein the etching is performed so that the exposed region of the oxide semiconductor layer has a smaller thickness than a region of the oxide semiconductor layer which is covered with the source electrode layer or the drain electrode layer.

18. The method according to claim 17,
wherein the oxide semiconductor layer comprises indium, zinc, oxygen, and a metal which is selected from Ga, Fe, Ni, Mn, and Co.

19. The method according to claim 17,
wherein the oxide semiconductor layer has a composition expressed by $InMO_3(ZnO)_m$,
wherein M is a metal selected from Ga, Fe, Ni, Mn, and Co, and
wherein m is larger than 0.

20. The method according to claim 17,
wherein the gas is selected from an oxygen gas, a nitrogen oxide gas, and a nitrogen dioxide gas.

21. The method according to claim 17,
wherein the heating step of the substrate is continued until the formation of the oxide insulating film is completed.

22. The method according to claim 17,
wherein the oxide insulating film comprises silicon.

23. The method according to claim 17,
wherein the introduction of plasma is performed using a remote plasma apparatus.

24. The method according to claim 17,
wherein a side surface of the exposed region and at least one of side surfaces of the source electrode layer and the drain electrode layer are coplanar.

25. The method according to claim 17,
wherein the etching is performed so that the whole of the oxide semiconductor layer covers part of the gate electrode layer.

26. A method for manufacturing a semiconductor device, the method comprising the steps of:
forming a gate electrode layer over a substrate having an insulating surface;
forming a gate insulating layer over the gate electrode layer;
forming an oxide semiconductor layer over the gate insulating layer;
forming a source electrode layer and a drain electrode layer over the oxide semiconductor layer; and
performing plasma treatment on the oxide semiconductor layer in the presence of a gas containing an oxygen element,
wherein a thickness of the oxide semiconductor layer in a region between the source electrode layer and the drain electrode layer is smaller than a thickness of the oxide semiconductor layer in a region covered with the source electrode layer or the drain electrode layer.

27. The method according to claim 26,
wherein the source electrode layer and the drain electrode layer are formed so as to be in contact with the oxide semiconductor layer.

28. The method according to claim 26, further comprising a step of forming an oxide insulating film over and in contact with the oxide semiconductor layer, the source electrode layer, and the drain electrode layer.

29. The method according to claim 28, further comprising a heat treatment step,
wherein the heat treatment step is performed from the plasma treatment until the formation of the oxide insulating film.

30. The method according to claim 28,
wherein the oxide insulating film comprises silicon.

31. The method according to claim 26,
wherein the oxide semiconductor layer comprises indium, zinc, oxygen, and a metal which is selected from Ga, Fe, Ni, Mn, and Co.

32. The method according to claim 26, wherein the oxide semiconductor layer has a composition expressed by $InMO_3(ZnO)_m$,
wherein M is a metal selected from Ga, Fe, Ni, Mn, and Co, and
wherein m is larger than 0.

33. The method according to claim 26,
wherein the gas is selected from an oxygen gas, a nitrogen oxide gas, and a nitrogen dioxide gas.

34. The method according to claim 26,
wherein a side surface of the region between the source electrode layer and the drain electrode layer and at least one of side surfaces of the source electrode layer and the drain electrode layer are coplanar.

35. The method according to claim 26,
wherein the oxide semiconductor layer is formed so that the whole of the oxide semiconductor layer covers part of the gate electrode layer.

* * * * *